(12) United States Patent
Takeuchi et al.

(10) Patent No.: US 9,016,900 B2
(45) Date of Patent: Apr. 28, 2015

(54) LIGHT BULB SHAPED LAMP AND LIGHTING APPARATUS

(75) Inventors: Nobuyoshi Takeuchi, Osaka (JP); Tsugihiro Matsuda, Kyoto (JP); Hideo Nagai, Osaka (JP); Masahiro Miki, Osaka (JP); Takaari Uemoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/882,204

(22) PCT Filed: Nov. 4, 2011

(86) PCT No.: PCT/JP2011/006162
§ 371 (c)(1),
(2), (4) Date: Apr. 29, 2013

(87) PCT Pub. No.: WO2012/060106
PCT Pub. Date: May 10, 2012

(65) Prior Publication Data
US 2013/0215625 A1    Aug. 22, 2013

(30) Foreign Application Priority Data

Nov. 4, 2010   (JP) .................................. 2010-247916
Nov. 4, 2010   (JP) .................................. 2010-247918
Nov. 4, 2010   (JP) .................................. 2010-247941
Apr. 6, 2011   (JP) .................................. 2011-084944

(51) Int. Cl.
*F21V 29/00*    (2006.01)
*F21V 23/00*    (2006.01)
(Continued)

(52) U.S. Cl.
CPC ............... *F21V 23/002* (2013.01); *F21K 9/135* (2013.01); *F21V 23/001* (2013.01); *F21Y 2101/02* (2013.01); *F21V 3/0418* (2013.01);
(Continued)

(58) Field of Classification Search
CPC ...... F21Y 2102/02; F21K 9/00; F21V 29/004
USPC .................................... 362/249.02, 294, 373
See application file for complete search history.

(56) References Cited

U.S. PATENT DOCUMENTS 6,220,722 B1    4/2001    Begemann
6,499,860 B2    12/2002   Begemann
(Continued)

FOREIGN PATENT DOCUMENTS

CN    201007995    1/2008
CN    101581408    11/2009
(Continued)

OTHER PUBLICATIONS

Engineer's Handbook, Reference Table of Thermal Conductivity, copyright 2004-2006.*
(Continued)

*Primary Examiner* — Peggy Neils
(74) *Attorney, Agent, or Firm* — Greenblum & Bernstein P.L.C.

(57) ABSTRACT

A light bulb shaped lamp according to the present invention includes: a hollow globe; an LED module including a base platform and an LED chip mounted on the base platform, the LED module being provided in the globe; a lead wire for supplying power to the LED module; and a stem extending toward the interior of the globe, in which the base platform is directly fixed to the stem.

20 Claims, 50 Drawing Sheets

(51) Int. Cl.
*F21K 99/00* (2010.01)
*F21V 19/00* (2006.01)
*F21Y 101/02* (2006.01)
*F21V 3/04* (2006.01)
*F21Y 103/00* (2006.01)
*F21Y 105/00* (2006.01)

(52) U.S. Cl.
CPC ........ *F21V 19/003* (2013.01); *F21Y 2103/003* (2013.01); *F21Y 2105/001* (2013.01); *F21V 29/85* (2015.01)

(56) References Cited

U.S. PATENT DOCUMENTS

| | | | |
|---|---|---|---|
| 6,793,374 | B2 | 9/2004 | Begemann |
| 7,226,189 | B2 | 6/2007 | Lee et al. |
| 7,661,866 | B2 * | 2/2010 | Kaneko et al. ............... 362/612 |
| 7,758,223 | B2 | 7/2010 | Osawa et al. |
| 7,766,512 | B2 * | 8/2010 | Chou et al. .................. 362/294 |
| 7,862,214 | B2 * | 1/2011 | Trott et al. .................. 362/365 |
| 7,883,242 | B2 * | 2/2011 | Ng et al. .................. 362/249.06 |
| 7,922,359 | B2 * | 4/2011 | Chiang ........................ 362/294 |
| 7,926,986 | B2 * | 4/2011 | Shen ............................ 362/373 |
| 8,292,462 | B2 | 10/2012 | Huang et al. |
| 8,317,358 | B2 * | 11/2012 | Chou ............................ 362/218 |
| 8,366,295 | B2 | 2/2013 | Tanda et al. |
| 8,382,325 | B2 * | 2/2013 | Hisayasu ................. 362/249.02 |
| 8,382,331 | B2 * | 2/2013 | Cheng ......................... 362/294 |
| 8,408,747 | B2 | 4/2013 | Wang et al. |
| 8,562,161 | B2 | 10/2013 | Tong et al. |
| 8,579,476 | B2 * | 11/2013 | Mahalingam et al. ........ 362/373 |
| 8,596,821 | B2 | 12/2013 | Brandes et al. |
| 2001/0014019 | A1 | 8/2001 | Begemann |
| 2003/0021113 | A1 | 1/2003 | Begemann |
| 2006/0227558 | A1 | 10/2006 | Osawa et al. |
| 2010/0207502 | A1 * | 8/2010 | Cao et al. ........................ 313/46 |
| 2010/0213881 | A1 | 8/2010 | Imai |
| 2010/0237761 | A1 | 9/2010 | Osawa et al. |
| 2010/0237779 | A1 | 9/2010 | Osawa et al. |
| 2010/0244650 | A1 | 9/2010 | Osawa et al. |
| 2010/0244694 | A1 | 9/2010 | Osawa et al. |
| 2010/0253200 | A1 | 10/2010 | Osawa et al. |
| 2010/0301728 | A1 * | 12/2010 | Helbing et al. ................. 313/46 |
| 2011/0063843 | A1 * | 3/2011 | Cook ...................... 362/249.02 |
| 2011/0156569 | A1 | 6/2011 | Osawa et al. |
| 2011/0248631 | A1 | 10/2011 | Chuang |
| 2011/0309386 | A1 | 12/2011 | Osawa et al. |
| 2011/0310606 | A1 | 12/2011 | Osawa et al. |
| 2012/0056542 | A1 | 3/2012 | Hu |
| 2012/0162965 | A1 | 6/2012 | Takeuchi et al. |
| 2012/0217862 | A1 | 8/2012 | Matsuda et al. |
| 2012/0256538 | A1 | 10/2012 | Takeuchi et al. |
| 2012/0294005 | A1 | 11/2012 | Osawa et al. |
| 2012/0294006 | A1 | 11/2012 | Osawa et al. |
| 2012/0300458 | A1 | 11/2012 | Osawa et al. |
| 2012/0300477 | A1 | 11/2012 | Osawa et al. |

FOREIGN PATENT DOCUMENTS

| | | |
|---|---|---|
| CN | 201555059 | 8/2010 |
| JP | 3075689 | 2/2001 |
| JP | 2002-525814 | 8/2002 |
| JP | 2006-313717 | 11/2006 |
| JP | 3154158 | 10/2009 |
| JP | 2010-055830 | 3/2010 |
| JP | 2010-199145 | 9/2010 |
| JP | 2012-227162 | 11/2012 |
| WO | 00/17569 | 3/2000 |
| WO | 2010/096498 | 8/2010 |

OTHER PUBLICATIONS

Japanese Notice of Allowance, dated May 28, 2013.
U.S. Appl. No. 13/872,321.
U.S. Appl. No. 13/872,327.
U.S.A.(U.S. Appl. No. 13/872,327) Office action, mail date is Jan. 7, 2014.
U.S.A.(U.S. Appl. No. 13/872,321) Office action, mail date is Jan. 9, 2014.
Chinese Office Action dated Aug. 13, 2013, and an English language translation thereof.
U.S.A.(U.S. Appl. No. 13/872,327) Office action, mail date is Jun. 25, 2014.

* cited by examiner

FIG. 22
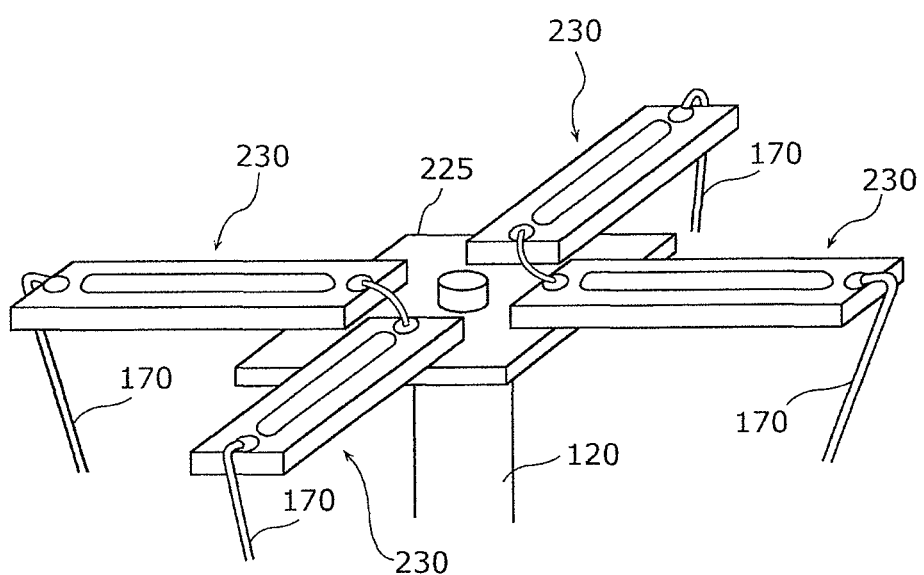
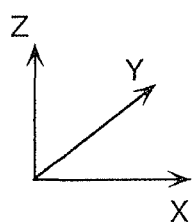

LIGHT BULB SHAPED LAMP AND LIGHTING APPARATUS

TECHNICAL FIELD

The present invention relates to a light bulb shaped lamp having a light-emitting device such as a light-emitting diode (LED) and a lighting apparatus which includes the light-emitting device.

BACKGROUND ART

Compared to conventional illumination light source, LEDs are small, have high efficiency and long product life. LEDs are considered as a new illumination light source for conventional lamps such as fluorescent light and incandescent light bulb, and research and development have been done on a lamp using LED (LED lamp). Recent market needs for saving energy and resource boost the demand for light bulb shaped lamps using LEDs (hereafter simply referred to as "light bulb shaped LED lamp" or "LED light bulb") replacing conventional incandescent light bulbs using filament coils, and lighting apparatuses including the LED light bulbs.

Known properties of LEDs include reduced light output as temperature increases, which lead to shorter product life. In response to this problem, a metal case is provided between a semispherical globe and a base in a conventional LED light bulb so as to suppress the increase in the temperature of LED (for example, see Patent Literature 1).

The conventional light bulb shaped LED lamp disclosed in Patent Literature 1 shall be described as follows with reference to FIG. 52. FIG. 52 is a cross-sectional view of a light bulb shaped LED lamp according to the conventional art.

As illustrated in FIG. 52, the conventional LED lamp 1000 includes a translucent cover 1110 which is a semispherical globe, a base 1190 for receiving power, and an outer case 1200 which is a metal case.

The outer case 1200 includes a peripheral portion 1210 exposed to outside, a circular-plate light-source attachment 1220 integrally formed with the circumferential part 1210, and a recess 1230 formed inside of the circumferential portion 1210. On the upper surface of the light-source attachment 1220, an LED module 1130 which includes LEDs is mounted on a base platform. Note that, an insulator 1240 formed along the shape of the inner surface of the recess 1230 is provided on the inner surface of the recess 1230, and a lighting circuit 1180 for turning on the LEDs are housed in the insulator 1240.

With the conventional light bulb shaped LED lamp 1000 having the configuration described above, the outer case 1200 (metal case) in which the light-source attachment 1220 and the peripheral portion 1210 are integrally formed is used. The outer case 1200 functions as a heat sink for radiating heat generated at the LED to outside, and the heat generated at the LED is efficiently conducted from the light-source attachment 1220 to the peripheral portion 1210. With this, the increase in the temperature of the LED is suppressed, thereby preventing reduction of the light output from the LEDs.

CITATION LIST

Patent Literature

[Patent Literature 1] Japanese Unexamined Patent Application Publication No. 2006-313717

SUMMARY OF INVENTION

Technical Problem

However, in the conventional light bulb shaped LED lamp disclosed in Patent Literature 1, the LED module 1130 is provided on the light-source attachment 1220 in the outer case (metal case) 1200. Consequently, the light toward the base 1190 is blocked by the outer case 1200, and the light is distributed differently from incandescent light bulbs. In other words, with the conventional light bulb shaped LED lamp, it is difficult to achieve the light-distribution property equivalent to incandescent light bulbs.

Thus, changing the configuration of the light bulb shaped LED lamp to the same configuration as the incandescent light bulbs is one possible option. For example, a configuration of such an LED light bulb includes an LED module replacing a filament coil installed between the two lead wires of an incandescent light bulb, which is held by the lead wire or a glass stem. In this case, the light emitted by the LED module is not blocked by the metal case. Accordingly, the light distribution property approximated to that of incandescent light bulb can be achieved.

However, the LED module is heavier than the filament coil used in incandescent light bulbs. Accordingly, there is another problem that merely supporting the LED module with the two lead wires in the same manner as the filament coil would not likely to keep the LED module remaining at a constant position in the globe. In addition, there is another problem that the lead wires may be disconnected from the LED module due to stress exerted on a part connecting the lead wire and the LED module caused by vibration or others at the time of transportation.

Furthermore, in the light bulb shaped LED lamp having the structure described above, the LED module suspended in the globe is connected only to the lead wire. Consequently, there is a problem that the heat generated by the LED is not sufficiently dissipated.

Furthermore, in the light bulb shaped lamp having the configuration described above, it is difficult to position the components, and it is not easy to assemble the lamp as a result. For example, in order to fix the LED module at the top of the glass stem, it is difficult to position the LED module and the glass stem properly. Furthermore, the lead wire for supplying power is connected to the LED module. However, it is difficult to position the LED module and the lead wire properly. In particular, it is necessary to supply DC voltage to the LED module, and voltage must be applied to two power supply terminals of the LED module with the negative voltage and positive voltage distinguished. Stated differently, it is necessary to distinguish the two lead wires between a lead wire on the positive voltage side and a lead wire on the negative voltage side, and to connect the lead wires to the power supply terminals of the LED module associated with one another. This makes the work for connecting the lead wire to the LED module more complex. As described above, in an attempt to construct a light bulb shaped LED lamp having light distribution property approximated to an incandescent light bulb, there is a problem that the lamp cannot be easily assembled.

The present invention has been conceived in order to solve the problem, and it is the first object of the present invention to provide a light bulb shaped lamp capable of achieving light distribution property equivalent to conventional incandescent light bulbs and firmly fixing and holding a base platform on which a light-emitting device is mounted, and a lighting apparatus including the light bulb shaped lamp.

It is the second object of the present invention to provide a light bulb shaped lamp capable of achieving light distribution property equivalent to conventional incandescent light bulbs and suppressing possibility of a lead wire being disconnected from a light-emitting module and a lighting apparatus including the light bulb shaped lamp.

It is the third object of the present invention to provide a light bulb shaped lamp capable of having a structure as conventional incandescent light bulbs and efficiently dissipating heat generated at the light-emitting device.

It is the fourth object of the present invention to provide a light bulb shaped lamp that can be easily assembled and a lighting apparatus.

Solution to Problem

In order to achieve the first object, the light bulb shaped lamp according to an aspect of the present invention includes a light bulb shaped lamp including: a hollow globe; a light-emitting module including a base platform and a light-emitting device mounted on the base platform, the light-emitting module being provided in the globe; a lead wire for supplying power to the light-emitting module; and a stem extending toward the interior of the globe, in which the light-emitting module is directly fixed to the stem.

According to this configuration, the light-emitting module is directly fixed to the stem, and thus it is possible to fix and hold the light-emitting module firmly, compared to a case in which the base platform is supported only by the lead wires, for example. Furthermore, light emitted by the light-emitting device is not blocked by the base. Accordingly, it is possible to achieve the light distribution property equivalent to conventional incandescent light bulbs.

Furthermore, according to this configuration, it is possible to transfer the heat generated at the light-emitting device to the globe, the base, or others through the stem, and to suppress the increase in the temperature of the light-emitting device. Furthermore, the stem for fixing the base platform is a component commonly used in incandescent light bulbs. Accordingly, it is possible to reduce the difference from incandescent light bulbs in terms of appearance.

Furthermore, in order to achieve the first object, it is preferable that the base platform is directly fixed to the stem.

According to this configuration, it is possible to fix the base platform on which the light-emitting device is mounted directly to the stem, and thus the base platform is fixed and held firmly.

Furthermore, in order to achieve the first object, it is preferable that the base platform is fixed to the stem by an adhesive material.

According to this configuration, the base platform is fixed to the stem by the adhesive material, and thus the base platform can be fixed and held more firmly.

Furthermore, in order to achieve the first object, it is preferable that the adhesive material is transparent to visible light.

According to this configuration, the adhesive material is transparent to visible light, and thus it is possible to suppress the loss of light emitted by the light-emitting device by the adhesive material. Furthermore, it is possible to prevent a shadow cast by the adhesive material.

Furthermore, in order to achieve the first object, it is preferable that the adhesive material is made of silicone resin.

With this configuration, it is possible to use silicone resin as the adhesive material.

Furthermore, in order to achieve the first object, it is preferable that the base platform has a shape of a prism, the light-emitting device is mounted on at least one side of the base platform, and a side of the base platform is fixed to an end of the stem.

According to this configuration, it is possible to fix a side surface of the base in the prism shape to the end of the stem. Accordingly, it is possible to fix and hold the base platform more firmly than a case where the base platform is supported only by the lead wires. Furthermore, since the base platform is in the prism shape, it is possible to reproduce a filament coil of an incandescent light bulb by a light-emitting device and a base platform in a simulative manner.

Furthermore, in order to achieve the first object, it is preferable that the base platform has a shape of board, the light-emitting device is mounted on at least one surface of the base platform, and the other surface of the base platform is fixed to an end of the stem.

According to this configuration, it is possible to fix a side surface of the board-shaped base platform to the end of the stem. Accordingly, it is possible to fix and hold the base platform more firmly than a case where the base platform is supported only by the lead wires.

Furthermore, in order to achieve the first object, it is preferable that the base platform is translucent.

According to this configuration, the base platform is translucent. Accordingly, the light emitted by the light-emitting device passes through the inside of the base platform, and the light is emitted from a part where no light-emitting device is mounted. Accordingly, even when the light-emitting device is mounted only on one side of the base platform, light is emitted from the other side, which makes the light bulb shaped lamp possible to achieve the light distribution property equivalent to the incandescent light bulb.

Furthermore, in order to achieve the first object, it is preferable that the stem is transparent to visible light.

According to this configuration, the stem is transparent to visible light, and thus it is possible to suppress the loss of light emitted by the stem. Furthermore, it is possible to prevent the shadow cast by the stem. Furthermore, light emitted by the light-emitting device lights up the stem. Thus, the light bulb shaped lamp can achieve visually superior appearance.

Furthermore, in order to achieve the first object, it is preferable that the stem is joined with the globe so as to close an opening of the globe, and a part of the lead wire is sealed in the stem.

With this configuration, the opening of the globe is closed by the stem. Accordingly, it is possible to prevent moisture from entering the globe from outside, and suppress the degradation of the light-emitting device by moisture.

In order to achieve the second object, in the light bulb shaped lamp according to an aspect of the present invention, it is preferable that the light-emitting module includes a plurality of the base platforms and a fixing component for attaching the base platforms, and the fixing component is directly fixed to the stem.

With this configuration, the fixing component attached to the base platform may be directly fixed to the stem. Accordingly, it is possible to fix and hold the base platform to the stem through the fixing component.

Furthermore, in order to achieve the second object, it is preferable that a first through hole is formed in the fixing component, and an end portion of the stem is inserted into the first through hole.

With this configuration, the stem inserted into the first through hole defined by the fixing component can support the fixing component to which the base platforms are fixed in the globe. Accordingly, when the light bulb shaped lamp is shaken, for example, it is possible to suppress the stress exerted on the part connecting the lead wire and the light-emitting module, and to suppress the possibility that the lead wire is disconnected from the light-emitting module. Furthermore, light emitted by the light-emitting device is not blocked by the base. Accordingly, it is possible to achieve the light distribution property equivalent to conventional incandescent light bulbs.

Furthermore, in order to achieve the second object, it is preferable that a stepped part is formed at the end portion of the stem, and the fixing component is supported by the stepped part formed at the end portion of the stem.

With this configuration, the fixing component is supported by the stepped part formed at the end portion of the stem, and thus it is possible to regulate the movement of the fixing component toward the stem. Accordingly, it is possible to suppress the possibility that the lead wire is disconnected from the light-emitting module even more securely.

Furthermore, in order to achieve the second object, it is preferable that the end portion of the stem is fit into the first through hole.

According to this configuration, the end portion of the stem is fit into the first through hole, and thus it is possible to fix the fixing component to the stem. Accordingly, it is possible to suppress the possibility that the lead wire is disconnected from the light-emitting module even more securely.

Furthermore, in order to achieve the second object, it is preferable that the base platforms are fixed to the fixing component such that a barycenter of the fixing component and the base platforms coincides with a center position of the first through hole when viewed in a longer direction of the stem.

With this configuration, the barycenter of the fixing component and the base platforms coincides with the center of the first through hole, and thus it is possible to stably support the fixing component and the base platforms.

Furthermore, in order to achieve the second object, it is preferable that the fixing component is fixed to an end portion of the stem by an adhesive material.

With this configuration, the fixing component is fixed to the end portion of the stem by the adhesive material. Accordingly, it is possible to regulate the movement of the fixing component even more securely. Accordingly, it is possible to suppress the possibility that the lead wire is disconnected from the light-emitting module even more securely.

Furthermore, in order to achieve the second object, it is preferable that a third through hole is formed in the base platform, and the lead wire is inserted into the third through hole and supports the base platform.

With this configuration, the lead wire is inserted into the third through hole in the base platform. Accordingly, it is possible to disperse the stress exerted on the part connecting the lead wire and the light-emitting module due to vibration or others. Accordingly, it is possible to suppress the possibility that the lead wires are disconnected from the light-emitting module due to vibration or others.

Furthermore, in order to achieve the second object, it is preferable that a fourth through hole is formed in the base platform, a second through hole is formed in the fixing component so as to communicate with the fourth through hole, and the lead wire is inserted into the second through hole and the fourth through hole.

According to this configuration, the lead wires are inserted through the second through hole and the fourth through hole penetrating the fixing component and the base platform. Accordingly, it is possible to fix the fixing component and the base platform firmly.

Furthermore, in order to achieve the second object, it is preferable that a conductive rivet is provided at an end of the lead wire, and the base platform is fixed to the fixing component by the rivet inserted into the second through hole and the fourth through hole.

According to this configuration, the fixing component and the base platform are fixed by the rivet formed at the end of the lead wire, and thus the fixing component and the base platform are fixed even more firmly.

Furthermore, in order to achieve the second object, it is preferable that a line pattern is formed on the fixing component, and the light-emitting devices each mounted on one of the base platforms are electrically connected through the line pattern.

According to this configuration, the light-emitting devices in the base platforms by a line pattern formed on the fixing component, and thus the light-emitting devices are electrically connected easily in the globe.

Furthermore, in order to achieve the second object, it is preferable that the stem is joined with the globe so as to close an opening of the globe, and a part of the lead wire is sealed in the stem.

According to this configuration, the stem closes the opening of the globe, and thus it is possible to prevent the moisture from entering the globe from outside of the globe, and to suppress the degradation of the light-emitting device and at the part connecting the light-emitting module and the lead wire due to moisture. Accordingly, it is possible to suppress the possibility that the lead wires are disconnected from the light-emitting module due to vibration or others more securely.

Furthermore, in order to achieve the second object, it is preferable that the fixing component is transparent to visible light.

According to this configuration, the fixing component is transparent to visible light, and thus it is possible to suppress the loss of light emitted by the light-emitting device. Furthermore, it is possible to prevent a shadow cast by the fixing component.

Furthermore, in order to achieve the second object, it is preferable that the base platform is translucent.

With this configuration, the base platform is translucent. Accordingly, the light emitted by the light-emitting device pass through the interior of the base platform. To put it differently, the light is emitted from a part of the base platform where the light-emitting device is not mounted. Accordingly, even when the light-emitting device is mounted only on one side of the base platform, light is emitted from the other side, which makes the light bulb shaped lamp possible to achieve the light distribution property equivalent to the incandescent light bulb.

Furthermore, in order to achieve the second object, it is preferable that the stem is transparent to visible light.

According to this configuration, the stem is transparent to visible light, and thus it is possible to suppress the loss of light emitted by the light-emitting device caused by the stem. Furthermore, it is possible to prevent the shadow cast by the stem. Furthermore, light emitted by the light-emitting device lights up the stem 120. Thus, the light bulb shaped lamp can achieve visually superior appearance.

In order to achieve the third object, in the light bulb shaped lamp according to an aspect of the present invention, it is preferable that the stem is made of a material having a thermal conductivity higher than a thermal conductivity of the base platform.

With this configuration, the light-emitting module is arranged in the hollow globe, and thus it is possible to achieve the light distribution property equivalent to that of incandescent light bulb. Furthermore, the base platform of the light-emitting module is connected to the stem composed of the material having a thermal conductivity higher than the thermal conductivity of the base platform, and thus the heat generated at the light-emitting module can be conducted to the stem efficiently. With this, it is possible to sufficiently dissipate the heat at the light-emitting module.

Furthermore, in order to achieve the third object, it is preferable that a supporting component which is connected to an opening end of an opening of the globe and supports the stem is included, in which the supporting component is made of a material having a thermal conductivity higher than a thermal conductivity of the base platform.

According to this configuration, the stem is supported by the supporting component made of a material having a thermal conductivity higher than the thermal conductivity of the base platform, and thus the heat at the light-emitting module conducted to the stem is efficiently conducted to the supporting component. Furthermore, the supporting component is connected to the globe, and thus the heat conducted to the supporting component can be dissipated to the air from the surface of the globe. With this, the heat generated at the light-emitting module can be dissipated in the air efficiently.

Furthermore, in order to achieve the third object, it is preferable that the supporting component is made of a material having a thermal conductivity higher than or equal to the thermal conductivity of the stem.

According to this configuration, the heat at the light-emitting module conducted to the stem is efficiently conducted to the supporting component.

Furthermore, in order to achieve the third object, it is preferable that the stem and the supporting component are made of metal.

Furthermore, in order to achieve the third object, it is preferable that the stem and the supporting component are made of aluminum.

Furthermore, in order to achieve the third object, it is preferable that the globe is composed of glass transparent to visible light.

With this configuration, the globe is transparent to visible light. Accordingly, it is possible to suppress the loss of light emitted by the semiconductor light-emitting device. Furthermore, since the globe is made of glass, it is possible to achieve high resistance to heat.

Furthermore, in order to achieve the third object, it is preferable that the base platform and the stem are fixed by a screw.

With this configuration, the base platform and the stem are firmly supported and fixed. In addition, the heat dissipating property of the light-emitting module can be further improved.

In order to achieve the fourth object, in an aspect of the light bulb shaped lamp according to the present invention, it is preferable that the stem includes a first engaging part which suppresses rotational movement of the light-emitting module having an axis in the extending direction of the stem, and the base platform includes a second engaging part which engages with the first engaging part.

According to this configuration, the first engaging part and the second engaging part suppress the movement of the light-emitting module, and thus it is possibly to position the light-emitting module and the stem easily. Furthermore, the light-emitting module is arranged in the hollow globe, and thus it is possible to achieve the light distribution property equivalent to that of incandescent light bulb.

Furthermore, in order to achieve the fourth object, the first engaging part can be a projection formed at a top of the stem, and the second engaging part can be a through hole or a recess fit into the projection. In this case, the projection can have a shape of rectangle in top view.

Furthermore, in order to achieve the fourth object, it is preferable that the projection has a shape in top view that determines a posture of the light-emitting module to be a predetermined posture.

According to this configuration, the light-emitting module is set to be in one posture, and thus it is possible to determine the position for arranging the light-emitting module with respect to the stem uniquely in either of the two axial directions orthogonal to each other, that is, the vertical direction or the horizontal direction in top view of the light-emitting module.

Furthermore, in order to achieve the fourth object, it is preferable that the first engaging part is a plurality of projections formed at a top of the stem, and the second engaging part is (i) one through hole or recess that engages with the projections or (ii) a plurality of through holes or recesses each corresponding to one of the projections.

By providing a plurality of projections as described above, even if the projection is in a shape in top view that does not determine the position for arranging the light-emitting module in one axial direction, that is, in a circular shape or a polygonal shape, the position in the rotation direction of the light-emitting module can be uniquely determined.

Furthermore, in order to achieve the fourth object, it is preferable that the projections include a first projection and a second projection having different shapes in top view.

According to this configuration, even if the projection is in a shape that does not determine the direction of the position for arranging the light-emitting module in one axial direction such as circular shape or regular polygonal shape in top view, the light-emitting module can be set in one predetermined posture, and thus the position for arranging the light-emitting module with respect to the stem can be uniquely determined in either of the two axial directions orthogonal to each other, that is, the vertical direction and the horizontal direction.

Furthermore, in order to achieve the first to fourth objects, it is preferable that the globe is made of glass transparent to visible light.

With this configuration, the globe is transparent to visible light. Accordingly, it is possible to suppress the loss of light emitted by the light-emitting device. Furthermore, since the globe is made of glass, it is possible to achieve high resistance to heat.

Furthermore, in order to achieve the first to fourth objects, it is preferable that a base which receives power for causing the light-emitting device to emit light; and an insulating case which insulates at least the stem and the base, and houses a lighting circuit for causing the light-emitting device to emit light are included.

With this configuration, the insulating case insulates the stem and the base.

Furthermore, an aspect of the lighting apparatus according to the present invention includes the light bulb shaped lamp described above.

As described above, the present invention may be implemented as a lighting apparatus including the light bulb shaped lamp described above.

Advantageous Effects of Invention

According to the present invention, it is possible to fix the base platform on which the light-emitting device is mounted directly to the stem, and thus the base platform is fixed and held firmly. Furthermore, light emitted by the light-emitting device is not blocked by the base. Accordingly, it is possible to achieve the light distribution property equivalent to conventional incandescent light bulbs.

Furthermore, according to the present invention including the first through hole, the stem inserted into the first through hole defined by the fixing component supports the fixing component on which the light-emitting modules are fixed. Accordingly, when the light bulb shaped lamp is shaken, for example, it is possible to suppress the stress exerted on the part connecting the lead wire and the light-emitting module, and to suppress the possibility that the lead wire is disconnected from the light-emitting module. Furthermore, light emitted by the semiconductor light-emitting device is not blocked by the case. Accordingly, it is possible to achieve the light distribution property equivalent to conventional incandescent light bulbs.

Furthermore, according to the present invention having a stem with a larger thermal conductivity, it is possible to configure the light bulb shaped lamp equivalent to conventional incandescent light bulbs and to efficiently dissipate the heat generated at the light-emitting device.

Furthermore, according to the present invention including the first engaging part and the second engaging part, when joining the light-emitting module and the stem, the light-emitting module and the stem can be easily positioned to a desired position and state in consideration of the direction of installation and polarity. Accordingly, the light bulb shaped lamp can be easily assembled. Furthermore, the light-emitting module and the stem can be fixed firmly, and attached uniformly in the predetermined direction. Accordingly, it is possible to implement a light bulb shaped lamp capable of eliminating the variation in the positions of the components between products and improving the appearance and quality.

BRIEF DESCRIPTION OF DRAWINGS

FIG. 22 is a perspective view around an LED module according to the variation 4 of the embodiment 2 of the present invention.

DESCRIPTION OF EMBODIMENTS

Figure 1:
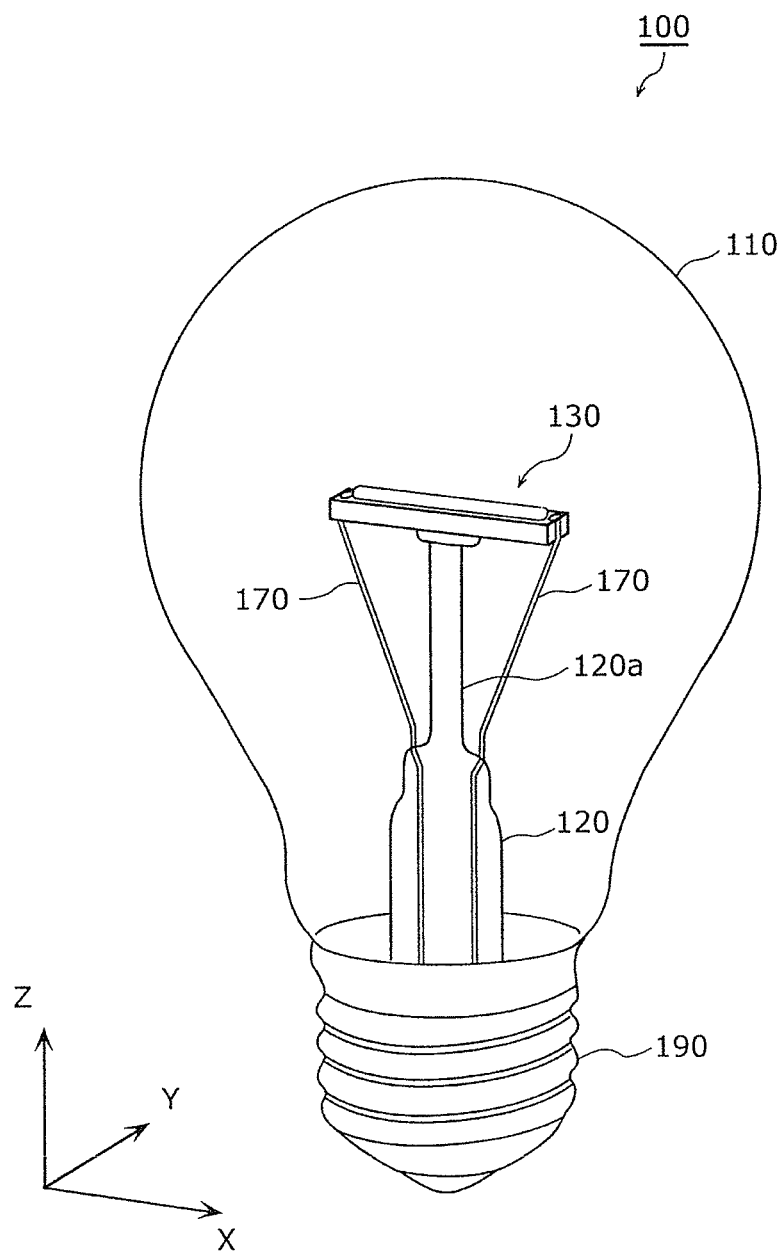
FIG. 1 is a perspective view of a light bulb shaped lamp according to the embodiment 1 of the present invention.

The following shall describe the light-emitting device and the lamp according to the embodiments of the present invention shall be described. However, the present invention is defined by the Claims. Accordingly, among the components in the embodiment, the components not described in Claims are not necessary for solving the problem of the present invention but included for a preferable embodiment. Note that, the diagrams are schematic diagrams, and illustration is not necessarily strictly accurate. In the drawings, the same reference numerals are assigned to the same components, and the description for these components shall be omitted or simplified.

Embodiment 1

First, a light bulb shaped lamp 100 according to the embodiment 1 of the present invention shall be described with reference to the drawings.

Overall Configuration of Light Bulb Shaped Lamp 100

First, the overall configuration of the light bulb shaped lamp 100 according to the embodiment 1 shall be described with reference to FIG. 1 to FIG. 3.

FIG. 1 is a perspective view of a light bulb shaped lamp according to the embodiment 1 of the present invention. FIG. 2 is an exploded perspective view of a light bulb shaped lamp according to the embodiment 1 of the present invention. FIG. 3 is a front view of a light bulb shaped lamp according to the embodiment 1 of the present invention. Note that, in FIG. 3, part of the lighting circuit 180 and a lead wire 170 for holding and supplying power inside a base 190 are shown in dotted lines.

As illustrated in FIG. 1, the light bulb shaped lamp 100 according to the embodiment 1 is a light bulb shaped LED lamp replacing an incandescent electric bulb, in which a base 190 is attached to a translucent globe 110. An LED module 130 on which an LED chip is mounted is housed in the globe 110. The LED module 130 is directly fixed to the stem 120 extending from an opening 111 of the globe 110 toward the inside of the globe 110.

Figure 2:
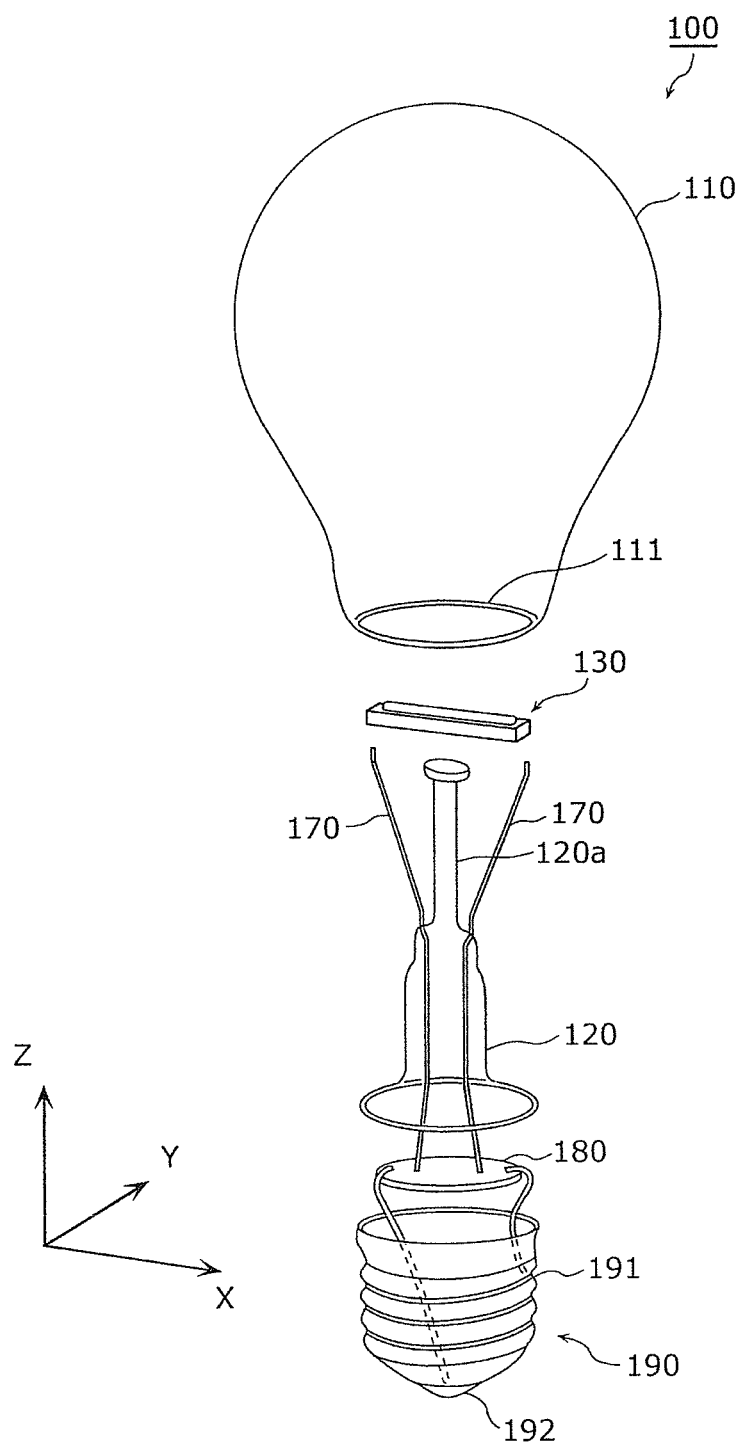
FIG. 2 is an exploded perspective view of a light bulb shaped lamp according to the embodiment 1 of the present invention.
Figure 3:
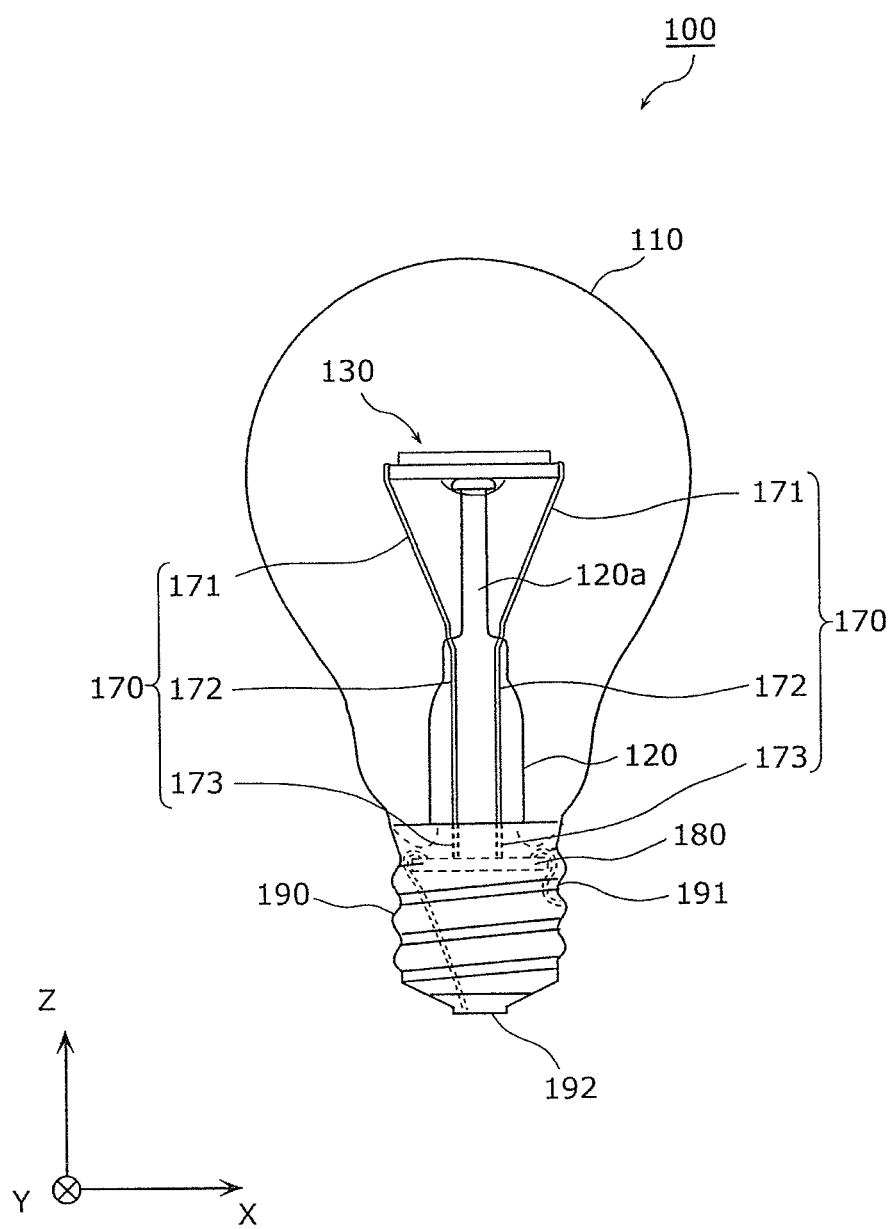
FIG. 3 is a front view of a light bulb shaped lamp according to the embodiment 1 of the present invention.

More specifically, as illustrated in FIG. 1 to FIG. 3, the light bulb shaped lamp 100 includes a globe 110, a stem 120, an LED module 130, two lead wires 170, a lighting circuit 180, and a base 190.

The following shall describe components of the light bulb shaped lamp 100 with reference to FIG. 1 to FIG. 3.

Globe 110

As illustrated in FIG. 1 to FIG. 3, the globe 110 is a hollow translucent component, houses the LED module 130 inside, and transmits the light from the LED module 130 to outside of the lamp. In the embodiment 1, the globe 110 is a hollow glass bulb made of silica glass transparent to visible light. Accordingly, the LED module 130 housed in the globe 110 is visible to a user from outside of the globe 110. This structure of the light bulb shaped lamp 100 suppresses loss of light from the LED chip 150 by the globe 110.

The globe 110 has a shape with one end closed in a spherical shape, and the other end has the opening 111. In other words, the shape of the globe 110 is that a part of hollow sphere is narrowed down while extending away from the center of the sphere, and the opening 111 is formed at a part away from the center of the sphere. In the embodiment 1, the shape of the globe 110 is Type A (JIS C7710) which is the same as a common incandescent light bulb.

Note that, the shape of the globe 110 does not have to be Type A. For example, the shape of the globe 110 may be Type G, Type E, or others. Furthermore, it is not necessary for the globe 110 to be transparent to visible light. For example, diffusion treatment may be performed such as a milky white diffusion film formed by coating silica. Alternatively, the globe 110 may be colored in red, yellow, or other colors, or a pattern or a picture may be painted thereon. Alternatively, a reflector film or others may be provided on a side closer to the base than the light source like a reflector light bulb. In addition, it is not necessary for the globe 110 to be made of silica glass, and may be made of transparent resin such as acrylic. However, if the globe 110 is made of glass as described above, the globe 110 is highly resistant to heat. In addition, by forming the thickness of the globe 110 uneven, the light from the LED hits the uneven part, giving a glistening effect to the light.

Stem 120

As illustrated in FIG. 2 and FIG. 3, the stem 120 is a pillar extended toward the inside of the globe 110. Stated differently, the stem 120 is provided extending from the vicinity of the opening 111 of the globe 110 to the inside of the globe 110. More specifically, a rod-shaped extended portion 120a extending to the vicinity of the LED module 130 in the Z-axis direction is provided on one end of the stem 120. In other words, the stem 120 according to the embodiment 1 is a component that would be obtained by extending the stem used for a common incandescent light bulb extending toward the inside of the globe 110.

The LED module 130 is directly fixed to an end of the extended portion 120a. Note that, the details shall be described later with reference to FIG. 4.

The other end portion of the stem 120 is formed in a flared shape coinciding with the shape of the opening 111. The other end portion of the stem 120 formed in the flared shape is joined with the opening 111 of the globe 110 so as to close the opening of the globe 110. In addition, parts of two lead wires 170 are partially sealed in the stem 120. Accordingly, it is possible to supply power to the LED module 130 in the globe 110 from outside of the globe 110 keeping the globe 110 airtight. Accordingly, the light bulb shaped lamp 100 can prevent water or water vapor from entering the globe 110 for a long period of time, and it is possible to suppress the degradation of the LED module 130 and a part connecting the LED module 130 and the lead wire 170 due to moisture.

The stem 120 is made of soft glass transparent to visible light. This structure of the light bulb shaped lamp 100 suppresses loss of light from the LED chip 150 by the stem 120. In addition, the light bulb shaped lamp 100 can prevent the shadow cast by the stem 120. Furthermore, light emitted by the LED chip 150 lights up the stem 120. Thus, the light bulb shaped lamp 100 can achieve visually superior appearance.

Note that, it is not necessary for the stem 120 to be transparent to the visible light, or to be made of soft glass. For example, the stem 120 may be a component made of a highly heat-conductive resin. As the highly heat-conductive resin, silicone resin in which metal particles such as alumina or zinc oxide are mixed may be used. In this case, the light bulb shaped lamp 100 can actively transfer the heat generated at the LED module 130 to the globe 110 or the base 190 through the stem 120. As a result, the light bulb shaped lamp 100 is capable of suppressing reduction in light-emission efficacy and reduction in product life of the LED chip 150 due to increased temperature.

Furthermore, it is not always necessary for the stem 120 to close the opening at the globe 110, and the stem 120 may be attached to a part of the opening 111.

LED Module 130

Figure 4:
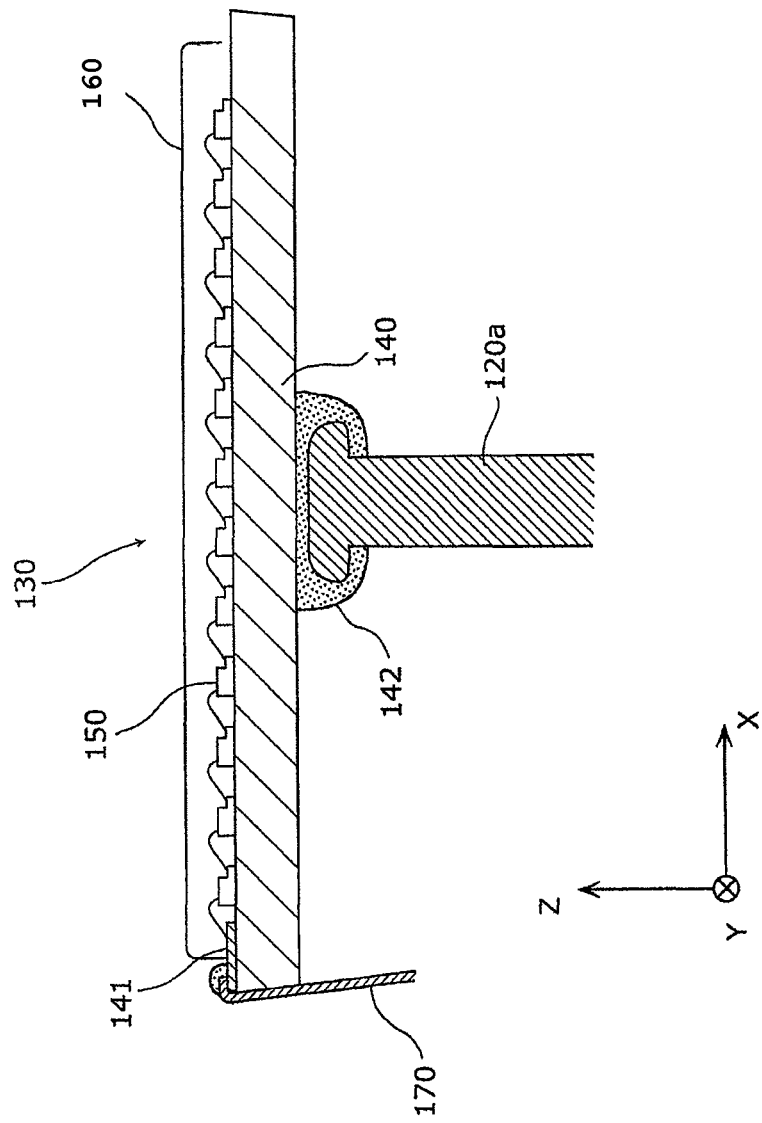
FIG. 4 is a cross-sectional view of an LED module according to the embodiment 1 of the present invention.
Figure 5:
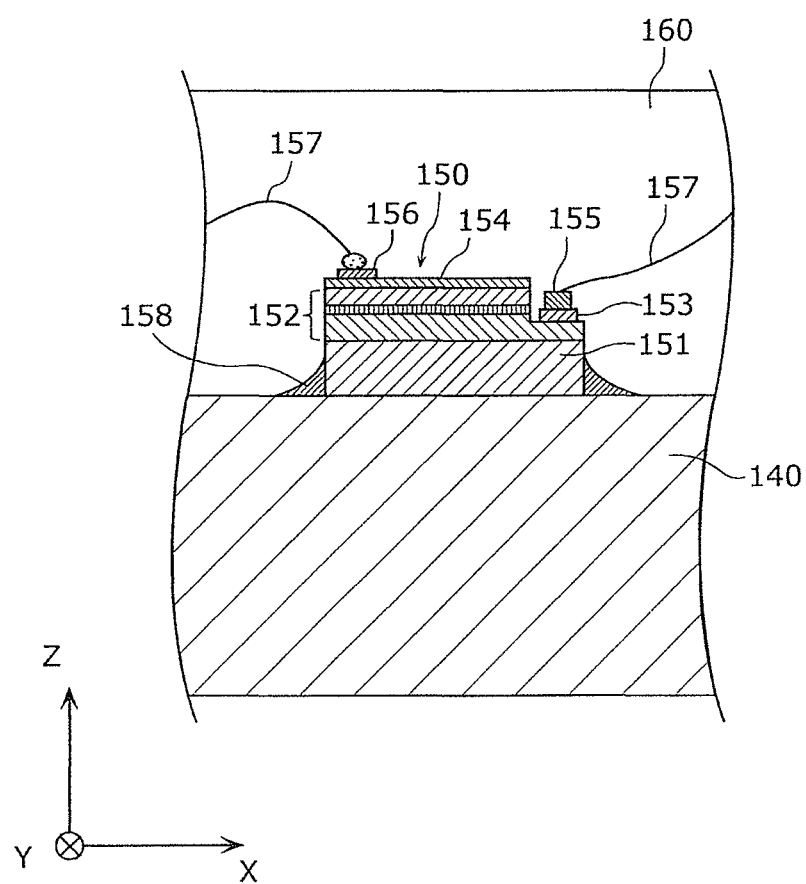
FIG. 5 is an enlarged cross-sectional view of a part around an LED chip in an LED module according to the embodiment 1 of the present invention.

FIG. 4 is a cross-sectional view of an LED module 130 according to the embodiment 1 of the present invention. FIG. 5 is an enlarged cross-sectional view around the LED chip in an LED module 130 according to the embodiment 1 of the present invention.

The LED module 130 corresponds to a light-emitting module which is a light source of the light bulb shaped lamp 100, and is housed in the globe 110. It is preferable that the LED module 130 is positioned at the center of the spherical shape formed by the globe 110 (for example, inside a large diameter part at which the inner diameter of the globe 110 is large). With the LED module 130 positioned at the center, the light bulb shaped lamp 100 can achieve omnidirectional light distribution property when the light bulb shaped lamp 100 is switched on. The omnidirectional light distribution property is approximated to a common incandescent light bulb using conventional filament coil.

As illustrated in FIG. 4, the LED module 130 is a chip-on-board (COB) light-emitting module in which the LED chips are directly mounted on the board, and includes a base platform 140, LED chips 150, and a sealing material 160. The LED module 130 is provided with the surface on which the LED chips 150 are mounted facing the top of the globe 110 (in a positive direction of Z-axis direction). The following shall describe components of the LED module 130 in detail.

Base Platform 140

The base platform 140 is composed of a material translucent to visible light, and more specifically, it is a ceramic component containing alumina. It is preferable that the base platform 140 is a component having high transmittance of visible light. With this, the light emitted from the LED chip 150 passes through the inside of the base platform 140, and the light is emitted from a part on which no LED chip 150 is mounted. Accordingly, even when the LED chip 150 is mounted only on one side of the base platform, the light is emitted from the other surfaces, allowing achievement of the light distribution property equivalent to that of an incandescent light bulb.

Note that, the base platform 140 does not have to be translucent. In this case, the LED chips 150 may be mounted on more than one side of the base platform 140, for example.

The shape of the base platform 140 is a quadrangular prism (20 mm in length (X-axis direction), 1 mm in width (Y-axis direction), and 0.8 mm in thickness (Z-axis direction)). Since the shape of the base platform 140 is a quadrangular prism, the light bulb shaped lamp 100 can reproduce the filament of an incandescent light bulb by the LED module 130 in a simulative manner. Note that, the shape and size of the base platform 140 are merely example, and may be in other shapes and sizes.

Power supply terminals 141 are provided on the ends of the base platform 140 in the longer direction (X-axis direction). The two lead wires 170 are electrically and physically connected to the power supply terminals 141 by solder, respectively.

Furthermore, the base platform 140 is directly fixed to the stem 120. With this structure, the LED module 130 is directly fixed to the stem 120. More specifically, a side of the base platform 140 is directly fixed to an end of the stem 120 by the adhesive material 142. To put it differently, the base platform 140 (LED module 130) being directly fixed to the stem 120 includes the following two cases: the base platform 140 is in contact with and fixed to the stem 120 (extended portion 120*a*); and the base platform 140 (LED module 30) is fixed to the stem 140 (extended portion 120*a*) via the adhesive material 142 as illustrated in FIG. 4. As described above, since the base platform 140 and the stem 120 are fixed by the adhesive material 142, the base platform 140 is firmly fixed to and held by the stem 120.

The adhesive material 142 is transparent to visible light, and is typically adhesive made of silicone resin. As described above, the adhesive material 142 is transparent to visible light. Accordingly, the light bulb shaped lamp 100 can reduce the loss of light emitted by the LED chip 150 by the adhesive material 142. In addition, the light bulb shaped lamp 100 can prevent the shadow cast by the adhesive material 142.

Note that, the adhesive material 142 may not only include adhesive, but may be a seat component on which adhesive is applied on each side. Furthermore, it is not necessary for the adhesive to be made of silicone resin.

Note that, it is preferable that the base platform 140 is made of a material having a high thermal conductivity and high thermal emissivity in heat radiation so as to increase heat-radiating property. More specifically, the material for the base platform 140 is preferably a material referred to as a hard brittle material, which is a generic term for glass, ceramic, and others. Here, the emissivity is represented by a ratio with respect to heat emission on black body (full radiator), and has a value between 0 and 1. The emissivity of glass or ceramic is 0.75 to 0.95, and heat emission close to the black body radiation is achieved. In terms of practical use, the emissivity of the base platform 140 is preferably 0.8 or higher, and is more preferably 0.9 or higher.

LED Chip 150

The LED chip 150 is an example of the semiconductor light-emitting device, and is a blue LED which emits blue light when energized in the embodiment 1. The LED chips 150 are mounted on one side of the base platform 140. More specifically, 12 LED chips are arranged in a straight line between the two power supply terminals 141.

As illustrated in FIG. 5, the LED chip 150 is elongated vertically (600 μm in length, 300 μm in width, and 100 μm in thickness). The LED chip 150 includes a sapphire board 151 and nitride semiconductor layers 152 each having different composition, and are stacked above the sapphire board 151.

A cathode 153 and an anode 154 are formed at an end portion of the upper surface of the nitride semiconductor layer 152. Wire bonding portions 155 and 156 are formed on the cathode 153 and the anode 154, respectively.

The cathode 153 and the anode 154 in the LED chips 150 next to each other are electrically connected in series by a gold wire 157 through the wire bonding portions 155 and 156. The cathode 153 or the anode 154 in the LED chips 150 at the ends is connected to a power supply terminal 141 by the gold wire 157.

Each of the LED chips 150 is mounted on the base platform 140 by translucent chip bonding material 158 such that a surface of the LED chip 150 on the sapphire board 151 side faces the mounting surface of the base platform 140.

Silicone resin including filler made of metal oxide may be used as the chip bonding material, for example. Using the translucent material for the chip bonding material can reduce the loss of light emitted from the surface of the LED chip 150 on the side of the sapphire board 151 and the side surfaces of the LED chip 150, preventing the shadow cast by the chip bonding material.

Note that, in the embodiment 1, an example in which the LED chips 150 are mounted on the base platform 140 has been illustrated. However, the number of the LED chips 150 may be changed when necessary according to the use of the light bulb shaped lamp 100. For example, as a replacement for a miniature light bulb, one LED chip 150 may be mounted on the base platform 140.

Sealing Material 160

The sealing material 160 is a translucent component, and is formed covering the LED chips 150. More specifically, the sealing material 160 is made of translucent resin such as silicone resin in which predetermined phosphor particles which is a wavelength conversion material (not illustrated) and light diffusion material (not illustrated) are included.

The sealing material 160 is formed by the following two processes, for example. First, in the first process, the sealing material 160 which is an uncured paste including the wavelength conversion material is applied in a continuous straight line on the LED chips 150 by a dispenser. Next, in the second process, the applied paste of sealing material 160 is cured.

The cross-section in X-axis direction of the sealing material 160 formed as described above is dome-shaped, and is 1 mm wide and 0.2 mm high. Note that, the width in the cross section of the sealing material 160 in Y-axis direction is identical to the width of the base platform 140.

Part of the blue light emitted by the LED chip 150 is absorbed by the wavelength conversion material in the sealing material 160, and is converted into the light in another wavelength. For example, if YAG phosphor such as $(Y,Gd)_3Al_5O_{12}:Ce^{3+}$, $Y_3Al_5O_{12}:Ce^{3+}$ is used as the wavelength conversion material, part of the blue light emitted by the LED chip 150 is converted into yellow light. The blue light not absorbed by the wavelength conversion material and the yellow light which is converted are diffused and mixed in the sealing material 160. After that, the mixed light is emitted from the sealing material 160 as white light.

Particles such as silica are used as the light diffusion material. Since the base platform 140 is translucent, the white light emitted from the linear sealing material 160 passes through the inside of the base platform 140 and is emitted from the side surfaces of the base platform 140 where no LED chip 150 is mounted. Accordingly, when the light bulb shaped lamp 100 is turned on, the base platform 140 shines like a filament coil of a conventional incandescent light bulb when viewed from any side of the surface of the base platform 140.

Note that the sealing material 160 may be provided on a surface where no LED chip 150 is provided. With this, part of the blue light which transmits inside the base platform 140 and is emitted from the side surfaces on which no LED chip 150 is mounted is converted to yellow light. Accordingly, it is possible to change the color of light emitted from the side surfaces on which no LED chip 150 is mounted closer to the color of light is directly emitted from the sealing material 160.

Note that, the wavelength conversion material included in the sealing material 160 may be a yellow phosphor such as $(Sr,Ba)_2SiO_4:Eu^{2+}$, $Sr_3SiO_5:Eu^{2+}$, for example. Alternatively, the wavelength conversion material may be a green phosphor such as $(Ba,Sr)_2SiO_4:Eu^{2+}$, $Ba_3Si_6O_{12}N_2:Eu^{2+}$. Alternatively, the wavelength conversion material may be a red phosphor such as $CaAlSiN_3:Eu^{2+}$, $Sr_2(Si,Al)_5(N,O)_8:Eu^{2+}$.

The sealing material 160 may not be necessarily be made of silicone resin, and may be made of an organic material such as fluorine series resin or an inorganic material such as a low-melting-point glass or a sol-gel glass. Since the inorganic materials are more highly resistant to heat than the organic material, the sealing material 160 made of inorganic material is advantageous to increasing luminance.

Lead Wire 170

Two lead wires 170 support the LED module 130, and hold the LED module 130 at a constant position in the globe 110. The power supplied from the base 190 is supplied to the LED chips 150 through the two lead wires 170. Each of the lead wires 170 is a composite wire including an internal lead wire 171, a Dumet wire (copper-clad nickel steel wire) 172 and an external lead wire 173 joined in this order.

The internal lead wire 171 is the electric wire extending from the stem 120 to the LED module 130, is joined with the base platform 140, and supports the LED module 130. The Dumet wire 172 is sealed in the stem 120. The external lead wire 173 is an electric wire extending from the lighting circuit 180 to the stem 120.

Here, it is preferable that the lead wire 170 is a metal wire including copper having high thermal conductivity. With this, the heat generated at the LED module 130 can be actively transferred to the base 190 through the lead wire 170.

Note that, the lead wire 170 does not necessarily have to be a composite wire, and may be a single wire made of the same metal wire. In addition, two lead wires 170 do not have to be provided. For example, when the light bulb shaped lamp 100 includes a plurality of the LED modules 130 in the globe 110, two lead wires 170 may be provided for each of the LED modules 130. Accordingly, the light bulb shaped lamp 100 may include the lead wires 170 twice in number as the number of the LED modules 130.

In addition, it is preferable for the lead wire 170 to be attached to the base platform 140 as if pressing the base platform 140 toward the stem 120. With this, the base platform 140 can be fixed and held to the stem 120 more firmly.

Lighting Circuit 180

The lighting circuit 180 is a circuit for causing the LED chips 150 to emit light, and is housed in the base 190. More specifically, the lighting circuit 180 includes a plurality of circuit elements, and a circuit board on which each of the circuit elements is mounted. In this embodiment, the lighting circuit 180 converts the AC power received from the base 190 to the DC power, and supplies the DC power to the LED chips 150 through the two lead wires 170.

Figure 6:
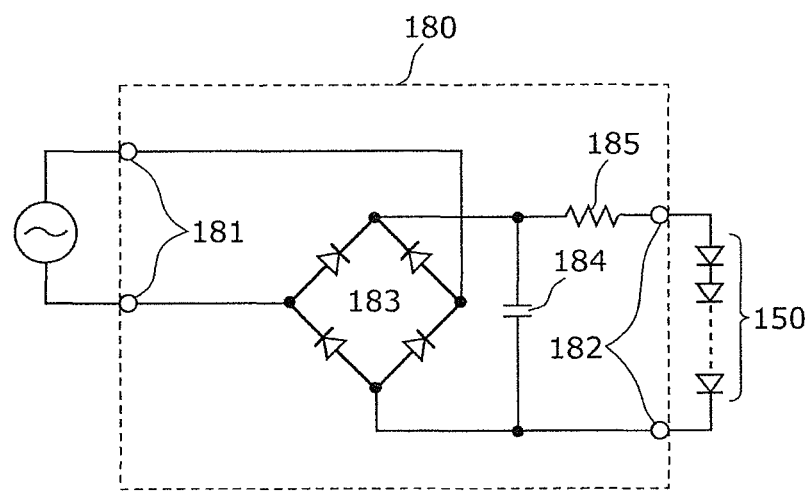
FIG. 6 is a circuit diagram of a lighting circuit according to the embodiment 1 of the present invention.

FIG. 6 is a circuit diagram of the lighting circuit 180 according to the embodiment 1 of the present invention. As illustrated in FIG. 6, the lighting circuit 180 includes a diode bridge 183 for rectification, a capacitor 184 for smoothing, and a resistor 185 for adjusting current. Input terminals of the diode bridge 183 are connected to input terminals 181 of the lighting circuit 180. One of the output terminals of the diode bridge 183 and one end of the resistor 185 are connected to the output terminals 182 of the lighting circuit 180. An end of the capacitor 184 and the other end of the resistor 185 are connected to the other of the output terminals of the diode bridge 183.

The input terminal 181 is electrically connected to the base 190. More specifically, one of the input terminals 181 is connected to the screw 191 on the side surface of the base 190. The other of the input terminals 181 is connected to the eyelet 192 at the bottom of the base 190.

The output terminals 182 are connected to the lead wires 170, and are electrically connected to the LED chips 150.

Note that, the light bulb shaped lamp 100 does not have to include the lighting circuit 180. For example, the lighting circuit 180 is not necessary for the light bulb shaped lamp 100 when the DC power is directly supplied from a battery cell or others. In this case, one of the external lead wires 173 is connected to the screw 191, and the other of the external lead wire 173 is connected to the eyelet 192.

Note that, the lighting circuit 180 is not limited to a smoothing circuit, but may be an appropriate combination of light-adjusting circuit, voltage booster, and others.

Base 190

The base 190 is provided at the opening 111 of the globe 110. More specifically, the base 190 is attached to the globe 110 using an adhesive such as cement to cover the opening 111 of the globe 110. In this embodiment, the base 190 is an E26 base. The light bulb shaped lamp 100 is attached to a socket for E26 base connected to the commercial AC power source for use.

Note that, the base 190 does not have to be an E26 base, and maybe a base of other size, such as E17. In addition, the base 190 does not have to be a screw base, and may be a base in a different shape such as a plug-in base.

Furthermore, the base 190 is directly attached to the opening 111 of the globe 110. However, the configuration is not limited to this example. The base 190 may be indirectly attached to the globe 110. For example, the base 190 may be attached to the globe 110 through a resin component such as a resin case. The lighting circuit 180 and others may be housed in the resin case, for example.

As described above, according to the light bulb shaped lamp 100 according to the embodiment, the base platform 140 on which the LED chip 150 is directly fixed to the stem 120. Accordingly, it is possible to fix and hold the base platform 140 firmly at a constant position in the globe 110 than a case in which only the lead wires 170 supports the base 140. Since the base 190 is attached to the globe 110 housing the LED chip 150 inside, the light emitted by the LED chip 150 is not blocked by the case. Accordingly, it is possible to achieve the light distribution property equivalent to the conventional incandescent light bulbs.

Furthermore, according to the light bulb shaped lamp 100 according to the embodiment 1, the heat generated at the LED chip 150 may be transferred to the globe 110 or the base 190 through the stem 120. Accordingly, it is possible to suppress the increase in the temperature of the LED chip 150. The stem 120 for fixing the base platform 140 is also used for incandescent light bulbs in general. Accordingly, it is possible to manufacture the light bulb shaped lamp 100 using the manufacturing facility for incandescent light bulbs.

Variation of Embodiment 1

The following shall describe a variation of the light bulb shaped lamp 100 according to the embodiment 1 of the present invention.

Variation 1 of Embodiment 1

First, the variation 1 of the embodiment 1 of the present invention shall be described.

The light bulb shaped lamp according to the variation 1 of the embodiment 1 of the present invention is different from the light bulb shaped lamp 100 according to the embodiment 1 mostly in that the base platform 140 is board shaped. The following shall describe the light bulb shaped lamp according to the variation with reference to the drawings. Note that, illustration and description for the components identical to the embodiment are omitted where appropriate.

Figure 7:
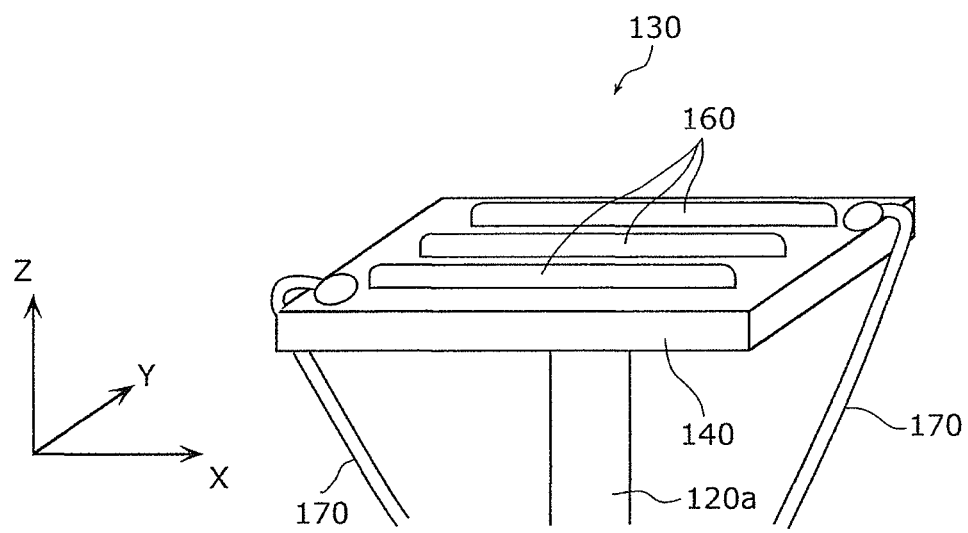
FIG. 7 is a perspective view of an LED module and a stem according to the variation 1 of the embodiment 1 of the present invention.
Figure 8:
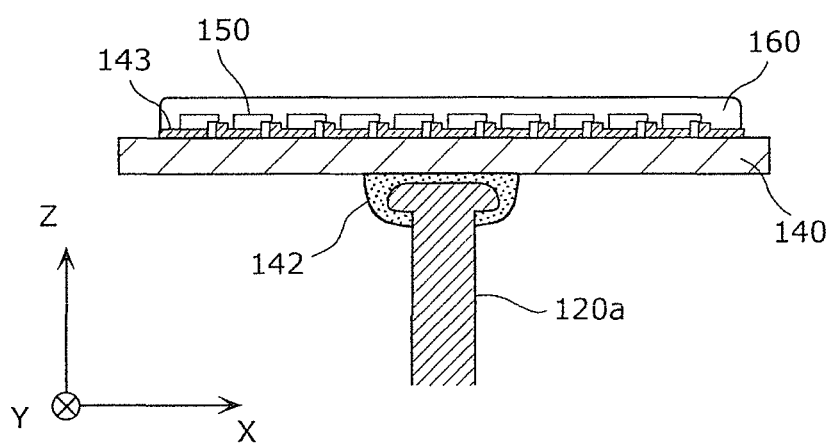
FIG. 8 is a cross-sectional view of an LED module and a stem according to the variation 1 of the embodiment 1 of the present invention.

FIG. 7 is a perspective view of the LED module 130 and the stem 120 according to the variation 1 of the embodiment 1 of the present invention. FIG. 8 is a cross-sectional view of the LED module 130 and the stem 120 according to the variation 1 of the embodiment 1 of the present invention.

The base platform 140 is a translucent component made of ceramic containing aluminum nitride. The base platform 140 is board shaped (20 mm in length, 10 mm in width, and 0.8 mm in thickness).

Power supply terminals 141 are provided at the diagonal corners of the base platform 140. Each of the two lead wires 170 has an end bent in L-shape, and is electrically and physically connected to the power supply terminal 141 by solder.

A metal line pattern 143 is formed on one side (surface) of the base platform 140, and the LED chip 150 is mounted thereon. Power is supplied to the LED chip 150 through the metal line pattern 143. The line pattern may be formed by a translucent conductive material such as indium tin oxide (ITO). In this case, it is possible to suppress the loss of light emitted by the LED chip 150, compared to the metal line pattern.

More specifically, the other side (back surface) of the base platform 140 is directly fixed to an end of the stem 120 by the adhesive material 142.

The LED chip 150 is a semiconductor light-emitting device which emits violet light when energized. More specifically, one row consists of 10 LED chips 150 and 30 LED chips 150 are mounted in three rows. With this, the light bulb shaped lamp 100 can reproduce an incandescent light bulb having three filament coils.

The sealing material 160 is a translucent component, and is provided to cover the row of LED chips 150. The sealing material 160 includes blue phosphor, green phosphor, and red phosphor as the wavelength conversion material. Accordingly, the violet light emitted by the LED chip 150 is converted into white light.

As described above, according to the light bulb shaped lamp according to the variation, the board-shaped base platform 140 may be fixed to the end of the stem 120 on one surface. Accordingly, it is possible to firmly fix and hold the base platform 140 at a constant position in the globe 110 compared to a case where the base platform 140 is supported only by the lead wires 170.

Variation 2 of Embodiment 1

Next, the variation 2 of the embodiment 1 of the present invention shall be described.

The light bulb shaped lamp according to the variation 2 of the embodiment 1 of the present invention is different from the light bulb shaped lamp according to the variation 1 in that a recess is provided on the back surface of the base platform of the light bulb shaped lamp according to the variation 1. The following shall describe the light bulb shaped lamp according to the variation with reference to the drawings. Note that, illustration and description for the components identical to the embodiment 1 or the variation 1 of the embodiment 1 are omitted where appropriate.

Figure 9:
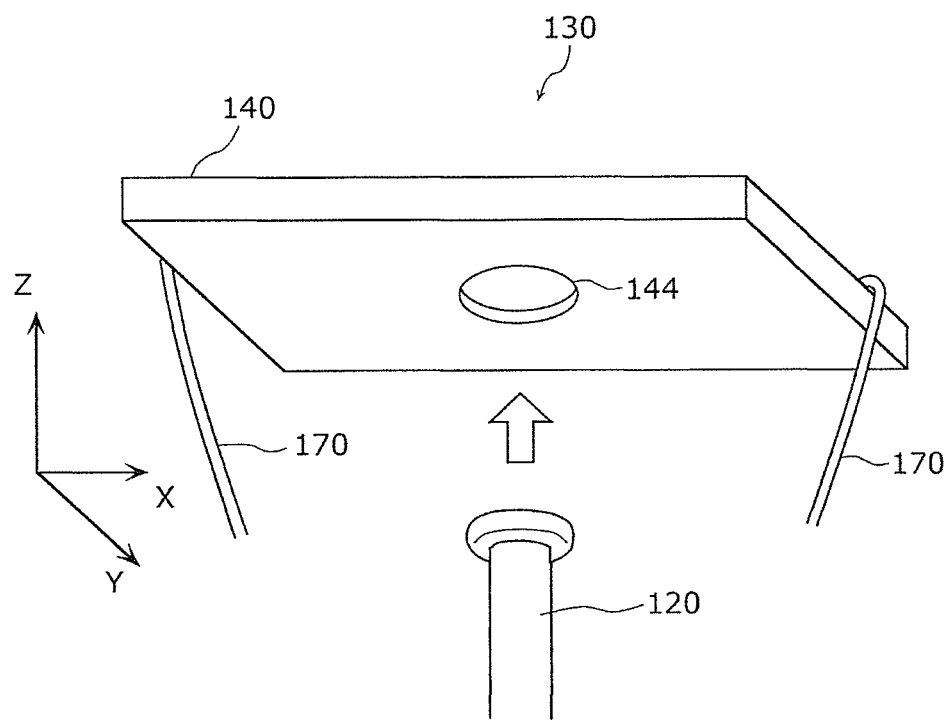
FIG. 9 is a perspective view of an LED module and a stem according to the variation 2 of the embodiment 1 of the present invention.
Figure 10:
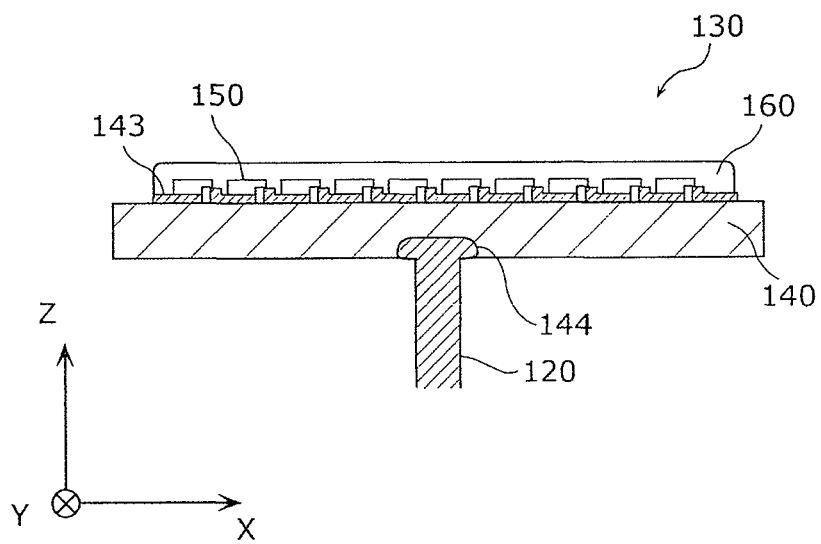
FIG. 10 is a cross-sectional view of an LED module and a stem according to the variation 2 of the embodiment 1 of the present invention.

FIG. 9 is a perspective view of the LED module 130 and the stem 120 according to the variation 2 of the embodiment 1 of the present invention from below. FIG. 10 is a cross-sectional view of the LED module 130 and the stem 120 according to the variation 2 of the embodiment 1 of the present invention.

In the variation 2, the base platform 140 has a recess 144 on the back surface. The base platform 140 is fixed to the stem 120 by an end portion of the stem 120 fitting in the recess 144.

As described above, since the end portion of the stem 120 is fit into the recess 144 provided in the back surface of the base platform 140, it is possible to prevent the base platform 140 from moving, and thus the base platform 140 can be fixed and held even more firmly.

Furthermore, the base platform 140 is fit into the stem 120 through the recess 144. Accordingly, it is possible to fix and hold the base platform 140 firmly without using adhesive.

Variation 3 of Embodiment 1

Next, the variation 3 of the embodiment 1 of the present invention shall be described.

The light bulb shaped lamp according to the variation 3 of the embodiment 1 of the present invention is mostly different from the light bulb shaped lamp according to the embodiment in the shape of the stem 120. The following shall describe the light bulb shaped lamp according to the variation with reference to the drawings. Note that, illustration and description for the components identical to the embodiment 1 are omitted where appropriate.

Figure 11:
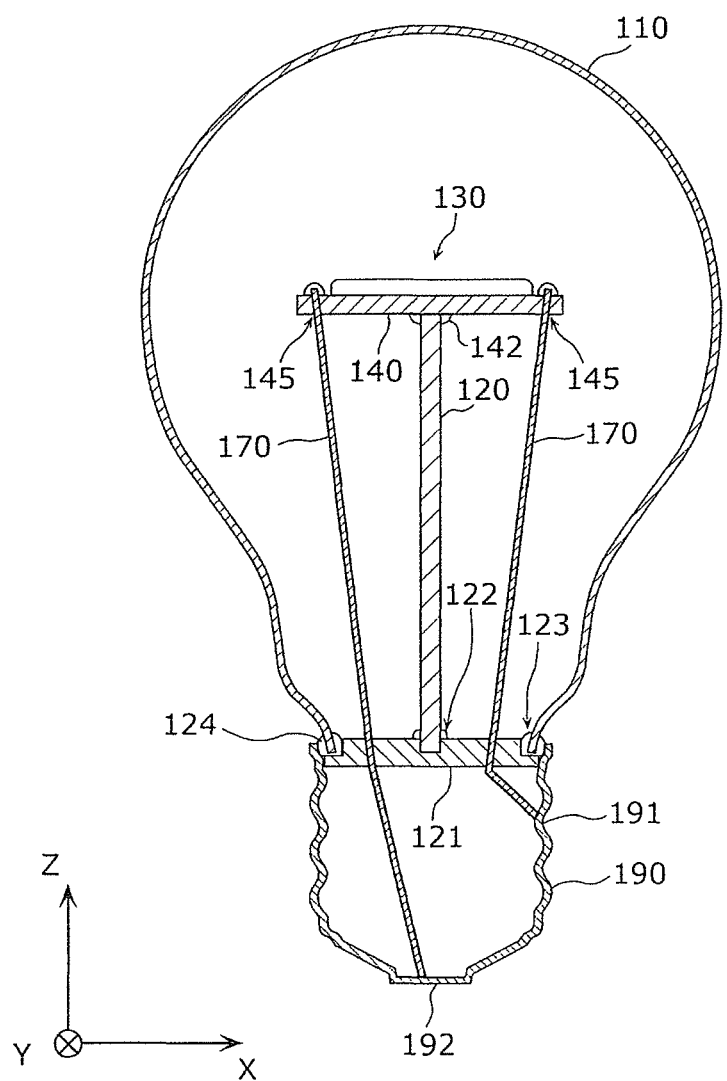
FIG. 11 is a cross-sectional view of a light bulb shaped lamp according to the variation 3 of the embodiment 1 of the present invention.

FIG. 11 is a cross-sectional view of the light bulb shaped lamp according to the variation 3 of the embodiment 1 of the present invention. In FIG. 11, the stem 120 is a rod-shaped component made of metal, ceramic, or glass. One end of the stem 120 is inserted into a hole 122 defined by a surface of a circular board component 121 closing the opening 111 of the globe 110, and fixed by using adhesive made of silicone resin or others. The other end of the stem 120 is fixed to the base platform 140 using the adhesive 142, in the same manner as the embodiment described above.

The board component 121 is fit into the opening of the base 190, and a cutout 123 is provided at the periphery of the board component 121. The opening 111 of the globe 110 is inserted into a groove defined by the cutout 123 and the base 190, and the globe 110 is fixed by the adhesive material 124 made of silicone resin or others.

Each of the lead wires 170 is inserted into a through hole 145 defined by the base platform 140, and is fixed to the base platform 140. Each of the lead wires 170 is also inserted into through hole defined by the board component 121, and is fixed to the board component 121.

As described above, according to the light bulb shaped lamp according to the variation, the rod-shaped stem 120 fixed to the board component 121 can fix and hold the LED module 130 at a constant position in the globe 110 firmly. Each of the lead wires 170 is inserted into the through hole 145 defined by the base platform 140, and is fixed to the base platform 140. Accordingly, when the light bulb shaped lamp is shaken, for example, it is possible to prevent lead wires 170 from being disconnected from the LED module 130.

Note that, it is preferable that the axial directions of the two through holes 145 defined by the base platform 140 are different from each other. With this, even if a force is exerted on the base platform 140 toward the axial direction of one of the through holes 145, the lead wire 170 inserted into the other through hole 145 can regulate the move of the base platform 140 in the direction of the force. Accordingly, it is possible to suppress the possibility that the lead wires 170 are disconnected from the LED module 130 due to vibration or others even more securely.

The light bulb shaped lamp according to an aspect of the present invention has been described based on the embodiment and the variations. However, the present invention is not limited to the embodiments.

For example, in the embodiment, the light bulb shaped lamp 100 receives AC power from a commercial AC power source. However, the light bulb shaped lamp 100 may receive DC power from a battery cell or others, for example. In this case, the light bulb shaped lamp 100 does not have to include the lighting circuit 180 illustrated in FIG. 6.

Furthermore, the present invention may not only be implemented as the light bulb shaped lamp, but also as a lighting apparatus including the light bulb shaped lamp. The following shall describe the lighting apparatus according to an aspect of the present invention with reference to FIG. 11.

Figure 12:
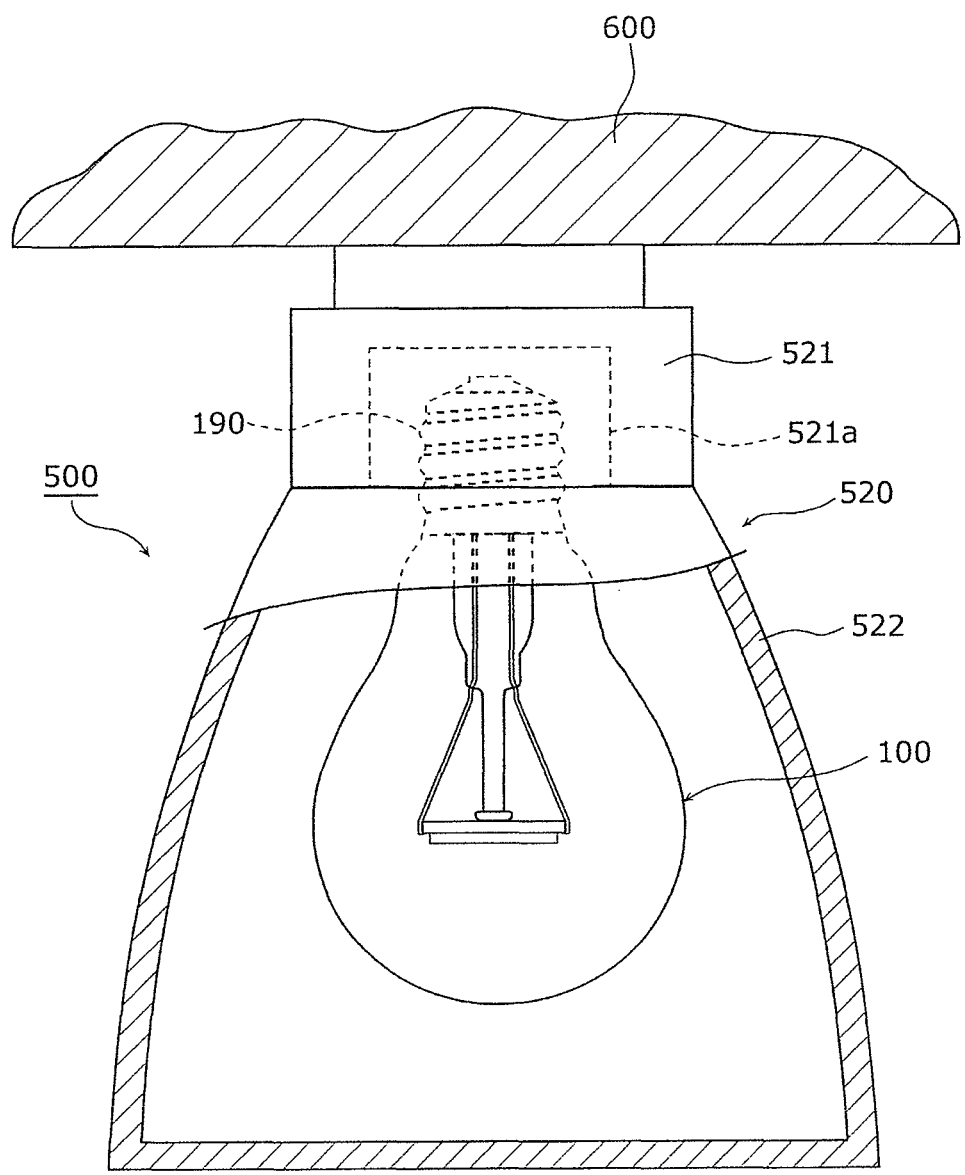
FIG. 12 is a schematic cross-sectional view of a lighting apparatus using the light bulb shaped lamp according to the embodiment 1 of the present invention.

FIG. 12 is a schematic cross-sectional view of the lighting apparatus 500 according to the embodiment 1 of the present invention.

The lighting apparatus 500 is used attached to a ceiling 600 in a room, for example, and includes the light bulb shaped lamp 100 according to the embodiment and a lighting equipment 520.

The lighting equipment 520 is for turning the light bulb shaped lamp 100 on and off, and includes an equipment body 521 attached to the ceiling 600 and a lamp cover 522 covering the light bulb shaped lamp 100.

The equipment body 521 includes a socket 521a. A base 190 of the light bulb shaped lamp 100 is screwed into the socket 521a. Power is supplied to the light bulb shaped lamp 100 through the socket 521a.

Note that the lighting apparatus 500 described here is an example of the lighting apparatus according to an aspect of the present invention. The lighting apparatus according to an aspect of the present invention may include at least a socket for holding the light bulb shaped lamp 100 and supplying power to the light bulb shaped lamp 100. Note that, the base 190 does not have to be screwed into the base 190, but may be simply inserted.

Furthermore, the lighting apparatus 500 illustrated in FIG. 12 includes one light bulb shaped lamp 100. However, the lighting apparatus 500 may include more than one light bulb shaped lamp 100.

Embodiment 2

Next, a light bulb shaped lamp 200 according to the embodiment 2 of the present invention shall be described with reference to the drawings.

Overall Configuration of Light Bulb Shaped Lamp 200

Figure 13:
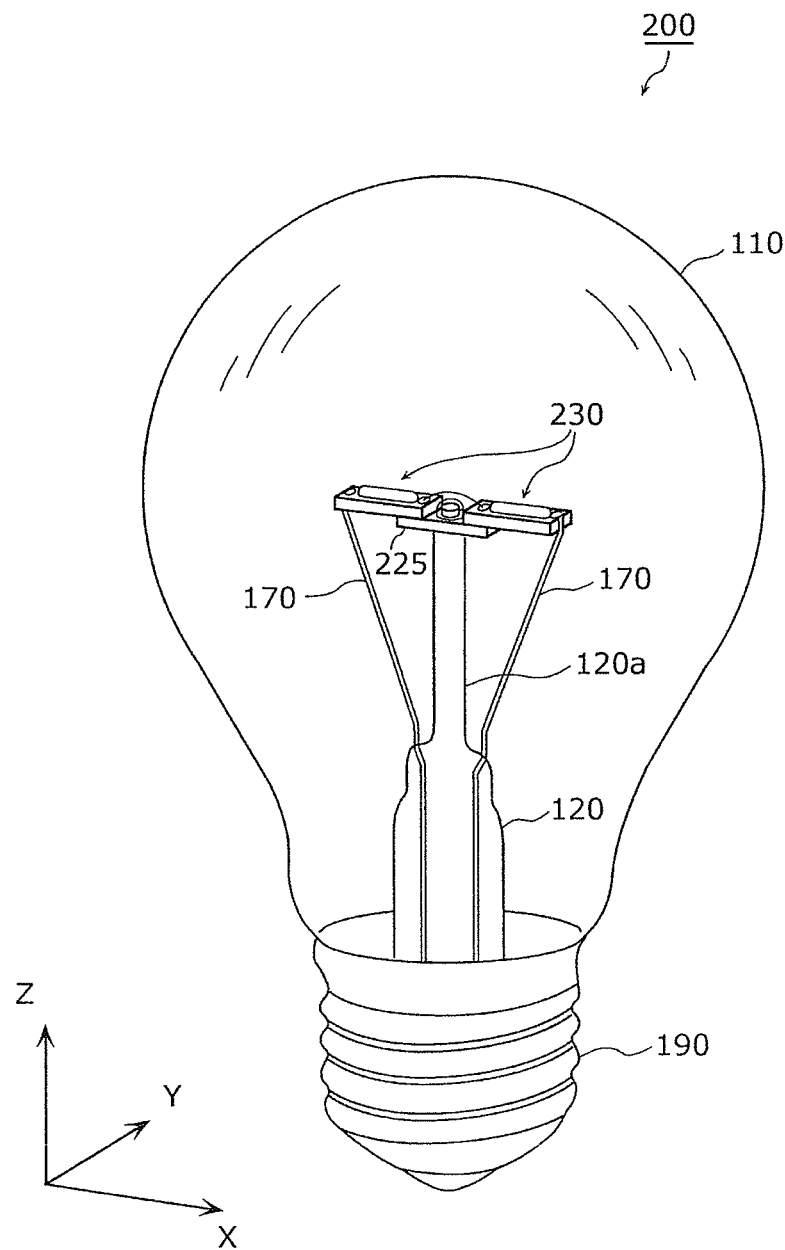
FIG. 13 is a perspective view of a light bulb shaped lamp according to the embodiment 2 of the present invention.
Figure 14:
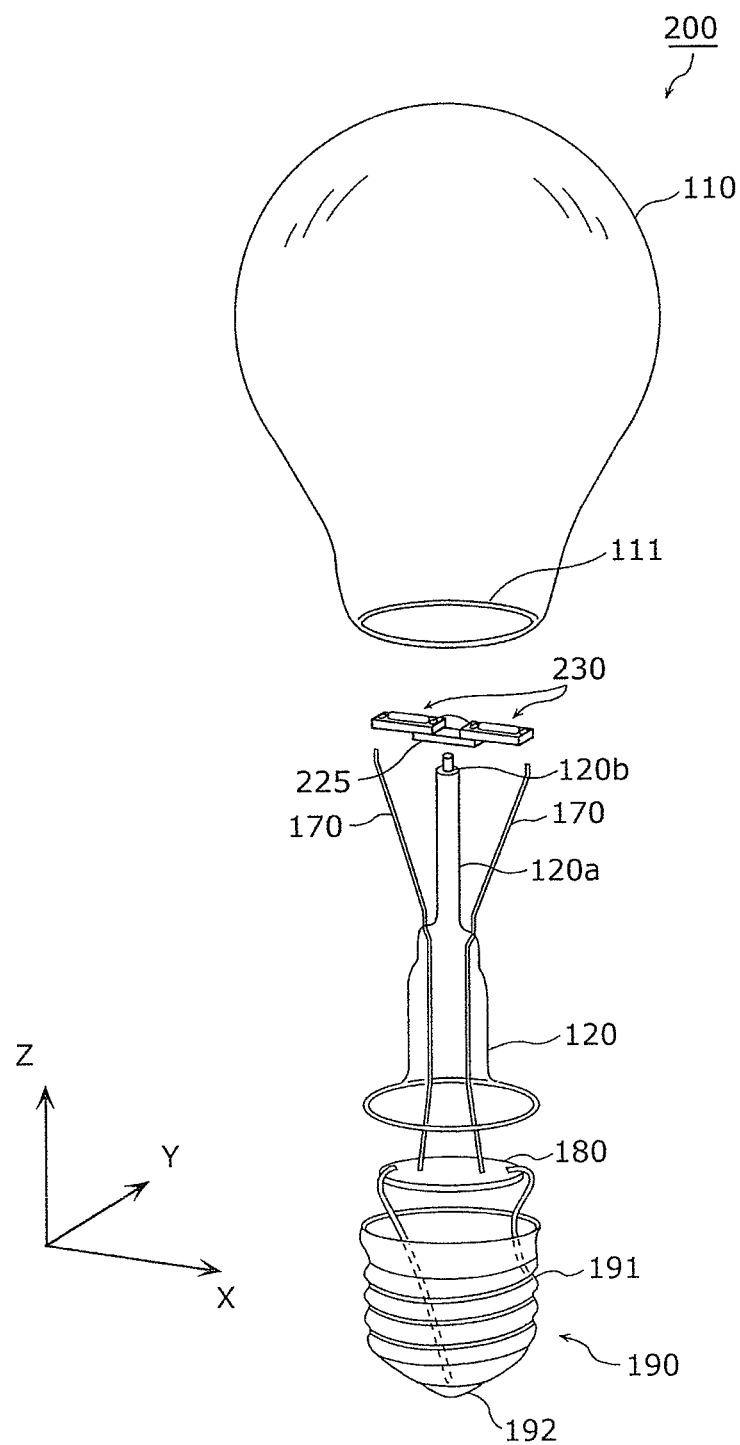
FIG. 14 is an exploded perspective view of a light bulb shaped lamp according to the embodiment 2 of the present invention.
Figure 15:
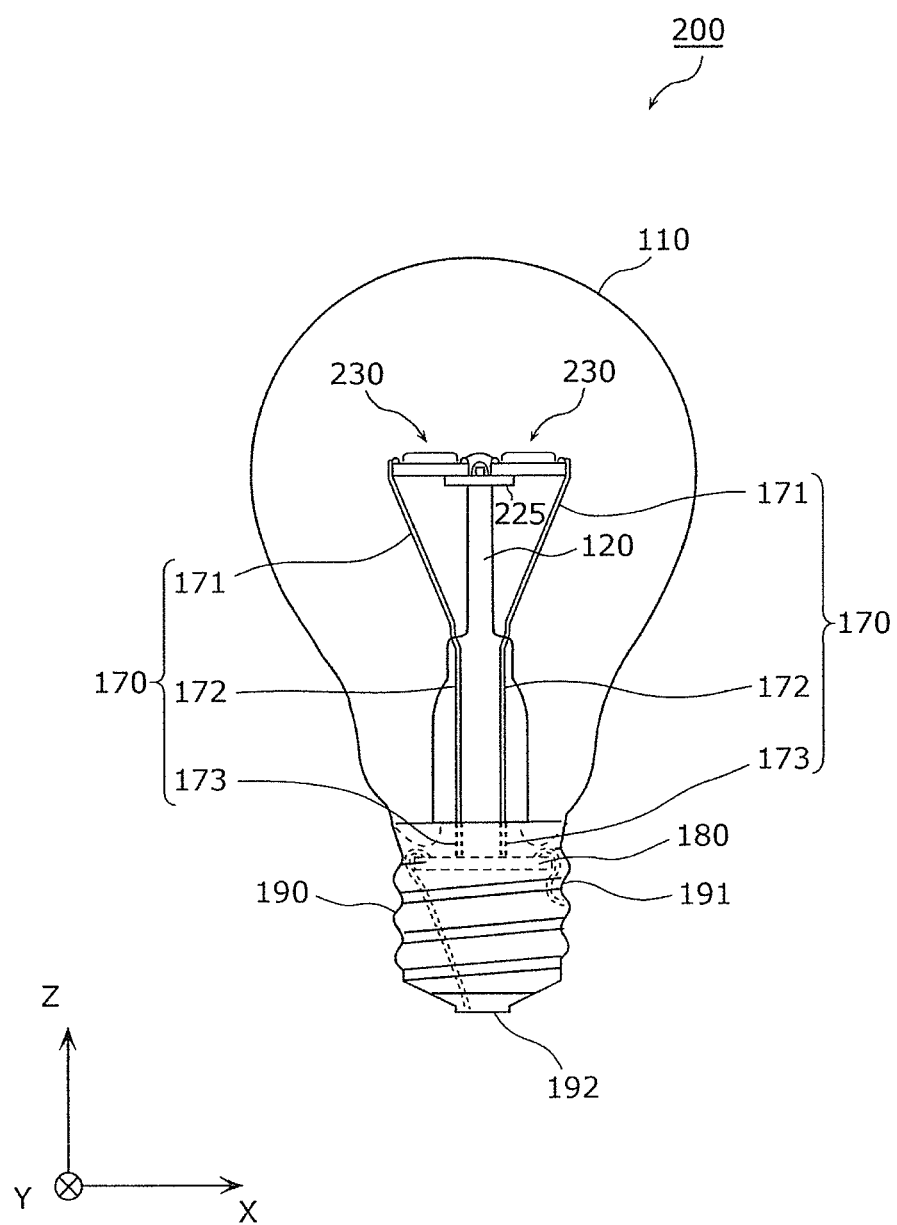
FIG. 15 is a front view of a light bulb shaped lamp according to the embodiment 2 of the present invention.

FIG. 13 is a perspective view of the light bulb shaped lamp according to the embodiment 2 of the present invention. FIG. 14 is an exploded perspective view of the light bulb shaped lamp according to the embodiment 2 of the present invention. FIG. 15 is a front view of the light bulb shaped lamp according to the embodiment 2 of the present invention. Note that, in FIG. 15, part of the lighting circuit 180 and a lead wire 170 inside a base 190 is shown in dotted lines.

As illustrated in FIG. 13, the light bulb shaped lamp 200 according to the embodiment 2 is a light bulb shaped LED lamp replacing an incandescent electric bulb, in which a base 190 is attached to a translucent globe 110. LED modules 230 on which an LED chip is mounted are housed in the globe 110. The LED modules 230 are fixed to a fixing component 225 in the globe 110, and the fixing component 225 is supported by the stem 120 inserted into the through hole defined by the fixing component 225. Note that, in the embodiment 2, one LED module (light-emitting module) is composed of the LED modules 230 and the fixing component 225.

More specifically, as illustrated in FIG. 1 to FIG. 3, the light bulb shaped lamp 200 includes the globe 110, the stem 120, a fixing component 225, two LED modules 230, the two lead wires 170, the lighting circuit 180, and the base 190.

Components of the light bulb shaped lamp 200 shall be described in detail with reference to FIG. 13 to FIG. 15 as follows.

Globe 110

As illustrated in FIG. 13 to FIG. 15, the globe 110 is a translucent hollow component, houses the LED module 230 inside, and transmits the light from the LED module 230 to outside of the lamp, in the same manner as the embodiment 1. In the embodiment 2, the globe 110 is a hollow glass bulb made of silica glass transparent to visible light as well. In the embodiment 2, the shape of the globe 110 is Type A (JIS C7710) which is the same as a common incandescent light bulb, that is, the globe 110 has a shape with one end closed in a spherical shape, and the other end has an opening 111.

Stem 120

As illustrated in FIG. 14 and FIG. 15, the stem 120 is a pillar extended toward the inside of the globe 110, in the same manner as the embodiment 1. Stated differently, the stem 120 is provided extending from the proximity of the opening 111 of the globe 110 to the inside of the globe 110. More specifically, a rod-shaped extended portion 120a extending to the proximity of the LED module 230 in the Z-axis direction is provided in one end of the stem 120.

The end portion of the extended portion 120a has a projecting shape. Stated differently, unlike the embodiment 1, a stepped part 120b is formed at the end portion of the extended portion 120a. The extended portion 120a is inserted into the through hole 226a defined by the fixing component 225, and supports the fixing component 225 using the stepped part 120b. To put it differently, the stepped part 120b regulates the movement of the fixing component 225 toward the stem 120 (in the negative direction of the Z-axis).

Note that, it is not necessary for the end portion of the extended portion 120a to have a projecting shape. In addition, it is not necessary for the end portion of the extending portion 120a to have a stepped part 120b. For example, the end portion of the extended portion 120a may have a conical trapezoid shape. Even in this case, if the upper base of the conical trapezoid is smaller than the through hole 226a (not illustrated), and the lower base is larger than the through hole 226a, the stem 120 can regulate the movement of the fixing component 225 toward the stem 120.

The other end portion of the stem 120 is formed in a flared shape coinciding with the shape of the opening 111, in the same manner as the embodiment 1. The other end portion of the stem 120 formed in the flared shape is joined with the opening 111 of the globe 110 so as to close the opening of the globe 110. In addition, parts of two lead wires 170 are partially sealed in the stem 120. The stem 120 is made of soft glass transparent to visible light.

Fixing Component 225

Figure 16:
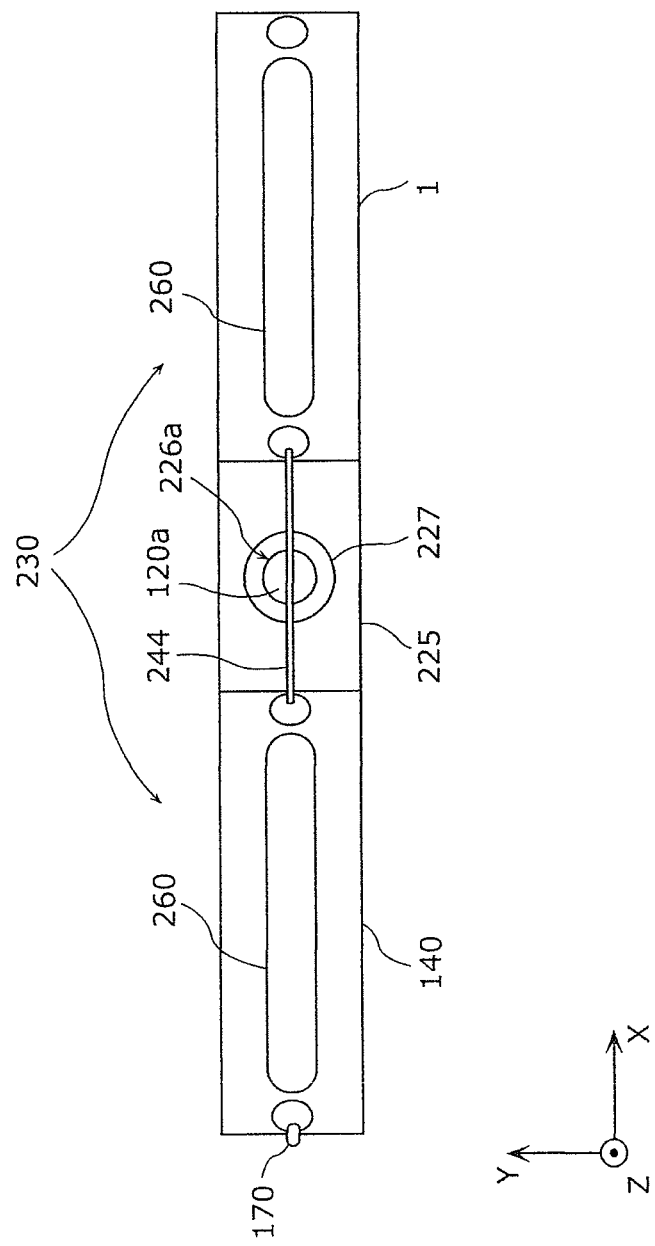
FIG. 16 is a front view of an LED module according to the embodiment 2 of the present invention.
Figure 17:
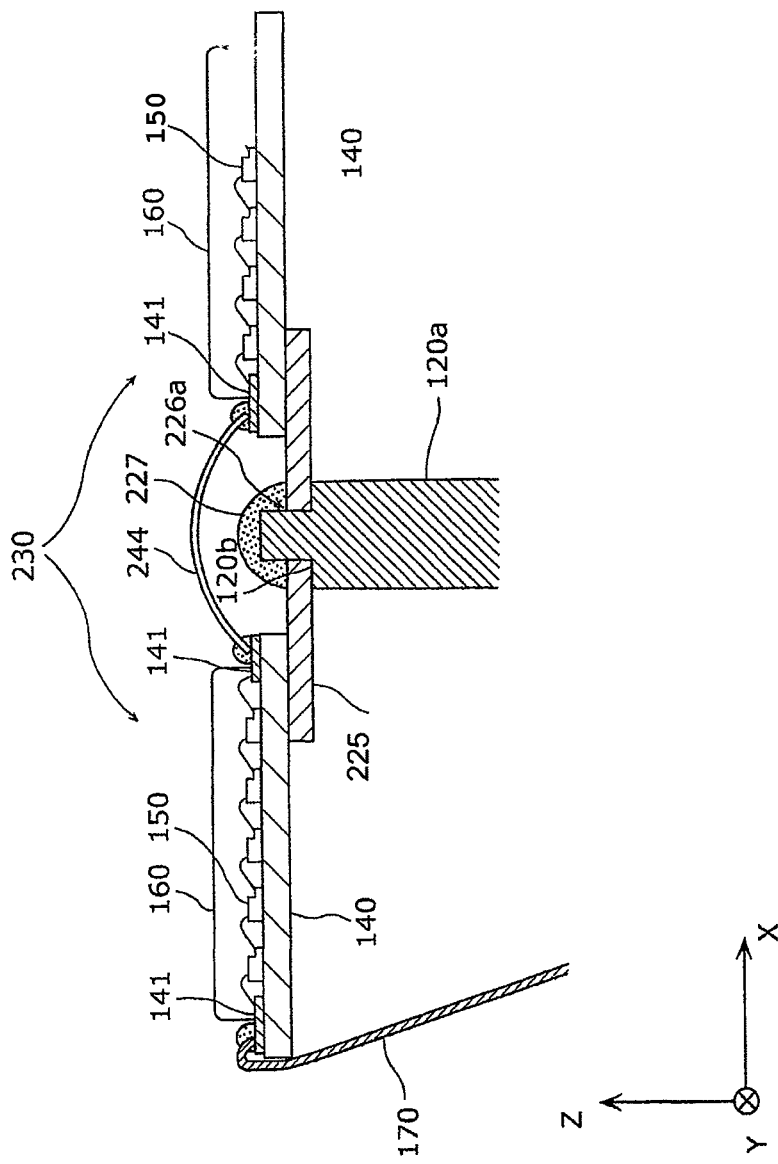
FIG. 17 is a cross-sectional view around an LED module according to the embodiment 2 of the present invention in Y-axis direction.

FIG. 16 is a plan view of the LED module 230 according to the embodiment 2 of the present invention. FIG. 17 is a cross-sectional view of a part around the LED module 230 according to the embodiment 2 of the present invention in Y-axis direction.

The fixing component 225 is a board-shaped component transparent to visible light, made of glass, resin, or others. Two LED modules 230 are fixed to the fixing component 225, which defines the through hole 226a. More specifically, each of the base platforms 140 in the two LED modules 230 is attached to the fixing component 225.

The through hole 226a corresponds to the first through hole, penetrating the fixing component 225 in the Z-axis direction. In the embodiment 2, the through hole 226a is circular, and substantially identical to the shape of the cross-section of the end portion of the extended portion 120a. To put it differently, the end portion of the extended portion 120a is fit into the through hole 226a. The end portion of the stem 120 is directly fixed to the fixing component 225 by the adhesive material 227 made of silicone resin and others. As described above, the fixing component 225 is directly fixed to the stem 120. Accordingly, the light bulb shaped lamp 200 can suppress the possibility that the lead wire 170 is disconnected from the LED module 230.

Here, it is preferable that the adhesive material 227 is transparent to visible light. Accordingly, it is possible to suppress the loss of light emitted by the LED chip 150 by the adhesive material 227. Furthermore, it is possible to prevent a shadow cast by the adhesive material 227.

Note that, it is not necessary for the fixing component 225 to be fixed to the stem 120, and may simply be supported. Even in this case, it is possible to suppress the stress exerted on the part connecting the lead wire 170 and the LED module 230 when the light bulb shaped lamp 200 is shaken, for example, and to suppress the possibility that the lead wire 170 is disconnected from the LED module 230.

Furthermore, it is not necessary for the fixing component 225 to be a component transparent to visible light, and may be a component made of metal or ceramic, for example. Furthermore, it is not necessary for the fixing component 225 to be in a board shape.

LED Module 230

The two LED modules 230 correspond to the light-emitting module which is a light source of the light bulb shaped lamp 200, and is provided in the globe 110. It is preferable that the two LED modules 230 are positioned at the proximity of the center of the spherical shape formed by the globe 110 (for example, inside a large diameter part at which the inner diameter of the globe 110 is large). With the LED module 230 positioned in the proximity of the center, the light bulb shaped lamp 200 can achieve omnidirectional light distribution property when the light bulb shaped lamp 200 is switched on. The omnidirectional light distribution property is approximated to a common incandescent light bulb using conventional filament coil.

In addition, the two LED modules 230 are fixed to the fixing component 225 such that the barycenter of the fixing component 225 and the LED modules 230 coincides with the center of the through hole 226a with respect to the longer direction of the stem 120 (Z-axis direction). Here, the two LED modules 230 have the same shape and size, and thus the two LED modules 230 are arranged symmetric with respect to the center of the through hole 226a. With this configuration, the stem 120 can support the fixing component 225 and the two LED modules 230 stably.

As illustrated in FIG. 17, each of the two LED modules 230 is a COB light-emitting module in which the LED chips are directly mounted on the base platform, and includes a base platform 140, LED chips 150, and a sealing material 160 in the same manner as the embodiment 1. The two LED modules 230 are provided with the first surface (hereinafter also referred to as "surface") on which the LED chips 150 are mounted facing the top of the globe 110 (in a positive direction of Z-axis direction).

Note that, the number of the LED modules 230 is not necessarily two, and may be three or more. As described above, even if there are three or more LED modules 230, it is possible to suppress the possibility that the lead wire 170 is disconnected from the LED module 230 when the light bulb shaped lamp is shaken, for example, by fixing the LED modules 230 to the fixing component 225.

Base Platform 140

The base platform 140 is a board component translucent to visible light, and is a ceramic component containing alumina, in the same manner as the embodiment 1. Note that, in the embodiment 2, the base platform 140 is fixed to the fixing component 225 by the adhesive material (not illustrated).

It is preferable that the base platform 140 is a component having high transmittance of visible light. With this configuration, the light emitted by the LED chip 150 passes through the inside of the base platform 140, and is emitted from the second surface (hereinafter also referred to as the back surface) opposite to the first surface. No LED chip 150 is mounted on the back surface. Accordingly, even when the LED chip 150 is mounted only on one side of the base platform, the light is emitted from the other surfaces, allowing achievement of the light distribution property equivalent to that of an incandescent light bulb.

Note that, the base platform 140 does not have to be translucent. In this case, the LED chips 150 may be mounted on the back surface of the base platform 140, for example. The shape of the base platform 140 is an example, and may be in other shape such as a shape of prism.

Power supply terminals 141 are provided on the ends of the two base platforms 140 in the longer direction (X-axis direction). The outer power supply terminals 141 are electrically and physically connected to the lead wire 170 by a joining material such as solder. The inner power supply terminals 141 are electrically connected to each other by an electric wire 244 such as a gold wire.

Note that, it is preferable that the base platform 140 is made of a material having a high thermal conductivity and high thermal emissivity in heat radiation so as to increase heat-radiating property, in the same manner as the embodiment 1. More specifically, the material for the base platform 140 is preferably a material referred to as a hard brittle material, which is a generic term for glass, ceramic, and others.

LED Chip 150

The LED chip 150 is an example of the semiconductor light-emitting device, and is a blue LED which emits blue light when energized in the embodiment 2 as well. The LED chips 150 are mounted on a surface of the base platform 140. More specifically, 5 LED chips 150 are arranged in a straight line between the two power supply terminals 141 in the embodiment 2. The configuration around the LED chips 150 is identical to FIG. 5. Accordingly, the description shall be omitted.

Note that, an example in which the LED chips 150 are mounted on the base platform 140 has been illustrated. However, the number of the LED chips 150 may be changed according to the use of the light bulb shaped lamp 200 in the embodiment 2 as well. For example, as a replacement for a miniature light bulb, one LED chip 150 may be mounted on the base platform 140.

Sealing Material 160

The sealing material 160 is a translucent component, and is formed covering the LED chips 150, in the same manner as the embodiment 1. More specifically, the sealing material 160 is made of translucent resin such as silicone resin in which predetermined phosphor particles which is a wavelength conversion material (not illustrated) and light diffusion material (not illustrated) are included. Note that, the details of the sealing material 160, such as the material, shape, manufacturing method and others are identical to the embodiment 1. Accordingly, the description shall be omitted.

Lead Wire 170

The two lead wires 170 support the LED modules 230 in the same manner as the embodiment 1. The power supplied from the base 190 is supplied to the LED chips 150 through the two lead wires 170. Each of the lead wires 170 is a composite wire including an internal lead wire 171, a Dumet wire (copper-clad nickel steel wire) 172 and an external lead wire 173 joined in this order, and has a strength sufficient to support the LED module 230.

The internal lead wire 171 extends from the stem 120 toward the LED module 230, and has an end bent into L-shape joined to the base platform 140 so as to support the LED module 230. The Dumet wire 172 is sealed in the stem 120. The external lead wire 170 extends from the lighting circuit 180 to the stem 120.

Here, it is preferable that the lead wire 170 is a metal wire including copper having high thermal conductivity, in the same manner as the embodiment 1. Note that, the lead wire 170 does not necessarily have to be a composite wire, and may be a single wire made of the same metal wire. In addition, it is not necessary that the two lead wires 170 are included.

Lighting Circuit 180

The lighting circuit 180 is a circuit for causing the LED chips 150 to emit light, and is housed in the base 190, in the same manner as the embodiment 1. More specifically, the lighting circuit 180 includes a plurality of circuit elements, and a circuit board on which each of the circuit elements is mounted. In this embodiment, the lighting circuit 180 converts the AC power received from the base 190 to the DC power, and supplies the DC power to the LED chips 150 through the two lead wires 170. Note that, the description for the circuit configuration of the lighting circuit 180 shall be omitted, since the circuit configuration is identical to the configuration in FIG. 6.

Note that, it is not necessary for the light bulb shaped lamp 200 to include the lighting circuit 180. For example, the lighting circuit 180 is not necessary for the light bulb shaped lamp 200 when the DC power is directly supplied from a battery cell, or others. In this case, one of the external lead wires 173 is connected to the screw 191, and the other of the external lead wire 173 is connected to the eyelet 192.

Note that, the lighting circuit 180 is not limited to a smoothing circuit, but may be an appropriate combination of light-adjusting circuit, voltage booster, and others.

Base 190

The base 190 is provided at the opening 111 of the globe 110, in the same manner as the embodiment 1. More specifically, the base 190 is attached to the globe 110 using an adhesive such as cement to cover the opening 111 of the globe 110. In this embodiment, the base 190 is an E26 base. The light bulb shaped lamp 200 is attached to a socket for E26 base connected to the commercial AC power source for use.

Note that, the base 190 does not have to be an E26 base, and maybe a base of other size, such as E17. In addition, the base 190 does not have to be a screw base, and may be a base in a different shape such as a plug-in base.

Furthermore, the base 190 is directly attached to the opening 111 of the globe 110. However, the configuration is not limited to this example. The base 190 may be indirectly attached to the globe 110. For example, the base 190 may be attached to the globe 110 through a resin component such as a resin case. The lighting circuit 180 and others may be housed in the resin case, for example.

As described above, according to the light bulb shaped lamp 200 according to the embodiment 2, the stem 120 inserted into the through hole 226a defined by the fixing component 225 can support the fixing component 225 to which the LED modules 230 are fixed. Accordingly, it is possible to suppress the stress exerted on the part connecting the lead wire 170 and the LED module 230 when the light bulb shaped lamp 200 is shaken, for example, and to suppress the possibility that the lead wire 170 is disconnected from the LED module 230. In addition, since the base 190 is provided at the opening 111 of the globe 110 housing the LED module 230 inside, the light generated by the LED chip 150 is not blocked by the case. Accordingly, it is possible to achieve the light distribution property equivalent to that of conventional incandescent light bulbs.

Variation of Embodiment 2

The following shall describe a variation of the light bulb shaped lamp 200 according to the embodiment 2 of the present invention.

Variation 1 of Embodiment 2

First, the variation 1 of the embodiment 2 of the present invention shall be described.

The light bulb shaped lamp according to the variation 1 of the embodiment 2 is different from the light bulb shaped lamp 200 according to the embodiment 2 in the method for electrically connecting the two LED modules 230 and the shape of the end portion of the stem 120. The following shall describe the light bulb shaped lamp according to the variation with reference to the drawings. Note that the illustration and description for the components identical to the light bulb shaped lamp 200 according to the embodiment 2 shall be omitted where appropriate.

Figure 18:
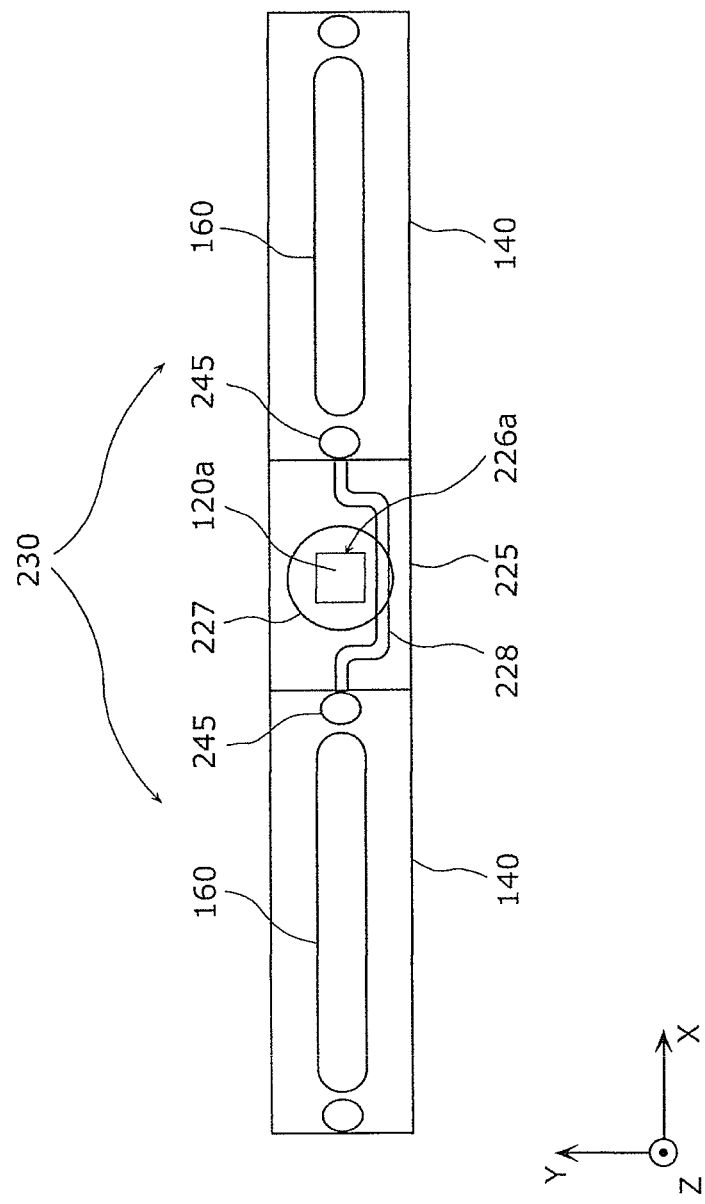
FIG. 18 is a front view of an LED module according to the variation 1 of the embodiment 2 of the present invention.
Figure 19:
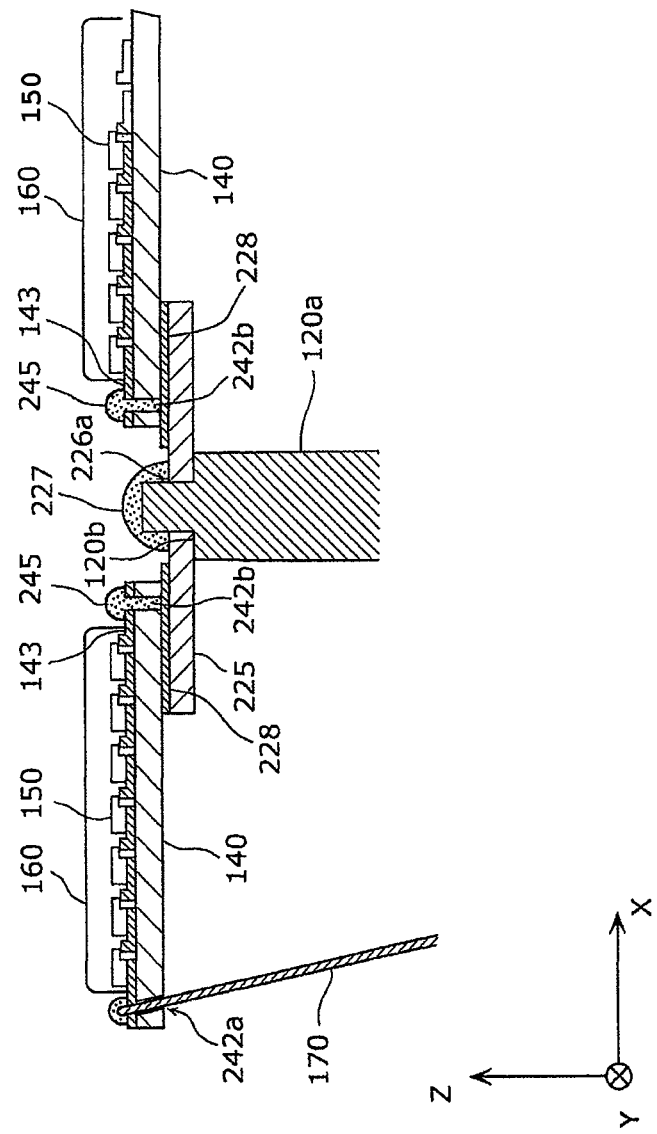
FIG. 19 is a cross-sectional view around an LED module according to the variation 1 of the embodiment 2 of the present invention in Y-axis direction.

FIG. 18 is a plan view of the LED module 230 according to the variation 1 of the embodiment 2 of the present invention. FIG. 19 is a cross-sectional view of a part around the LED module 230 according to the variation 1 of the embodiment 2 of the present invention in the Y-axis direction.

The shape of the end portion of the extended portion 120a of the stem 120 is the projecting shape, in the same manner as the embodiment 2. However, in the variation 1, the cross-section of the end portion of the extended portion 120a is not circular, but in a rectangle shape. As described above, since the cross-section of the end portion of the extended portion 120a is in a polygonal shape, it is possible to suppress the rotation of the LED module 230 around the axis of the extended portion 120a (around the Z-axis).

The fixing component 225 is a translucent board component made of ceramic containing aluminum nitride, defining a rectangular through hole 226a. The metal line pattern 228 is formed on the fixing component 225. The LED chips 150 mounted on the base platform 140 in each of the two LED modules 230 are electrically connected through the metal line pattern 228. The LED modules 230 are electrically connected by the metal line pattern 228 formed on the fixing component 225. Accordingly, it is possible to electrically connect the LED modules 230 in the globe 110 easily.

Note that the line pattern may be formed by a translucent conductive material such as indium tin oxide (ITO), instead of the metal line pattern 228 which does not transmit light. In this case, it is possible to suppress the loss of light emitted by the LED chip 150, compared to the metal line pattern.

The base platform 140 is a translucent board component made of ceramic containing aluminum nitride. Furthermore, the base platform 140 defines through holes 242a and 242b at both ends in the longer direction (X-axis direction).

The through hole 242a corresponds to the third through hole. The metal line pattern 143 is formed around the through hole 242a on the surface of the base platform 140. The lead wire 170 is inserted into the through hole 242a, and is electrically and physically connected to the metal line pattern 143 by the joining material such as solder. Furthermore, the two through holes 242a each formed in the one of the two base platforms 140 have different axial directions.

As described above, the lead wire 170 is inserted into the through hole 242a defined by the base platform 140. Accordingly, it is possible to disperse the stress exerted on the part connecting the lead wire 170 and the LED module 230. Accordingly, it is possible to suppress the possibility that the lead wire 170 is disconnected from the LED module 230 by vibration and others.

The through hole 242b corresponds to the fourth through hole. The metal line pattern 143 is formed around the through hole 242b on the surface of the base platform 140. Furthermore, the conductive component 245 such as solder is filled in the through hole 242b. The metal line pattern 143 on the base platform 140 and the metal line pattern 228 on the fixing component 225 are electrically connected through the conductive component 245.

The LED chips 150 are mounted on a surface of the base platform 140, as illustrated in FIG. 19. Power is supplied to the LED chips 150 through the metal line pattern 143. Note that the line pattern may be formed by a translucent conductive material such as indium tin oxide (ITO), instead of the metal line pattern 143 which does not transmit light.

The LED chip 150 is a semiconductor light-emitting device which emits violet light when energized. The sealing material 160 is a translucent component, and is provided to cover the row of LED chips 150. The sealing material 160 includes blue phosphor, green phosphor, and red phosphor as the wavelength conversion material. Accordingly, the violet light emitted by the LED chip 150 is converted into white light.

As described above, according to the light bulb shaped lamp according to the variation 1, the LED modules 230 are electrically connected by the metal line pattern 228 formed on the fixing component 225. Accordingly, it is possible to electrically connect the LED modules 230 easily in the globe 110.

Variation 2 of Embodiment 2

Next, the variation 2 of the embodiment 2 of the present invention shall be described.

The light bulb shaped lamp according to the variation 2 of the embodiment 2 of the present invention is characterized in that the lead wire 170 is inserted into the through holes 226b and 242b continuously penetrating the fixing component 225 and the base platform 140. The following shall describe the light bulb shaped lamp according to the variation with reference to the drawings. Note that, the illustration and description for the components identical to the light bulb shaped lamp according to the embodiment 1 or the variation 1 of the embodiment 1 shall be omitted where appropriate.

Figure 20:
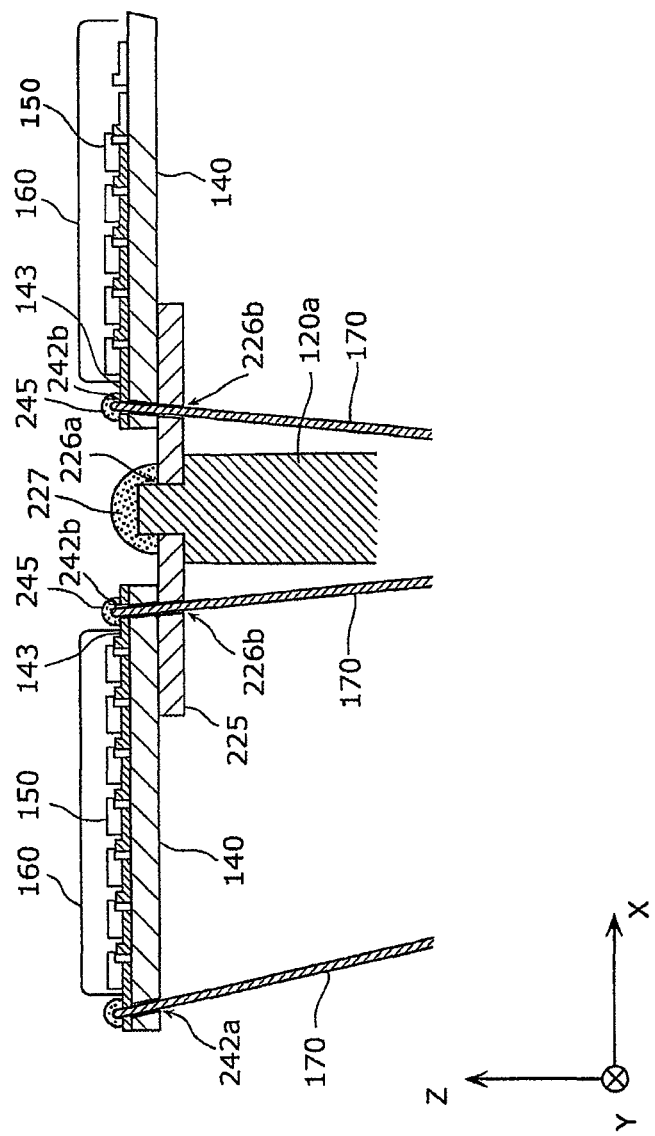
FIG. 20 is a cross-sectional view around an LED module according to the variation 2 of the embodiment 2 of the present invention in Y-axis direction.

FIG. 20 is a cross-sectional view of the LED module 230 according to the variation 2 of the embodiment 2 of the present invention in the Y-axis direction.

The fixing component 225 defines the through hole 226b so as to communicate with the through hole 242b formed in the base platform 140. The through hole 226b corresponds to the second through hole.

Two of the four lead wires 170 are each inserted into the through hole 226b or the through hole 242b. The two lead wires 170 each inserted into the through hole 226b or the through hole 242b are electrically and physically connected to the power supply terminals 141 provided at the base platform 140 by the joining component such as solder.

Note that, the two of the four lead wires 170 are each inserted into the through hole 242a.

As described above, by the light bulb shaped lamp according to the variation, the lead wire 170 is inserted into the through hole 226b and the through hole 242b passing through the fixing component 225 and the base platform 140. Accordingly, the fixing component 225 and the base platform 140 can be fixed firmly.

Variation 3 of Embodiment 2

Next, the variation 3 of the embodiment 2 of the present invention shall be described.

The light bulb shaped lamp according to the variation 3 of the embodiment 2 of the present invention is different from the light bulb shaped lamp according to the variation 2 in the shape of the lead wires 170. The following shall describe the light bulb shaped lamp according to the variation with reference to the drawings. Note that, the illustration and description for the components identical to the light bulb shaped lamp according to the variation 2 shall be omitted where appropriate.

Figure 21:
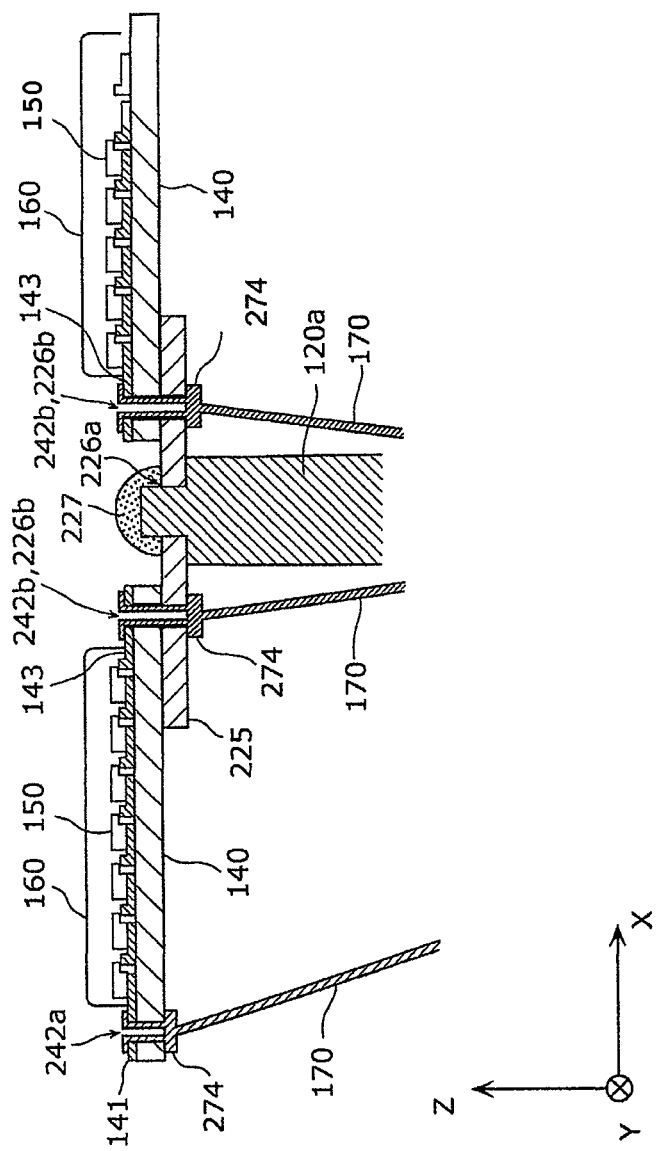
FIG. 21 is a cross-sectional view around an LED module according to the variation 3 of the embodiment 2 of the present invention in Y-axis direction.

FIG. 21 is a cross-sectional view of the LED module 230 according to the variation 3 of the embodiment 2 of the present invention in the Y-axis direction.

A rivet 274 is provided at an end of each of the four lead wires 170. The base platform 140 is fixed to the fixing component 225 by the rivet 274 inserted into the through holes 226b and 242b. Furthermore, the power supply terminal 141 provided on the base platform 140 is electrically and physically connected to the lead wire 170 by the rivet 274 inserted into the through hole 242a.

As described above, with the structure of the light bulb shaped lamp according to the variation, the fixing component 225 and the base platform 140 are fixed by the rivet 274 provided at the end of the lead wire 170. Accordingly, it is possible to fix the fixing component 225 and the base platform even more firmly. Furthermore, the lead wire 170 and the base platform 140 are firmly fixed by the rivet 274. Accordingly, it is possible to suppress the possibility that the lead wire 170 is disconnected from the LED module 230 even more securely.

Variation 4 of Embodiment 2

Next, the variation 4 of the embodiment 2 of the present invention shall be described.

The light bulb shaped lamp according to the variation 4 of the embodiment 2 is different from the light bulb shaped lamp according to the embodiment 2 and the variations 1 to 3 of the embodiment 2 in that four LED modules 230 are included. The following shall describe the light bulb shaped lamp according to the variation with reference to the drawings. Note that, the illustration and description for the components identical to the light bulb shaped lamps according to the embodiment 2 and the variations 1 to 3 of the embodiment 1 shall be omitted where appropriate.

Figure 23:
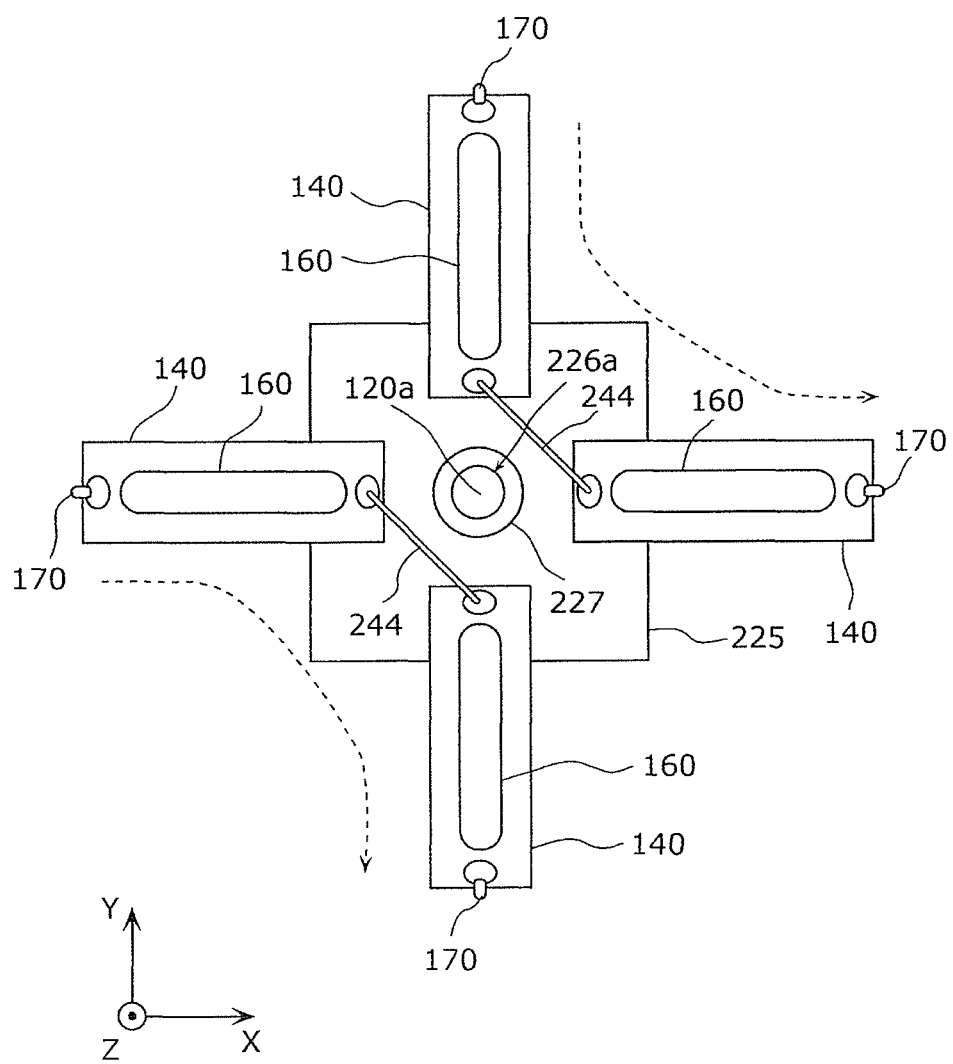
FIG. 23 is a front view of an LED module according to the variation 4 of the embodiment 2 of the present invention.

FIG. 22 is a cross-sectional view of a part around the LED module 230 according to the variation 4 of the embodiment 2 of the present invention. FIG. 23 is a plan view of the LED module 230 according to the variation 4 of the embodiment 2 of the present invention.

The four LED modules 230 are fixed to the fixing component 225 such that the barycenter of the fixing component 225 and the LED modules 230 coincides with the center of the through hole 226a in the longer direction of the stem 120.

To put it differently, in the variation, the through hole 226a is formed at the center of the fixing component 225, and the four LED modules 230 are identical. Accordingly, the four LED modules 230 are provided such that the four LED modules 230 are symmetric with respect to the center axis of the through hole 226a or the extended portion 120a of the stem 120.

The two LED modules 230 are electrically connected to each other through the electric wire 244, and current flows as illustrated in the arrow in the broken line when the light bulb shaped lamp 200 is turned on.

As described above, according to the light bulb shaped lamp according to the variation, it is possible to hold the four LED modules 230 at a constant position in the globe 110.

Another Aspect of Variation 4 of Embodiment 2

Next, another aspect of the variation 4 of the embodiment 2 of the present invention shall be described.

The light bulb shaped lamp according to the variation 4 of the embodiment 2 of the present invention is different from the light bulb shaped lamp according to the variation 4 in the shape of the fixing component 225. The following shall describe the light bulb shaped lamp according to the variation with reference to the drawings. Note that, the illustration and description for the components identical to the light bulb shaped lamp according to the variation 4 shall be omitted where appropriate.

Figure 24:
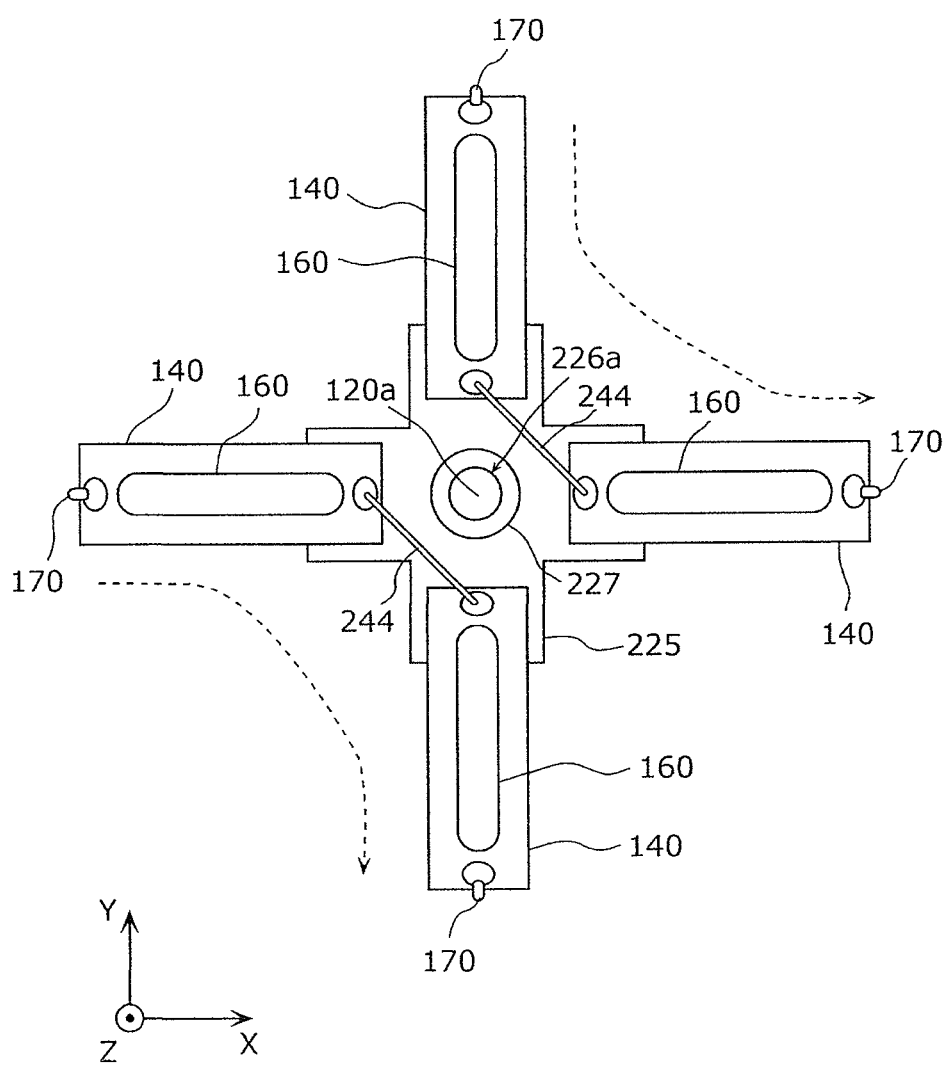
FIG. 24 is a front view of an LED module according to another aspect of the variation 4 of the embodiment 2 of the present invention.

FIG. 24 is a plan view of the LED module 230 according to another aspect of the variation 4 of the embodiment 2 of the present invention.

As illustrated in FIG. 24, the fixing component 225 has a cross shape in plan view. The four LED modules 230 are fixed to the fixing component 225 such that the longer direction of the LED modules 230 coincides with the two axial directions of the cross shape (X-axis direction and Y-axis direction).

As described above, compared to the fixing component 225 in the variation 4 illustrated in FIG. 23, it is possible to reduce the size of the fixing component 225 according to the variation illustrated in FIG. 24. Accordingly, it is possible to reduce the possibility that the light is blocked by the fixing component 225.

The light bulb shaped lamp according to an aspect of the present invention has been described based on the embodiment and the variations. However, the present invention is not limited to the embodiments.

For example, in the embodiment, the light bulb shaped lamp 200 receives AC power from a commercial AC power source. However, the light bulb shaped lamp 200 may receive DC power from a battery cell or others, for example. In this case, the light bulb shaped lamp 200 does not have to include the lighting circuit 180 illustrated in FIG. 6.

In addition, it is not necessary for the stem 120 to have a configuration illustrated in the embodiment above. For example, the stem 120 may be a rod-shaped component as illustrated in FIG. 25.

Figure 25:
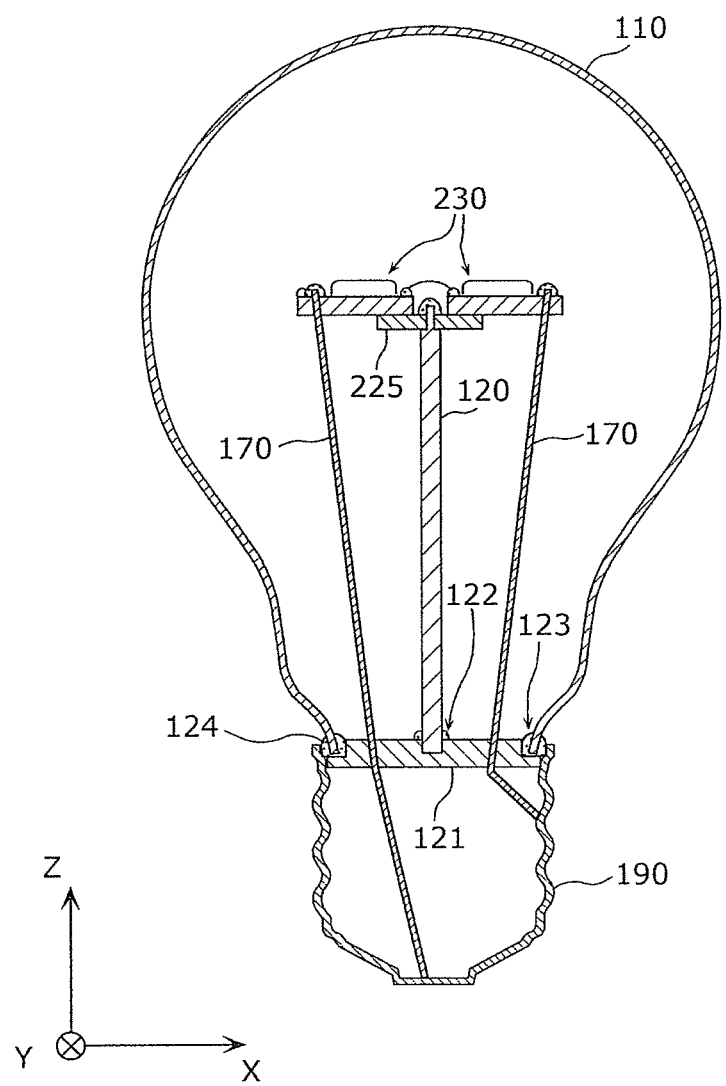
FIG. 25 is a cross-sectional view of a light bulb shaped lamp according to the variation 5 of the embodiment 2 of the present invention.

FIG. 25 is a cross-sectional view of the light bulb shaped lamp according to the variation 5 of the embodiment 2 of the present invention. In FIG. 25, the stem 120 is a rod-shaped component made of metal, ceramic, or glass. One end of the stem 120 is inserted into a hole 122 defined by a surface of a circular board component 121 closing the opening 111 of the globe 110, and fixed by using adhesive made of silicone resin or others. The other end of the stem 120 is inserted into the through hole 226a defined by the fixing component 225.

The board component 121 is fit into the opening of the base 190, and a cutout 123 is provided at the periphery of the board component 121. The opening 111 of the globe 100 is inserted into a groove defined by the cutout 123 and the base 190, and the globe 110 is fixed by the adhesive 124 made of silicone resin or others. In addition, the board component 121 defines a through hole. Each of the lead wires 170 is also inserted into through hole defined by the board component 121, and is fixed to the board component 121.

As described above, even if the stem 120 has the configuration illustrated as in FIG. 25, it is possible to support the fixing component 225 to which the LED module 230 is fixed in the globe 110. Accordingly, it is possible to suppress the stress exerted on the part connecting the lead wire 170 and the LED module 230 when the light bulb shaped lamp 200 is shaken, for example, and to suppress the possibility that the lead wire 170 is disconnected from the LED module 230.

Furthermore, the present invention may not only be implemented as the light bulb shaped lamp, but also as a lighting apparatus including the light bulb shaped lamp. The following shall describe the lighting apparatus according to an aspect of the present invention with reference to FIG. 26.

Figure 26:
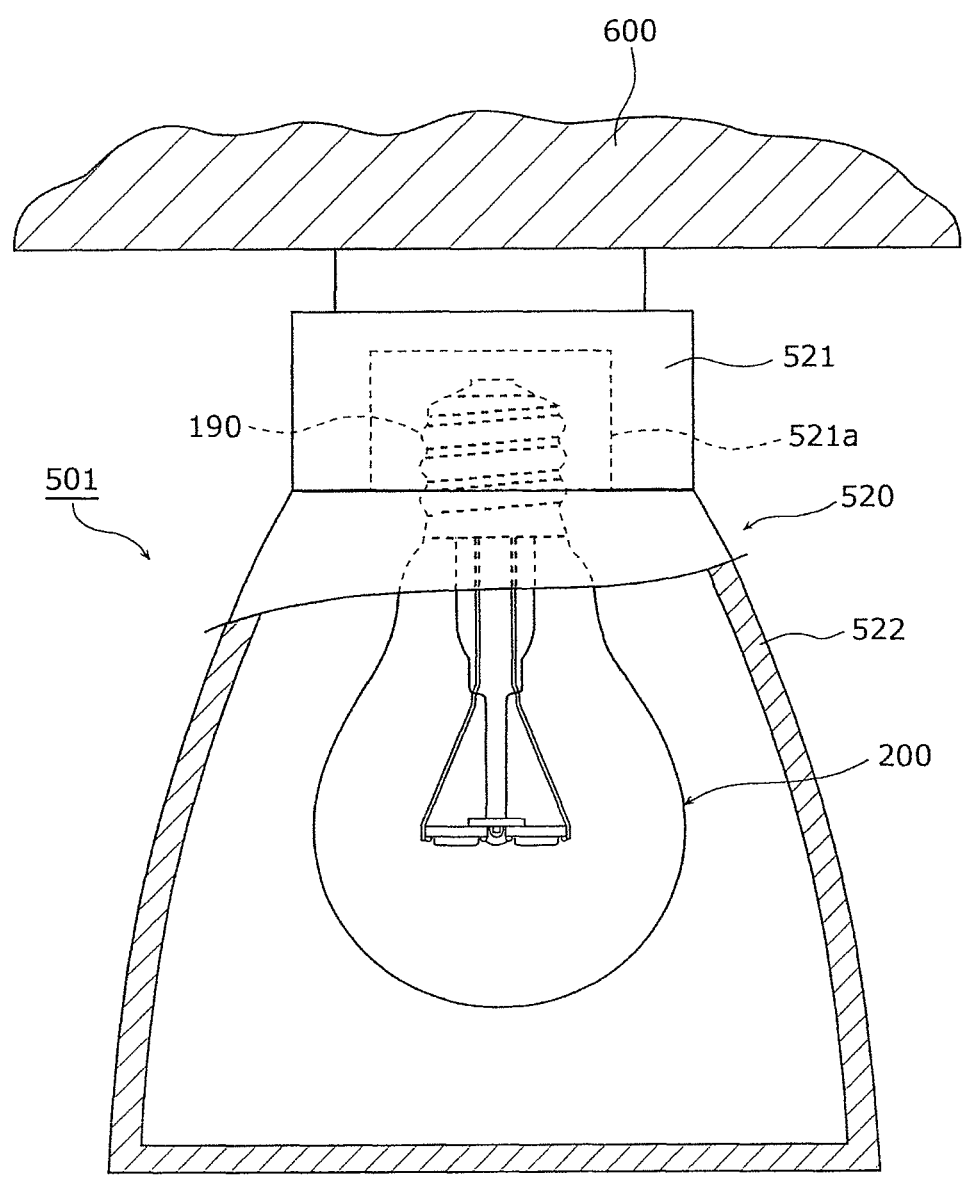
FIG. 26 is a schematic cross-sectional view of a lighting apparatus using the light bulb shaped lamp according to the embodiment 2 of the present invention.

FIG. 26 is a schematic cross-sectional view of the lighting apparatus 501 according to the embodiment 2 of the present invention.

The lighting apparatus 501 is used attached to a ceiling 600 in a room, for example, and includes the light bulb shaped lamp 200 according to the embodiment and a lighting equipment 520 as illustrated in FIG. 26.

The lighting equipment 520 is for turning the light bulb shaped lamp 200 on and off, and includes an equipment body 522 attached to the ceiling 600 and a lamp cover 522 covering the light bulb shaped lamp 200.

The equipment body 521 includes a socket 521a. A base 190 of the light bulb shaped lamp 200 is screwed into the socket 521a. Power is supplied to the light bulb shaped lamp 200 through the socket 521a.

Note that the lighting apparatus 501 described here is an example of the lighting apparatus according to an aspect of the present invention. The lighting apparatus according to an aspect of the present invention may include at least a socket for holding the light bulb shaped lamp 200 and supplying power to the light bulb shaped lamp 200. Note that, the base 190 does not have to be screwed into the base 190, but may be simply inserted.

Furthermore, the lighting apparatus 501 illustrated in FIG. 26 includes one light bulb shaped lamp 200. However, the lighting apparatus 501 may include more than one light bulb shaped lamp 200.

Embodiment 3

Next, a light bulb shaped lamp 300 according to the embodiment 3 of the present invention shall be described with reference to the drawings.

Overall Configuration of Light Bulb Shaped Lamp 300

First, the overall configuration of the light bulb shaped lamp 300 according to the embodiment 3 shall be described with reference to FIG. 27 to FIG. 29.

Figure 27:
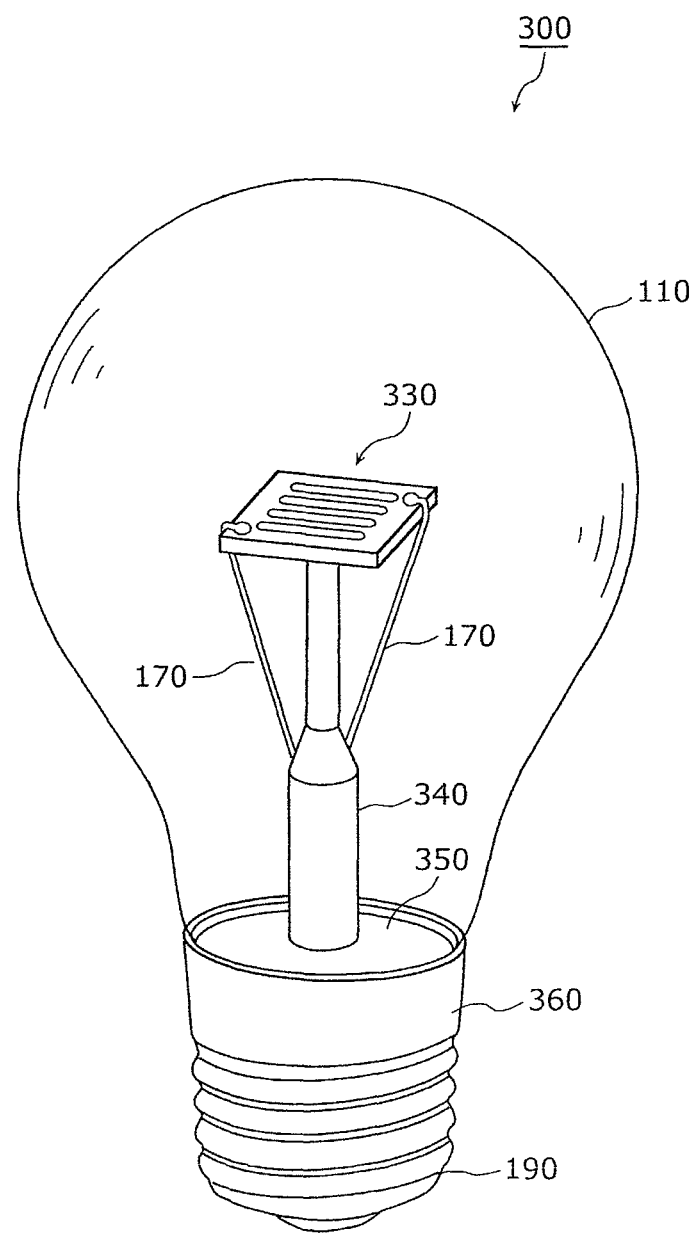
FIG. 27 is a perspective view of a light bulb shaped lamp according to the embodiment 3 of the present invention.

FIG. 27 is a perspective view of the light bulb shaped lamp according to the embodiment 3 of the present invention. FIG. 28 is an exploded perspective view of the light bulb shaped lamp according to the embodiment 3 of the present invention. FIG. 29 is a cross-sectional view of the light bulb shaped lamp according to the embodiment 3 of the present invention.

Figure 28:
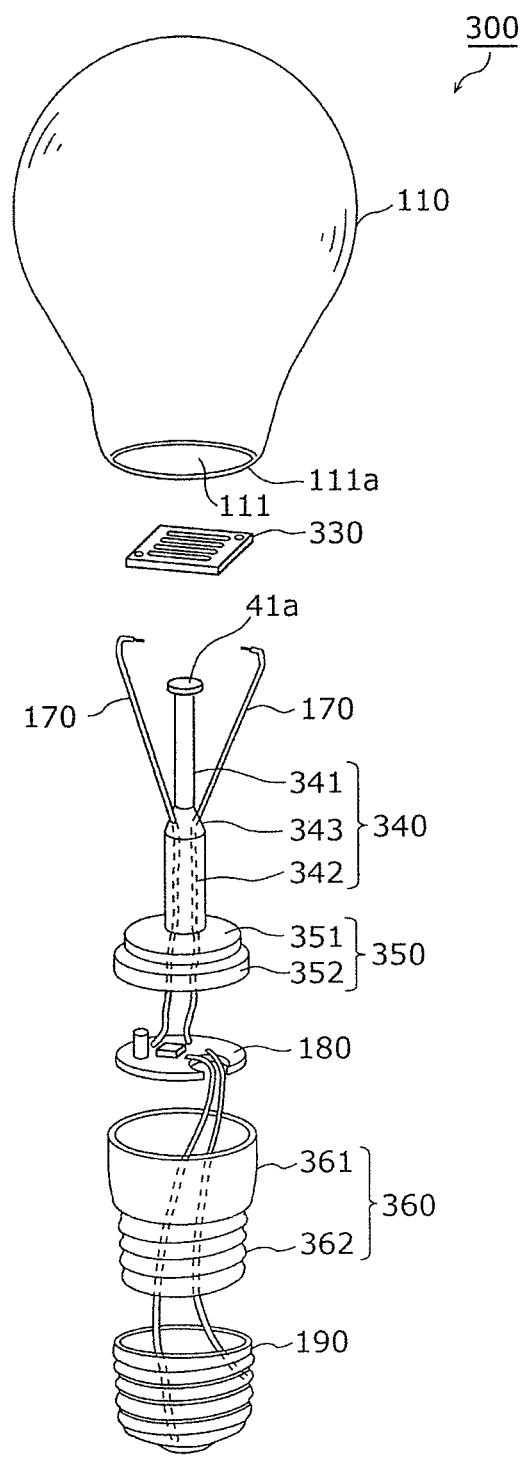
FIG. 28 is an exploded perspective view of a light bulb shaped lamp according to the embodiment 3 of the present invention.
Figure 29:
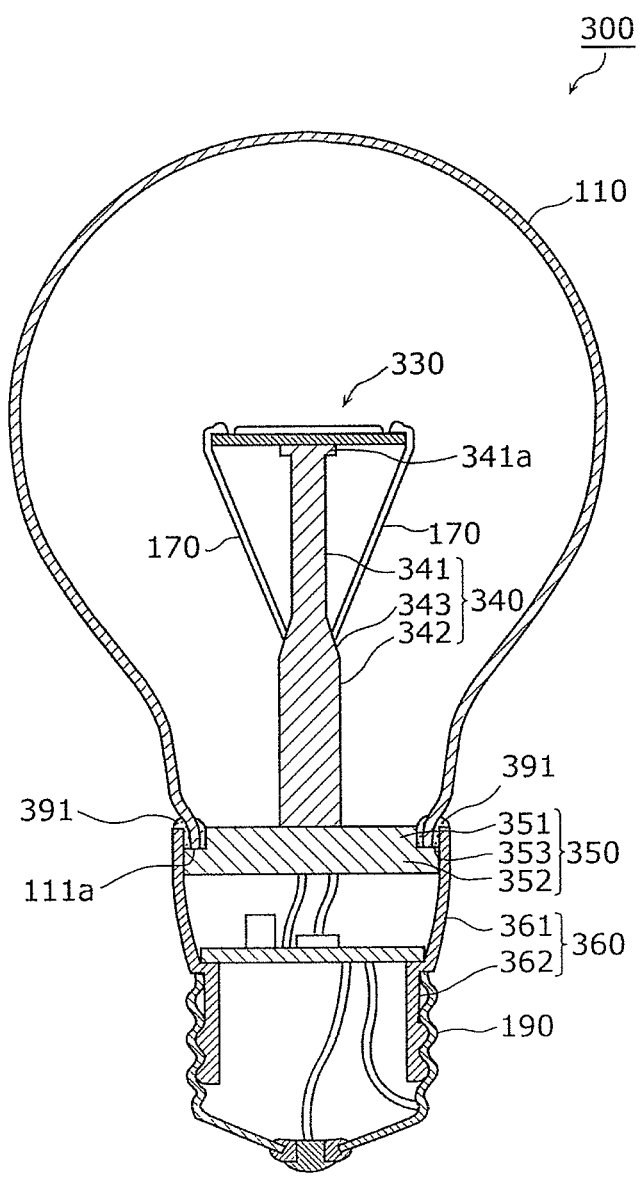
FIG. 29 is a cross-sectional view of a light bulb shaped lamp according to the embodiment 3 of the present invention.

As illustrated in FIG. 27 to FIG. 29, the light bulb shaped lamp 300 according to the embodiment 3 is a light bulb shaped LED lamp replacing an incandescent electric bulb, and includes a translucent globe 110, an LED module 330 which is a light source, a base 190 which receives power, and a stem 340. The light bulb shaped lamp 300 according to the embodiment 3 further includes a supporting component 350, a resin case 360, a lead wire 170, and a lighting circuit 180. In the embodiment 3, the light bulb shaped lamp 300 has an envelope composed of the globe 110, the resin case 360, and the base 190.

The following shall describe components of the light bulb shaped lamp 300 according to the embodiment 3 of the present invention with reference to FIG. 27 to FIG. 29.

Globe 110

As illustrated in FIG. 27 to FIG. 29, the globe 110 is a translucent component housing an LED module 330 and transmits the light emitted by the LED module 330 to outside of the lamp, in the same manner as the embodiment 1. In the embodiment 3, the globe 110 is a hollow component made of silica glass transparent to visible light as well. Accordingly, the LED module 330 housed in the globe 110 is visible from outside of the globe 110. In the embodiment 3, the shape of the globe 110 is Type A (JIS C7710) which is the same as a common incandescent light bulb, that is, the globe 110 has a shape with one end closed in a spherical shape, and the other end has an opening 111 as well.

LED Module 330

The LED module 330 corresponds to a light-emitting module which is a light source of the light bulb shaped lamp 400, and is provided in the globe 110. It is preferable that the LED module 330 is positioned at the center of the spherical shape formed by the globe 110 (for example, inside a large diameter part at which the inner diameter of the globe 110 is large). With the LED module 330 positioned at the center, the light bulb shaped lamp 300 can achieve omnidirectional light distribution property when the light bulb shaped lamp 100 is switched on. The omnidirectional light distribution property is approximated to a common incandescent light bulb using conventional filament coil.

In addition, the LED module 330 is supported by the two lead wires 170 such that the LED module 330 is suspended in the globe 110 (in the large diameter part of the globe 110 in the embodiment 3) and supplied with power from the lead wires 170. The LED module 330 emits light with the power supplied from the two lead wires 170. Note that, power supply terminals are provided at the both ends of the LED module 320, and the power supply terminal and the lead wire are electrically connected by solder or others.

Figure 30:
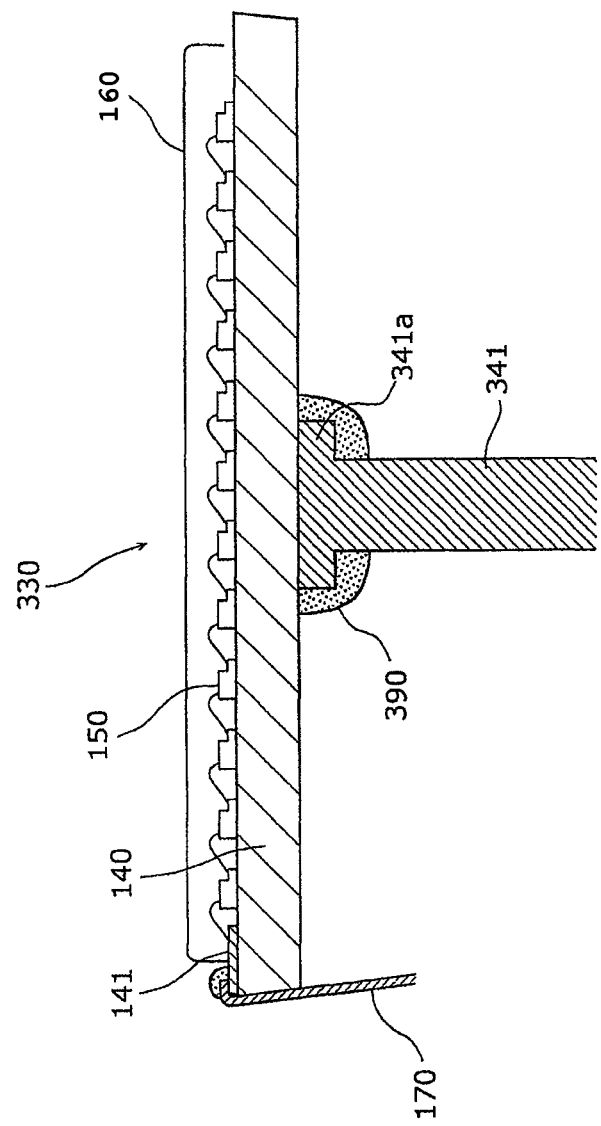
FIG. 30 is an enlarged perspective view of a major part of an LED module and a stem in a light bulb shaped lamp according to the embodiment 3 of the present invention.

Next, the components of the LED module 330 according to the embodiment 3 of the present invention shall be described with reference to FIG. 30. FIG. 30 is an enlarged cross-sectional view of a major part of the LED module in the light bulb shaped lamp according to the embodiment 3 of the present invention.

As illustrated in FIG. 30, the LED module 330 is a COB light-emitting module in which the LED chips are directly mounted on the substrate, and includes the base platform 140, the LED chips 150, and the sealing material 160, in the same manner as the embodiment 1. The LED module 330 is arranged such that the surface on which the LED chips 150 are mounted facing the top of the globe 110. The following shall describe components of the LED module 330 in detail.

Base Platform 140

First, the base platform 140 shall be described. Furthermore, the base platform 140 is directly fixed to the stem 340. With this structure, the LED module 330 is directly fixed to the stem 340. In the embodiment 3, the base platform 140 is an LED mounting component for mounting the LED chip 150, and is a component translucent to visible light. In the embodiment 3, a translucent alumina substrate having a transmittance of 96% and a rectangle shape with 22 mm in length, 18 mm in width, and 1.0 mm in thickness is used.

It is preferable that the base platform 140 is a component having high transmittance of visible light. With this, the light emitted from the LED chip 150 passes through the inside of the base platform 140, and the light is emitted from a part on which no LED chip 150 is mounted. Accordingly, even when the LED chips 150 are mounted only on one surface of the base platform 140 (front surface), the light bulb shaped lamp 300 can achieve omnidirectional light distribution property because the light is emitted from the other surface (back surface). The omnidirectional light distribution property is approximated to an incandescent light bulb. Note that, the base platform 140 does not have to be translucent. Alternatively, the LED chips 150 may be mounted on more than one surface of the base platform 140.

Note that, it is preferable that the base platform 140 is made of a material having a high thermal conductivity and high thermal emissivity in heat radiation so as to increase heat-radiating property, in the same manner as the embodiment 1. More specifically, the material for the base platform 140 is preferably a material referred to as a hard brittle material, which is a generic term for glass, ceramic, and others.

LED Chip 150

Next, the LED chip 150 shall be described. The LED chip 150 is an example of the semiconductor light-emitting element, and is a bare chip which emits visible light in one color. In this embodiment, a blue LED chip which emits blue light when energized is used as well. The LED chips 150 are mounted on one side of the base platform 140. In this embodiment, one row consists of 12 LED chips 150, and the LED chips 150 are mounted in four rows in straight lines. The configuration around the LED chips 150 is identical to FIG. 5. Accordingly, the description shall be omitted.

Note that, an example in which the LED chips 150 are mounted on the base platform 140 has been illustrated. However, the number of the LED chips 150 may be changed according to the use of the light bulb shaped lamp 300 in the embodiment 3 as well. For example, as a replacement for a miniature light bulb, one LED chip 150 may be mounted on the base platform 140. In addition, although the LED chips 150 are mounted on the base platform 140 in four rows in the embodiment 3. However, the LED chips 150 may be mounted in one row, or multiple rows other than four rows.

Sealing Material 160

Next, the sealing material 160 shall be described. The sealing material 160 is formed in a straight line (stripe) covering the LED chips 150, in the same manner as the embodiment 1. In this embodiment, four lines of the sealing material 160 are formed. The sealing material 160 includes a phosphor which is a material for converting wavelength of light, and also serves as a wavelength conversion layer which converts the wavelength of light emitted from the LED chip 150. A silicone resin in which predetermined phosphor particles (not illustrated) and light diffusion material (not illustrated) are dispersed may be used as the sealing material 160. Note that, the details of the sealing material 160, such as the material, shape, manufacturing method and others are identical to the embodiment 1. Accordingly, the description shall be omitted.

Power Supply Terminal 141

Next, the power supply terminal 141 shall be described. The power supply terminal 141 is formed at an end portion of the diagonal part of the base platform 140. The two lead wires 170 have ends bent in L-shape, and are electrically and physically connected to the power supply terminals 141 by solder, respectively.

Note that, although not illustrated, the metal line pattern is formed on the surface of the base platform 140 where the LEDs are mounted, and each of the LED chips 150 is electrically connected to the metal line pattern through the wire or others. Power is supplied to the LED chip 150 through the metal line pattern. Note that the line pattern may be formed by a translucent conductive material such as indium tin oxide (ITO), instead of the metal line pattern which does not transmit light.

Base 190

As illustrated in FIG. 28 and FIG. 29, the base 190 is a power receiving part for receiving power causing the LED chips 150 in the LED module 330 to emit light, and receives AC power from two contacts in the same manner as the embodiment 1 as well. The power received by the base 190 is provided to the power input unit in the lighting circuit 180 through the lead wire.

The base 190 is in the type E, and a screw for screwing into a socket in a lighting apparatus is provided at its outer circumferential surface. Furthermore, the screw for screwing into the resin case 360 is formed on the inner circumferential surface of the base 190. Note that, the base 190 is a metal tube having a bottom.

In this embodiment, the base 190 is an E26 base. The light bulb shaped lamp 300 is attached to a socket for E26 base connected to the commercial AC power source for use.

Note that, the base 190 does not have to be an E26 base, and maybe a base of other size, such as E17. In addition, the base 190 does not have to be a screw base, and may be a base in a different shape such as a plug-in base.

Stem 340

As illustrated in FIG. 28 and FIG. 29, the stem 340 is provided extending from the periphery of the opening 111 of the globe 110 toward the globe 110. The stem 340 has a rod shape, and has one end configured to be connected to the LED module 330 and the other end configured to be connected to the supporting component 350.

The stem 340 is configured of a material having a thermal conductivity larger than the thermal conductivity of the base platform 140 in the LED module 330. Furthermore, it is preferable for the stem 340 to be made of a material having a thermal conductivity larger than the thermal conductivity of glass (approximately 1.0 [W/m·K]), and may be composed of an inorganic material such as metal material or ceramics, for example. In the embodiment 3, the stem 340 is composed of aluminum having the thermal conductivity of 237 [W/m·K].

As described above, the stem 340 is composed of a material having a thermal conductivity greater than the thermal conductivity of the base platform 140. Accordingly, the heat from the LED module 330 is efficiently conducted to the stem 340 through the base platform 140. With this, the heat from the LED module 330 can be transferred toward the base 190. As a result, it is possible to suppress the reduction in the light-emission efficacy and in the life of the LED chips 150 due to the increase in temperature.

In the embodiment 3, the stem 340 includes a first stem part 341 to be connected to the LED module 330, a second stem part 342 connected to the supporting component 350, and an intermediate stem part 343 between the first stem part 341 and the second stem part 342. The first stem part 341, the second stem part 342, and the intermediate stem part 343 are integrally formed. As described above, the stem 340 according to the embodiment 3 is configured to have a substantially same shape as the stem used for a common incandescent light bulb.

The first stem part 341 is in a cylindrical shape, and has a base platform connecting part 341a to be connected to the base platform 140 in the LED module 330. The base platform connecting part 341a is in a disc shape, and the diameter of the base platform connecting part 341a is configured to the larger than the diameter of the main body of the first stem part 341.

The second stem part 342 is in a shape of disc, and is fixed to the supporting component 350. With this, the stem 340 is fixed to the supporting component 350 and supported by the supporting component 350. Furthermore, the diameter of the second stem part 342 is configured to be larger than the diameter of the first stem part 341.

The intermediate stem part 343 has a small conical trapezoid shape having a diameter on the side of the first stem part 341 smaller than the diameter on the side of the second stem part 342 and two through holes for the lead wires 170 to pass through are formed. The lead wire 170 is provided through the through hole in the intermediate stem part 343, and is connected to the lighting circuit 180 through the intermediate stem part 343 and the second stem part 342. Furthermore, in the embodiment 3, the lead wire 170 is configured to contact the intermediate stem part 343 and the second stem part 342. With this, the heat from the lead wire 170 can be conducted to the stem 340.

Furthermore, the intermediate stem part 343 has a tilted surface composed of the surface of the conical trapezoidal shape. The tilted surface is a reflection surface which reflects the light from the LED module 330 travelling toward the stem 340 (toward the base 190). Stated differently, the tilted surface reflects the light transmitted the base platform 140 and emitted from the back surface side of the base platform 140. With this, the light travelling toward the base 190 may be reflected on a side opposite to the base 190 or toward the side surface of the lamp, and changes the tilt angle of the tilted surface appropriately so as to adjust the light distribution in a predetermined way for the light reflected on the tilted surface. Note that, the reflection surface may be composed by painting the tilt surface white. Alternatively, the reflection surface may be formed using a mirror finish by polishing the surface or others. Furthermore, by tilting the surface of the supporting member 350 toward the stem 340 or using a finish achieved by polishing the surface, it is possible to use the supporting component 350 as a reflection surface so as to control the light distribution in a predetermined manner.

As illustrated in FIG. 30, the base platform 140 in the LED module 330 abuts and is fixed to the base platform connecting part 341a in the first stem part 341. More specifically, the LED module 330 is supported by the stem 340.

Furthermore, in the embodiment 3, adhesive material 390 is applied to the back surface of the base platform 140 so as to cover the base platform connecting part 341a. With this, the first stem part 341 and the base platform 140 are fixed by the adhesive material 390. As described above, the base platform 140 and the first stem part 341 are fixed by the adhesive material 390. Accordingly, the LED module 330 is firmly fixed and held by the stem 340. Note that, the base platform 140 contacts the stem 340 in FIG. 30. However, the adhesive material 390 may be applied between the base platform 140 and the stem 340 as in the embodiment 1.

As the adhesive material 390, an adhesive made of silicone resin may be used, for example. However, an adhesive having a high thermal conductivity is preferably used for efficiently conducting the heat from the LED module 330 to the stem 340. For example, the thermal conductivity can be increased by dispersing metal particles in the silicone resin or others. Note that, the adhesive material 390 may not be composed entirely of adhesive only. For example, an adhesive material in a sheet shape on which the adhesive is applied on both surfaces is used, and the adhesive material may be provided between the base platform connecting part 341a in the first stem part 341 and the back surface of the base platform 140.

Note that, as illustrated in FIG. 29, the stem 340 in the embodiment 3 has a solid structure in which the material is filled other than the insertion holes for the lead wires 170. However, the stem 340 may have a hollow structure having a constant thickness.

Supporting Component 350

As illustrated in FIG. 28 and FIG. 29, the supporting component 350 is a component connected to the opening end 111a of the opening 111 in the globe 110, and supports the stem 340. Furthermore, the supporting component 350 is configured to close the opening 111 of the globe 110. In the embodiment 3, the supporting component 350 is fit into the resin case 360 and fixed.

The stem 340 is configured of a material having a thermal conductivity larger than the thermal conductivity of the base platform 140 in the LED module 330. Furthermore, it is preferable that the supporting component 350 is made of a material having a thermal conductivity larger than the thermal conductivity of glass. For example, the supporting component 350 may be made of a metal As described above, the supporting component 350 is made of a material having a high thermal conductivity. Accordingly, the heat from the LED module 330 thermally conducted to the stem 340 is efficiently conducted to the supporting component 350. As a result, it is possible to suppress the reduction in the light-emission efficacy and in the life of the LED chips 150 due to the increase in temperature.

Furthermore, in the embodiment 3, the supporting component 350 is made of a disc-shaped board component, and includes a first supporting part 351 and a second supporting part 352. In the supporting component 350, the diameter of the second supporting part 352 is configured to be larger than the diameter of the first supporting part 351. With this, a stepped part 353 is formed between the periphery of the first supporting part 351 and the periphery of the second supporting part 352. Note that, the first supporting part 351 and the second supporting part 352 are collectively formed.

The second stem part 342 in the stem 340 is fixed to the first supporting part 351. Furthermore, the inner surface of the resin case 360 abuts the side surface of the second supporting part 352. The opening end 111a of the opening 111 in the globe 110 abuts the stepped part 353. Accordingly, the opening 111 in the globe 110 is closed by the second supporting part 352. Furthermore, in the stepped part 353, the supporting component 350, the resin case 360, and the opening end 111a of the opening 111 in the globe 110 are fixed by the adhesive material 391. The adhesive material 391 is formed filling the stepped part 353.

As described above, the supporting component 350 is connected to the globe 110. Accordingly, the heat from the LED module 330 conducted to the supporting component 350 is thermally conducted to the globe 110 composing the envelope, and is dissipated to the air from the outer surface of the globe 110.

Furthermore, the supporting component 350 is connected to the resin case 360 as well. Accordingly, the heat from the LED module 330 conducted to the supporting component 350 is thermally conducted to the resin case 360, and dissipated to the air from the outer surface of the resin case 360 composing the envelope.

Note that, when the globe 110 is made of glass as in the embodiment 3, the thermal conductivity of the globe 110 is higher than the thermal conductivity of the resin case 360. In this case, the path for dissipating the heat generated at the LED module 330 is dominantly the former heat dissipating path (from the stem 340 to the supporting component 350 to the globe 110) which is the heat dissipated from the globe 110. Accordingly, in this case, the area of globe contacting the outside air is large, which makes the dissipation even more effective.

Furthermore, as the adhesive material 391 for fixing the globe 110 and others, the adhesive made of silicone resin may be used, for example. However, it is preferable to use an adhesive material having a high thermal conductivity such that the heat from the LED module 330 is efficiently conducted from the supporting component 350 to the globe 110 and the resin case 360. For example, the thermal conductivity can be increased by dispersing metal particles in the silicone resin or others.

Resin Case 360

As illustrated in FIG. 28 and FIG. 29, the resin case 360 is an insulating case for insulating the stem 340 and the base 190 and for housing the lighting circuit 180. The resin case 360 is composed of a cylindrical first case part 361 and a cylindrical second case part 362.

The inner diameter of the first case part 361 is substantially the same as the outer diameter of the second supporting part 352 in the supporting component 350, and the supporting component 350 is fit into the first case part 361 and fixed. The outer surface of the first case part 361 is exposed to the outer air. Accordingly, the heat conducted to the resin case 360 is mostly dissipated from the first case part 361.

The second case part 362 is configured such that the outer circumferential surface contacts the inner circumferential surface of the base 190. In the embodiment 3, a screw part for screwing into the base 190 is formed on the outer circumferential surface of the second case part 362, and the second case part 362 contacts the base 190 via the screw part. Accordingly, the heat conducted to the resin case 360 is conducted to the base 190 through the second case part 362, and is dissipated from the outer surface of the base 190.

In the embodiment 3, the first case part 361 and the second case part 362 are collectively formed by the injection molding. The resin case 360 is made of polybutylene terephthalate (PBT) containing 5 to 15% of glass fiber and having a thermal conductivity of 0.35 [W/m·K].

Lead Wire 170

The two lead wires 170 are electric wires for holding and power supply, and hold the LED module 330 in a constant position in the globe 110, and supplies power supplied from the base 190 to the LED chip 150.

One of the ends of each of the lead wires 170 is connected to the power supply terminal 141 in the LED module 330 by solder, and is electrically connected to the power supply terminal 141. The other end of each of the lead wires 170 is electrically connected to the power output unit of the lighting circuit 180. Furthermore, each of the lead wires 170 is configured to pass through the stem 340 and is in contact with the stem 340.

Here, it is preferable that the lead wire 170 is a metal wire including copper having high thermal conductivity. With this, the heat generated at the LED module 330 can be thermally conducted to the stem 340 through the lead wire 170.

In addition, it is necessary for the lead wire 170 to be attached to the base platform 140 as if pressing the base platform 140 toward the stem 340. With this, the base platform 140 can be fixed and held by the stem 340 even more firmly.

Lighting Circuit 180

As illustrated in FIG. 28 and FIG. 29, the lighting circuit 180 is a circuit for causing the LED chip 150 to emit light, and is housed in the resin case 360 in the embodiment 3. More specifically, the lighting circuit 180 includes a plurality of circuit elements, and a circuit board on which each of the circuit elements is mounted. In this embodiment, the lighting circuit 180 converts the AC power received from the base 190 to the DC power, and supplies the DC power to the LED chips 150 through the two lead wires 170. Note that, the description for the circuit configuration of the lighting circuit 180 shall be omitted, since the circuit configuration is identical to the configuration in FIG. 6.

Note that, it is not necessary for the light bulb shaped lamp 300 to include the lighting circuit 180. For example, the lighting circuit 180 is not necessary for the light bulb shaped lamp 300 when the DC power is directly supplied from lighting equipment, a battery cell, or others. In the embodiment 3, the lighting circuit 180 is not limited to a smoothing circuit, but may be an appropriate combination of selected light-adjusting circuit, voltage booster, and others.

According to the light bulb shaped lamp 300 according to the embodiment 3 described above, the LED module 330 is provided in the globe 110 in the same manner as an incandescent light bulb, and thus the light emitted by the LED module 330 is not blocked by a metal case. Accordingly, it is possible to achieve the light distribution characteristics identical to the conventional incandescent light bulbs.

Furthermore, according to the light bulb shaped lamp 300 according to the embodiment 3, the base platform 140 in the LED module 330 is connected to the stem 340 having a thermal conductivity higher than the thermal conductivity of the base platform 140. Accordingly, the heat generated at the LED chip 150 in the LED module 330 is efficiently conducted to the stem 340. Accordingly, the heat at the LED module 330 can be efficiently dissipated.

Furthermore, in the embodiment 3, the stem 340 is supported by the supporting component 350 having a high thermal conductivity. Accordingly, the heat generated at the LED module 330 thermally conducted to the stem 340 is efficiently conducted to the supporting component 350. The supporting component 350 is connected to the globe 110 and the resin case 360 composing the envelope. Accordingly, the heat conducted to the supporting component 350 is dissipated to the air through the globe 110 and the resin case 360. As described above, by providing the supporting component 350, it is possible to further improve the heat radiation property of the LED module 330.

Variation of Embodiment 3

Next, a variation of the light bulb shaped lamp 300 according to the embodiment 3 of the present invention shall be described with reference to the drawings.

Variation 1 of Embodiment 3

Figure 31A:
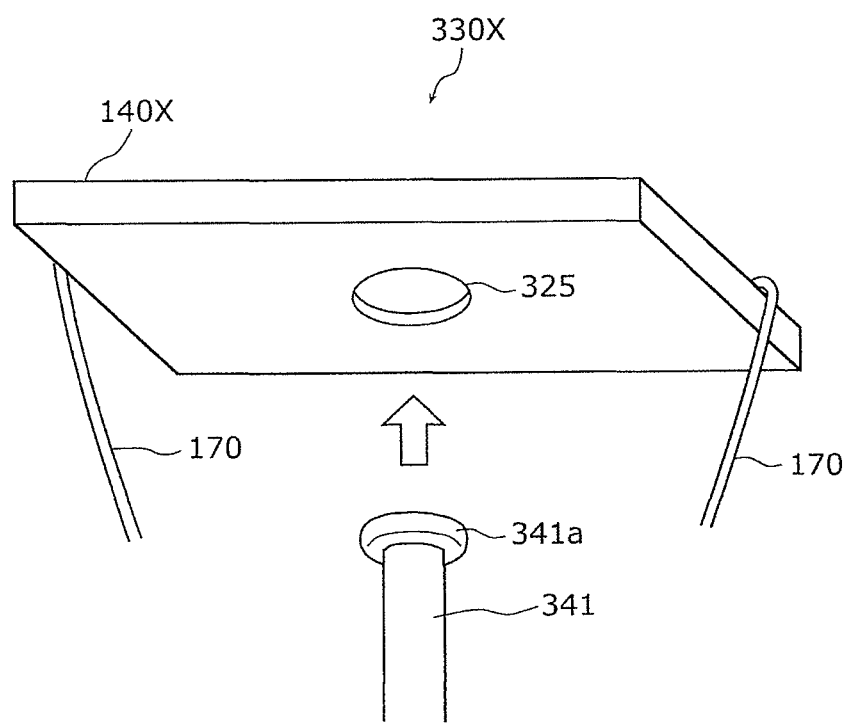
FIG. 31A is a perspective view of an LED module and a stem in a light bulb shaped lamp according to the variation 1 of the embodiment 3 of the present invention from below.
Figure 31B:
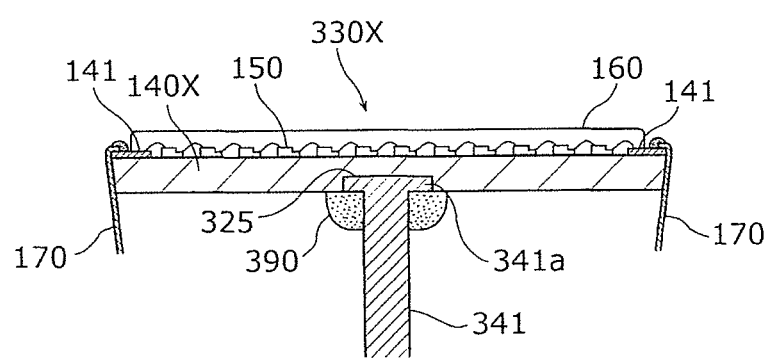
FIG. 31B is a cross-sectional view of an LED module and a stem in a light bulb shaped lamp according to the variation 1 of the embodiment 3 of the present invention.

First, the variation 1 of the embodiment 3 of the present invention shall be described with reference to FIG. 31A and FIG. 31B. FIG. 31A is a perspective view of an LED module and a stem in a light bulb shaped lamp according to the variation 1 of the embodiment 3 of the present invention from below. FIG. 31B is a cross-sectional view of the LED module and the stem in the light bulb shaped lamp.

The light bulb shaped lamp according to the variation 1 of the embodiment 3 of the present invention illustrated in FIG. 31A is different from the light bulb shaped lamp 300 according to the embodiment 3 of the present invention illustrated in FIG. 30 in the configuration of the base platform in the LED module. Note that, in FIG. 31A and FIG. 31B, the components identical to the components illustrated in FIG. 30 are assigned with the same reference numerals, and the description for the reference numerals shall be omitted.

As illustrated in FIG. 31A and FIG. 31B, the light bulb shaped lamp according to the variation 1 of the embodiment 3 of the present invention has a recess 325 on the back surface of the base platform 140X in the LED module 330X. The base connecting part 341a in the first stem part 341 in the stem 340 is fit into the recess 325 so as to fix the base platform 140X to the stem 340.

As described above, the light bulb shaped lamp according to the variation, the base platform connecting part 341a in the stem 340 is fit into the recess 325 provided on the back surface of the base platform 140X. Accordingly, the movement of the base platform 140X is regulated by the stem 340. With this, it is possible to prevent the base platform 140X from moving. Accordingly, it is possible fix and hold the base platform 140X even more firmly.

Furthermore, according to the variation, the base platform 341a is fit into the recess 325 in the base platform 140X. Accordingly, it is possible to increase the area of the stem 340 and the base platform 140X contacting each other than in the embodiment 3. With this, it is possible to dissipate the heat generated at the LED module 330X even more efficiently.

Variation 2 of Embodiment 3

Figure 32:
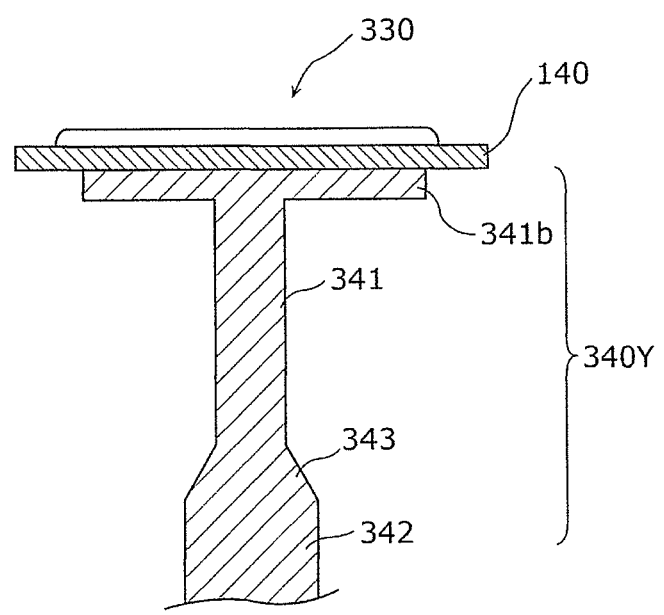
FIG. 32 is a cross-sectional view of an LED module and a stem in a light bulb shaped lamp according to the variation 2 of the embodiment 3 of the present invention.

Next, the variation 2 of the embodiment 3 of the present invention shall be described with reference to FIG. 32. FIG. 32 is a cross-sectional view of the LED module and the stem in the light bulb shaped lamp according to the variation 2 of the embodiment 3 of the present invention.

The light bulb shaped lamp according to the variation 2 of the embodiment 3 of the present invention illustrated in FIG. 32 is different from the light bulb shaped lamp 300 according to the embodiment 3 of the present invention illustrated in FIG. 30 in the configuration of the stem. Note that, in FIG. 32, the components identical to the components illustrated in FIG. 30 are assigned with the same reference numerals, and the description for the reference numerals shall be omitted.

As illustrated in FIG. 32, in the light bulb shaped lamp according to the variation 2 in the embodiment 3 of the present invention, the first stem part 341 in the stem 340Y includes a wide base connecting part 341b. More specifically, the base connecting part 341b in the stem 340Y according to the variation is configured to be longer in the longer direction of the base platform 140 than the base connecting part 341a in the stem 340 according to the embodiment 3 illustrated in FIG. 30. Note that, the base connecting part 341b in the stem 340Y according to this variation is in a rectangular shape in top view.

According to the light bulb shaped lamp described in the variation, the base connecting part 341b is configured to be wide. Therefore, it is possible to increase the area where the stem 340Y and the base platform 140 contact with each other than in the embodiment 3. With this, it is possible to dissipate the heat generated at the LED module 330 even more efficiently.

Note that, if the length of the base platform 140 in the base platform connecting part 341b is L1 and the length of the base platform 140 in the longer direction is L2, it is preferable that $1.2 \leq L1/L2 \leq 3.5$.

Variation 3 of Embodiment 3

Figure 33A:
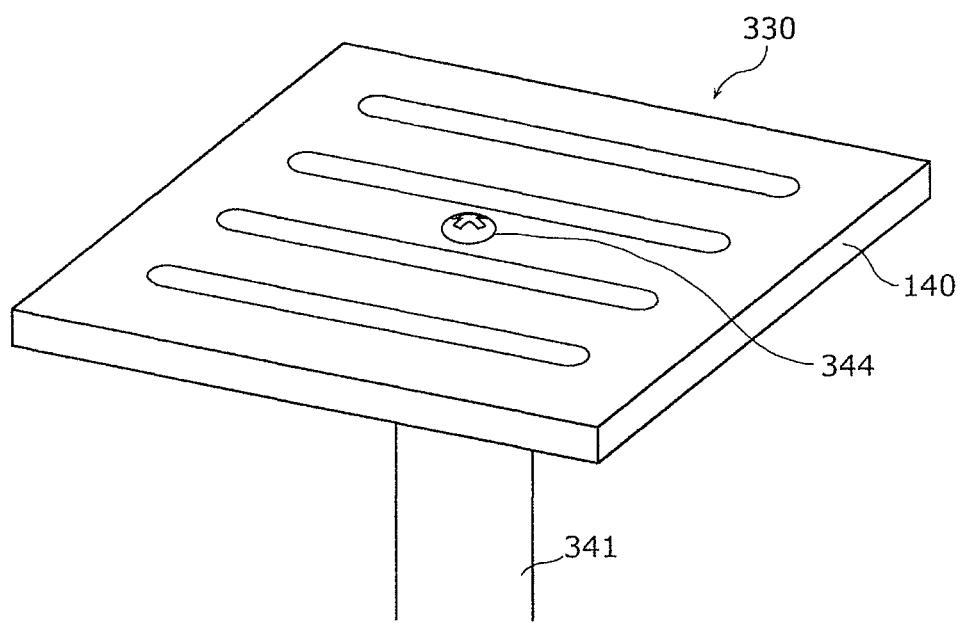
FIG. 33A is a perspective view of an LED module and a stem in a light bulb shaped lamp according to the variation 3 of the embodiment 3 of the present invention.
Figure 33B:
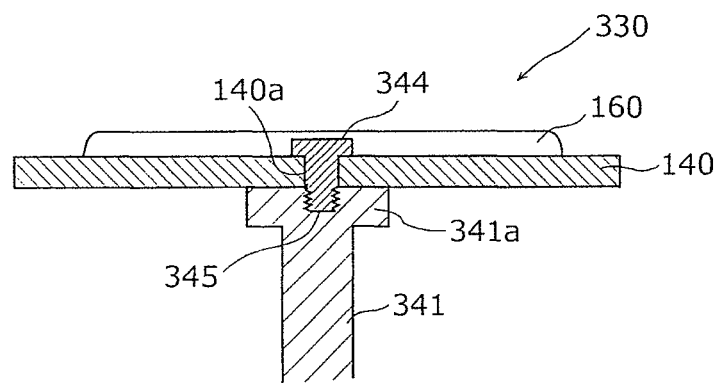
FIG. 33B is a cross-sectional view of an LED module and a stem in the light bulb shaped lamp according to the variation 3 of the embodiment 3 of the present invention.

Next, the variation 3 of the embodiment 3 of the present invention shall be described with reference to FIG. 33A and FIG. 33B. FIG. 33A is a perspective view of an LED module and a stem in a light bulb shaped lamp according to the variation 3 of the embodiment 3 of the present invention. FIG. 33B is a cross-sectional view of the LED module and the stem in the light bulb shaped lamp.

The light bulb shaped lamp according to the variation 3 in the embodiment 3 of the present invention illustrated in FIG. 33A and FIG. 33B is different from the light bulb shaped lamp 300 according to the embodiment of the present invention illustrated in FIG. 30 in the connection between the LED module and the stem. Note that, in FIG. 33A and FIG. 33B, the components identical to the components illustrated in FIG. 30 are assigned with the same reference numerals, and the description for the reference numerals shall be omitted.

As illustrated in FIG. 33A and FIG. 33B, in the light bulb shaped lamp according to the variation 3 in the embodiment 3 of the present invention, the LED module 330 and the stem 340 are fixed by a metal screw 344 having a screwing part. More specifically, a through hole 140a is provided in the base platform 140 in the LED module 330. Furthermore, a threaded hole 345 having a screw part is provided at the top of the base platform connecting part 341a in the first stem part 341 in the stem 340. Furthermore, the screw 344 is inserted into the through hole 140a in the base platform 140. Subsequently, the screw 344 is screwed into the screw hole 345 in the base platform connecting part 341a. With this, the base platform 140 is fixed to the first stem part 341 in the stem 340 by the tightened screw 344.

As described above, according to the light bulb shaped lamp according to the variation, the base platform 140 in the LED module 330 and the base platform connecting part 341a in the stem 340 are connected by the screw 344. Accordingly, it is possible to conduct the heat at the LED module 330 to the stem 340 via the screw 344. In this case, the screw 344 is present on the side of the base platform 140 where LEDs are mounted. Accordingly, the heat on the side where the LEDs are mounted can be conducted to the stem 340 efficiently. Furthermore, since the screw 344 penetrates the base platform 140, it is possible to increase the area where the base platform 140 and the metal part (the base platform connecting part 341a and the screw 344) than in the embodiment 3. As described above, according to the variation, the heat generated at the LED module 330 can be efficiently conducted to the stem 340.

Furthermore, the base platform 140 in the LED module 330 and the base platform connecting part 341a in the stem 340 are fixed by tightening the screw 344. Accordingly, it is possible to fix the LED module 330 to the stem 340 even more firmly.

Note that, in the variation, it is preferable that the through hole 140a is provided at the center of the base platform 140, and fixed by a screw at the center of the base platform 140. Since the heat from the LED module 330 tends to remain at the center of the base platform 140, it is possible to further improve the heat radiation property of the LED module 330 by inserting the screw 344 into the through hole 140a at the center of the base platform 140 and fix to the base platform connecting part 341a.

Variation 4 of Embodiment 3

Figure 34:
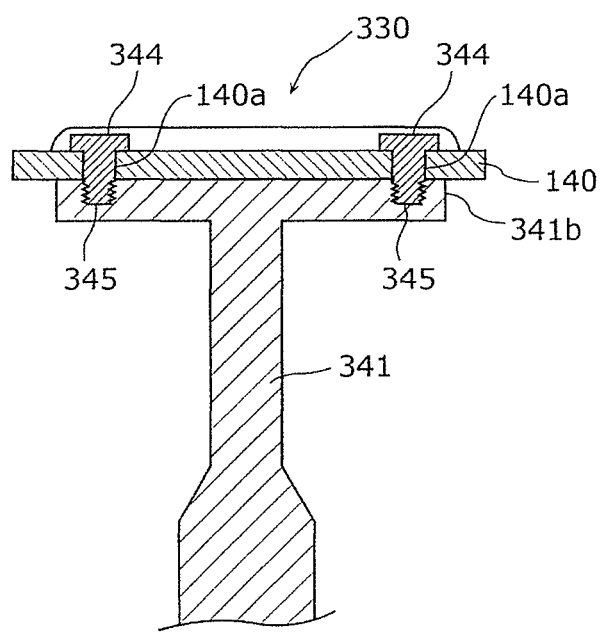
FIG. 34 is a cross-sectional view of an LED module and a stem in a light bulb shaped lamp according to the variation 4 of the embodiment 3 of the present invention.

Next, the variation 4 of the embodiment 3 of the present invention shall be described with reference to FIG. 34. FIG. 34 is a cross-sectional view of the LED module and the stem in the light bulb shaped lamp according to the variation 4 of the embodiment 3 of the present invention.

The light bulb shaped lamp according to the variation 4 in the embodiment 3 of the present invention illustrated in FIG. 34 is different from the light bulb shaped lamp according to the embodiment 3 of the present invention illustrated in FIG. 30 in the configuration of the stem. Note that, in FIG. 34, the components identical to the components illustrated in FIG. 30 are assigned with the same reference numerals, and the description for the reference numerals shall be omitted.

As illustrated in FIG. 34, in the light bulb shaped lamp according to the variation 4 in the embodiment 3 of the present invention, the first stem part 341 in the stem 340 includes a wide base connecting part 341b, in the same manner as the variation 2. More specifically, the base platform connecting part 341b in the stem 340 according to the variation is configured to be longer in the longer direction of the base platform 140 than the base connecting part 341a in the stem 340 according to the embodiment 3 or the variation 3 of the embodiment 3. Note that, the base platform connecting part 341b in the stem 340 according to this variation is in a rectangle shape in top view, in the same manner as the variation 2.

Furthermore, in the light bulb shaped lamp according to the variation 4, the LED module 330 and the stem 340 are fixed by a metal screw 344 having a screw part. More specifically, two through holes 140a are provided in the base platform 140 in the LED module 330. Furthermore, two threaded holes 345 each having a screw part are provided at the top of the base platform connecting part 341b in the first stem part 341 in the stem 340. Furthermore, the screw 344 is inserted into each of the through holes 140a in the base platform 140. Subsequently, each of the screws 344 is screwed into each of the screw holes 345 in the base platform connecting part 341b. With this, the base platform 140 is fixed to the first stem part 341 in the stem 340 by the tightened screw 344.

According to the light bulb shaped lamp described in the variation, the base connecting part 341b is configured to be wide. Therefore, it is possible to increase the area where the stem 340 and the base platform 140 contacts with each other than in the embodiment 3. With this, it is possible to increase the heat radiation property of the LED module 330 further.

Furthermore, according to the light bulb shaped lamp according to the variation, the base platform 140 in the LED module 330 and the base platform connecting part 341a in the stem 340 are connected by the two screws 344. Accordingly, it is possible to conduct the heat at the LED module 330 to the stem 340 via the screw 344 than in the embodiment 3 or the variation 2 of the embodiment 3. With this, it is possible to increase the heat radiation property of the LED module 330 further.

Furthermore, the base platform 140 in the LED module 330 and the base platform connecting part 341a in the stem 340 are fixed by tightening the two screws 344. Accordingly, it is possible to fix the LED module 330 to the stem 340 even more firmly.

Note that, in the variation, it is preferable that the through hole 140a is provided at the center of the base platform 140, and fixed by a screw at the center of the base platform 140. With this, the heat from the LED module 330 which tends to remain at the center of the base platform 140 is conducted to the stem 340 through the screw 344; it is possible to further improve the heat radiation property of the LED module 330.

The light bulb shaped lamp according to an aspect of the present invention has been described based on the embodiment and the variations. However, the present invention is not limited to the embodiments and the variations.

Figure 35:
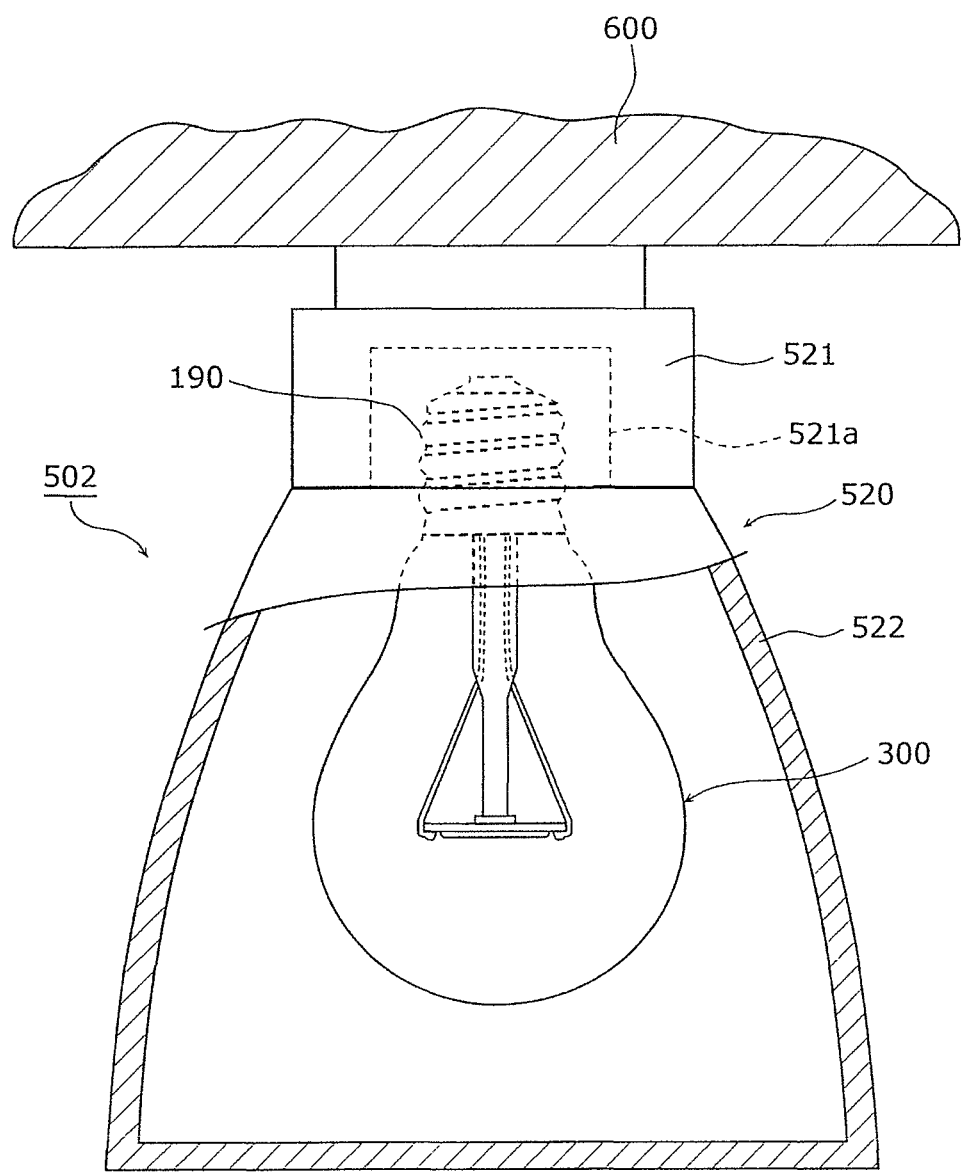
FIG. 35 is a schematic cross-sectional view of a lighting apparatus using the light bulb shaped lamp according to the embodiment 3 of the present invention.

For example, the present invention may not only be implemented as the light bulb shaped lamp, but also as a lighting apparatus including the light bulb shaped lamp. The following shall describe the lighting apparatus according to an aspect of the present invention with reference to FIG. 35. FIG. 35 is a schematic cross-sectional view of the lighting apparatus 502 according to the embodiment 3 of the present invention.

As illustrated in FIG. 35, the lighting apparatus 502 according to the embodiment of the present invention is attached to a ceiling 600 in a room when in use, and includes a light bulb shaped lamp 300 and a lighting equipment 520.

The lighting equipment 520 is for turning the light bulb shaped lamp 300 on and off, and includes an equipment body 521 attached to the ceiling 600 and a lamp cover 522 covering the light bulb shaped lamp 300.

The equipment body 521 includes a socket 521a. A base 190 of the light bulb shaped lamp is screwed into the socket 521a. Power is supplied to the light bulb shaped lamp 300 through the socket 521a.

Note that the lighting apparatus 502 described here is an example of the lighting apparatus according to an aspect of the present invention. The lighting apparatus according to an aspect of the present invention may hold the light bulb shaped lamp 300 and includes a socket for supplying power to the light bulb shaped lamp 300. Furthermore, the lighting apparatus 502 illustrated in FIG. 35 includes one light bulb shaped lamp 300. However, the lighting apparatus 502 may include more than one light bulb shaped lamp 300.

Figure 36:
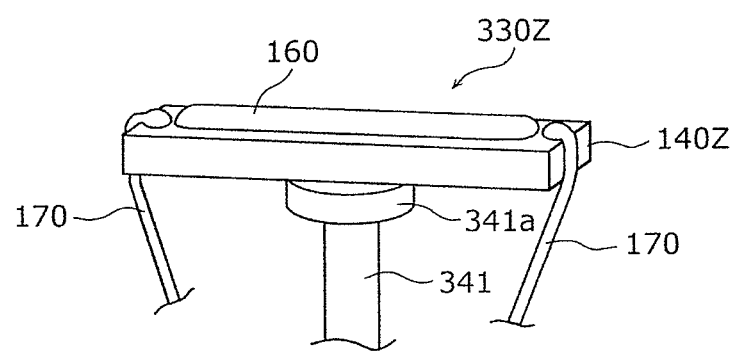
FIG. 36 is a perspective view of an LED module in a light bulb shaped lamp according to the embodiment 3 of the present invention.

Furthermore, the LED module 330 is configured using a tabular base platform 140. However, it is not limited to this configuration. For example, as illustrated in FIG. 36, the LED module 330Z may be configured using the quadrangular prism shaped base platform 140Z as described in the embodiment 1. For example, the base platform 140Z having a quadrangular prism shape having 20 mm in length, 1 mm in width, and 0.8 mm in thickness may be used. In this case, only one row of LEDs (not illustrated) and the sealing material 160 are formed. As described above, having a pillar shaped base platform allows reproducing the filament coil of incandescent light bulb by using the LED module in a simulative manner. Note that, in the embodiments, the shape and size of the base platform are merely examples, and may be in other shape such as a pentagon or octagon, or in a three-dimensional shape by combining more than one base platform or size.

Furthermore, in the embodiment 3, the supporting component 350 is housed in the resin case 360. However, it is not limited to this example. For example, the supporting component 350 may be configured such that a part of the supporting component 350 is exposed to the outside air. More specifically, in FIG. 29, it is possible to increase the thickness of the second supporting part 352 in the supporting component 350 so as to expose the side surface of the second supporting part 352.

As described above, by exposing a part of the supporting component 350, the heat at the LED module 330 conducted from the stem 340 to the supporting component 350 can be dissipated from the part of supporting component 350 being exposed to the outside air (the atmosphere) so as to improve the heat dissipating property. Furthermore, in this case, the exposed part of the supporting component made of aluminum may be anodized to improve the heat dissipating property.

Furthermore, in the embodiment 3, the LED chips 150 are directly mounted on the base platforms 140, 140X, and 140Z. However, it is not limited to this configuration. Stated differently, the base platforms 140, 140X, and 140Z are described as components composing the LED module. However, it is not limited to this example. For example, the base platforms 140, 140X, and 140Z may be used for the LED module including the LED substrate on which the LEDs are mounted as the base platform for mounting the LED module. In this case, it is preferable to compose the base platform with a material having high light transmittance (for example, at least 90%).

Embodiment 4

Next, a light bulb shaped lamp 400 according to the embodiment 4 of the present invention shall be described with reference to the drawings.

Overall Configuration of Light Bulb Shaped Lamp 400

First, the overall configuration of the light bulb shaped lamp 400 according to the embodiment 4 shall be described with reference to FIG. 37 to FIG. 39.

Figure 37:
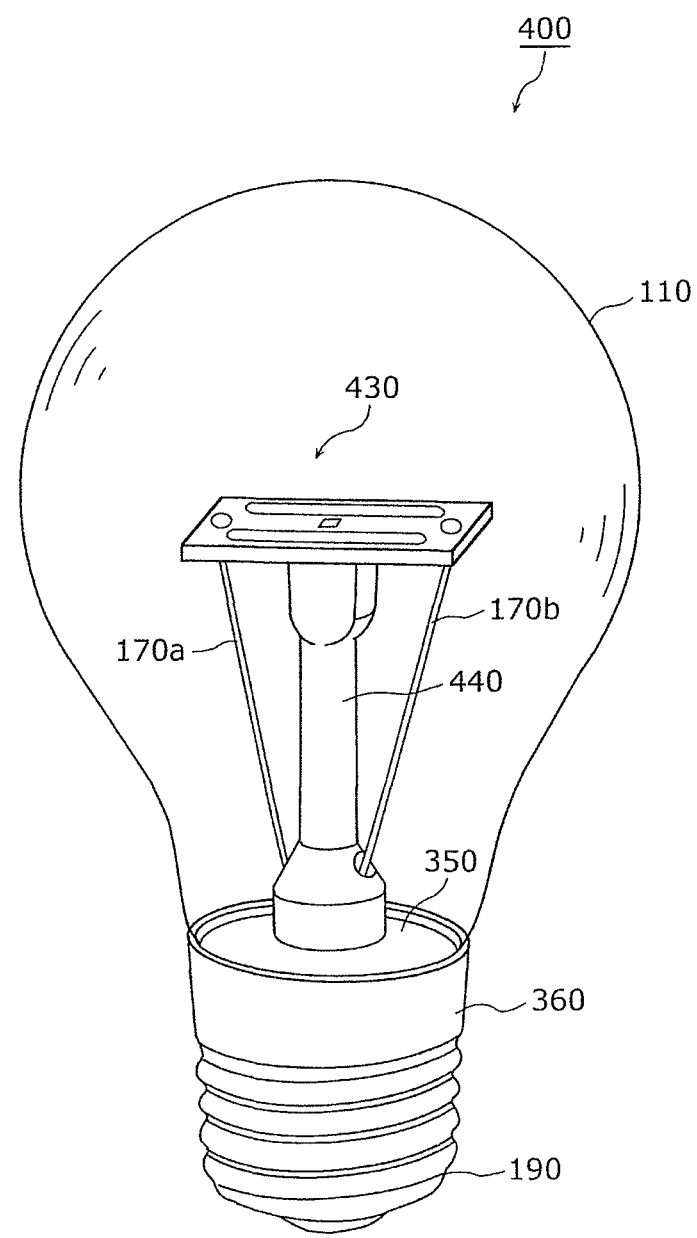
FIG. 37 is a perspective view of a light bulb shaped lamp according to the embodiment 4 of the present invention.

FIG. 37 is a perspective view of the light bulb shaped lamp according to the embodiment 4 of the present invention. FIG. 38 is an exploded perspective view of the light bulb shaped lamp according to the embodiment 4 of the present invention. FIG. 39 is a cross-sectional view of the light bulb shaped lamp according to the embodiment 4 of the present invention.

Figure 38:
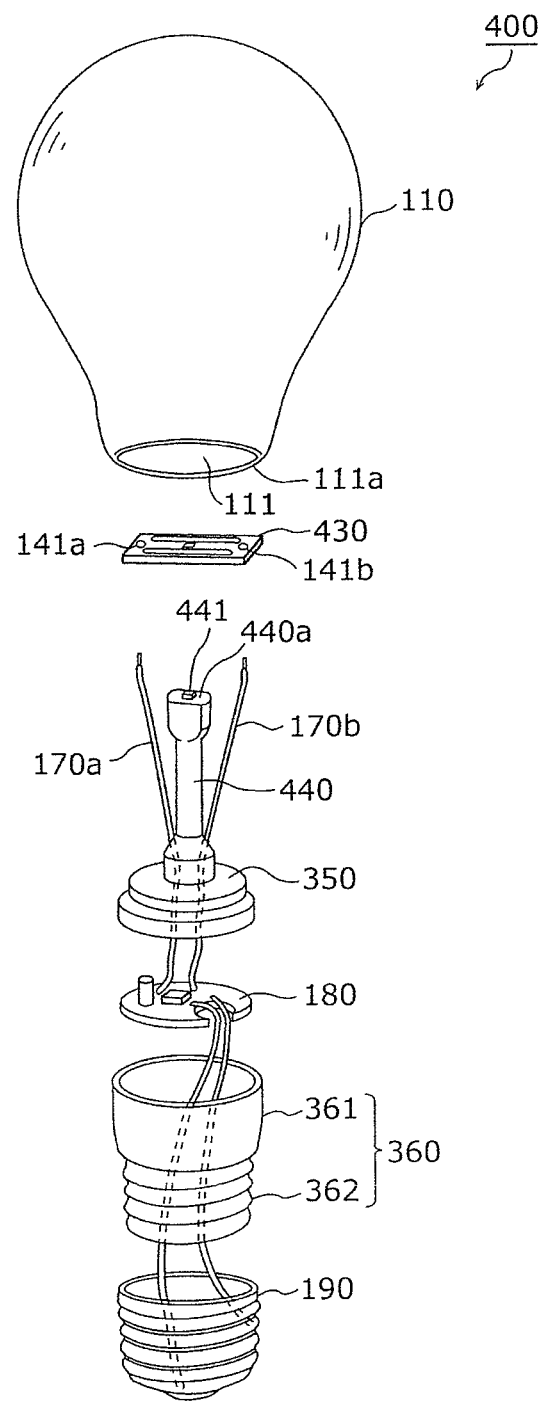
FIG. 38 is an exploded perspective view of a light bulb shaped lamp according to the embodiment 4 of the present invention.
Figure 39:
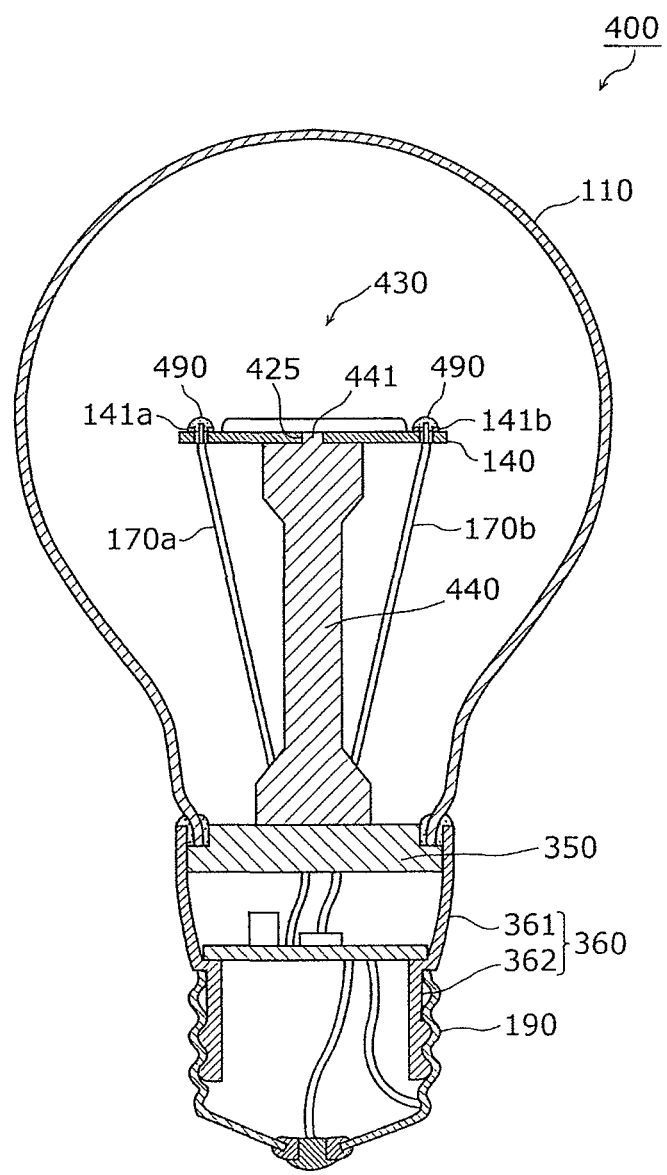
FIG. 39 is a cross-sectional view of a light bulb shaped lamp according to the embodiment 4 of the present invention.

As illustrated in FIG. 37 to FIG. 39, the light bulb shaped lamp 400 according to the embodiment 4 is a light bulb shaped LED lamp replacing an incandescent electric bulb, and includes a translucent globe 110, an LED module 430 which is a light source, a base 190 which receives power, and a stem 440. The light bulb shaped lamp 400 according to the embodiment 3 further includes a supporting component 350, a resin case 360, a pair of lead wires 170a and 170b, and a lighting circuit 180. In the embodiment 4, the light bulb shaped lamp 400 has an envelope composed of the globe 110, the resin case 360, and the base 190.

The following shall describe components of the light bulb shaped lamp 400 according to the embodiment 4 of the present invention with reference to FIG. 37 to FIG. 39.

Globe 110

As illustrated in FIG. 37 to FIG. 39, the globe 110 is a translucent hollow component, houses the LED module 430 inside, and transmits the light from the LED module 430 to outside of the lamp, in the same manner as the embodiment 1. In the embodiment 1, the globe 110 is a hollow glass bulb made of silica glass transparent to visible light. Accordingly, the LED module 430 housed in the globe 110 is visible from outside of the globe 110. In the embodiment 4, the shape of the globe 110 is Type A (JIS C7710) which is the same as a common incandescent light bulb, that is, the globe 110 has a shape with one end closed in a spherical shape, and the other end has an opening 111 as well.

LED Module 430

The LED module 430 corresponds to a light-emitting module which is a light source of the light bulb shaped lamp 400, and is provided in the globe 110. It is preferable that the LED module 430 is suspended in the globe 110 at the center of the spherical shape formed by the globe 110 (for example, inside a large diameter part at which the inner diameter of the globe 110 is large). With the LED module 430 positioned at the center, the light bulb shaped lamp 400 can achieve omnidirectional light distribution property when the light bulb shaped lamp 100 is switched on. The omnidirectional light distribution property is approximated to a common incandescent light bulb using conventional filament coil.

Furthermore, the LED module 430 emits light by receiving the supply of predetermined power from the two lead wires 170a and 170b. Note that, as illustrated in FIG. 39, the power supply terminals 141a and 141b are provided at both ends of the LED module 430, and the power supply terminals 141a and 141b and the lead wires 170a and 170b are electrically connected by the conductive joining component 490 such as solder.

Figure 40A:
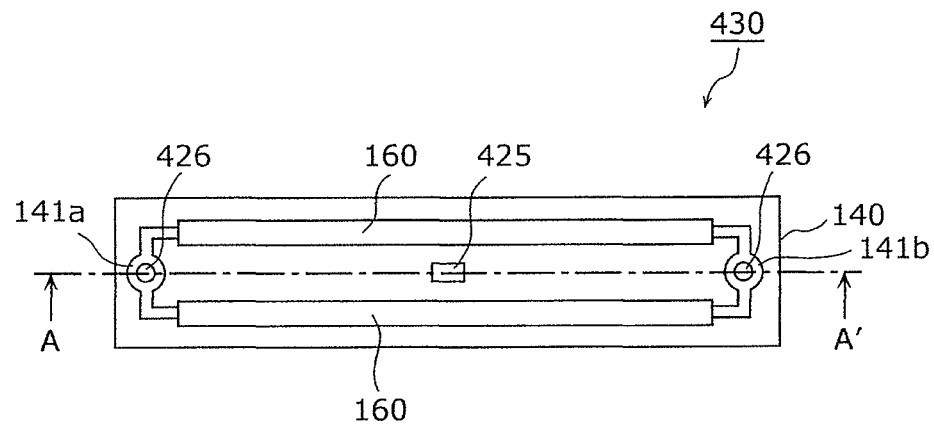
FIG. 40A is a front view of an LED module in a light bulb shaped lamp according to the embodiment 4 of the present invention.
Figure 40B:
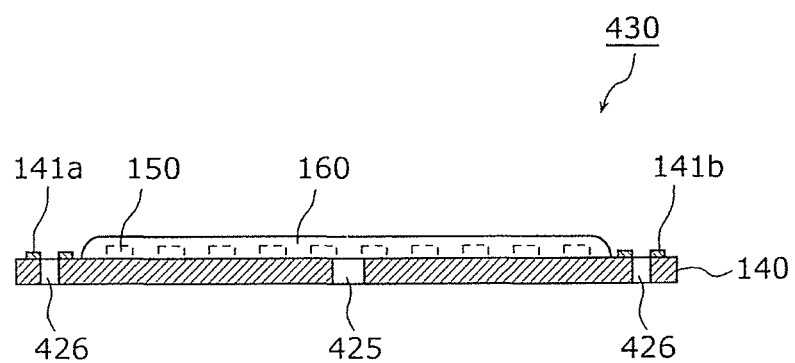
FIG. 40B is a cross-sectional view of an LED module in a light bulb shaped lamp according to the embodiment 4 of the present invention in line A-A' in FIG. 40A.

Next, the specific configuration of the LED module 430 according to the embodiment 4 shall be described in detail with reference to FIG. 40A and FIG. 40B. FIG. 40A is a plan view of the LED module in the light bulb shaped lamp according to the embodiment 4 of the present invention. FIG. 40B is a cross-sectional view of the LED module along the line A-A' in FIG. 40A.

As illustrated in FIG. 40A and FIG. 40B, the LED module 430 is a COB light-emitting module in which the LED chips are directly mounted on the substrate, and includes the base platform 140, the LED chips 150, the sealing material 160, the power supply terminals 141a and 141b, a first through hole 425, and second through holes 426. The LED module 430 is provided with the surface on which the LED chips 150 are mounted facing the top of the globe 110. The following shall describe components of the LED module 430 in detail.

Base Platform 140

First, the base platform 140 shall be described. Furthermore, the base platform 140 directly fixed to the stem 440. With this structure, the LED module 430 is directly fixed to the stem 120. Furthermore, in the same manner as the embodiment 3, the base platform 140 is an LED mounting board for mounting the LED chips 150, and is a translucent board translucent to visible light. The base platform 140 in the embodiment 4 is a rectangular board in an elongated rectangle shape. Note that, the shape of the base platform 140 is not limited to a rectangular board, but may be a shape of circle or polygons such as hexagon or octagon.

It is preferable that the base platform 140 is a component having high transmittance of visible light. The blue light emitted by the LED chip 150 and the yellow light by the sealing material 160 are transmitted inside the base platform 140 and are emitted from the surface on which the LED chip 150 is not mounted. Accordingly, even when the LED chips 150 are mounted only on one surface of the base platform 140 (front surface), the light bulb shaped lamp 400 can achieve omnidirectional light distribution property because the light is emitted from the other surface (back surface). The omnidirectional light distribution property is further approximated to an incandescent light bulb. In the embodiment 4, a translucent rectangular alumina substrate having a transmittance of 96% was used.

Note that, it is preferable that the base platform 140 is made of a material having a high thermal conductivity and high thermal emissivity in heat radiation so as to increase heat-radiating property, in the same manner as the embodiment 3. More specifically, the material for the base platform 140 is preferably a material referred to as a hard brittle material, which is a generic term for glass, ceramic, and others.

LED Chip 150

Next, the LED chip 150 shall be described. The LED chip 150 is an example of the semiconductor light-emitting element, and is a bare chip which emits visible light in one color. In this embodiment, a blue light-emitting LED chip which emits blue light when energized is used as the LED chip 150. A plurality of LED chips 150 are mounted on one surface of the base platform 140, and two rows of LED chips 150 are arranged, each row including 10 LED chips.

Note that, an example in which the LED chips 150 are mounted on the base platform 140 has been illustrated in the embodiment 4. However, the number of the LED chips 150 may be changed according to the use of the light bulb shaped lamp 400 in the embodiment 4 as well. For example, as a replacement for a miniature light bulb, one LED chip 150 may be mounted on the base platform 140. In addition, although the LED chips 150 are mounted on the base platform 140 in two rows in the embodiment 3, the LED chips 150 may be mounted in one row, or multiple rows other than two rows.

Sealing Material 160

Next, the sealing material 160 shall be described. The sealing material 160 is formed in a straight line shape covering the LED chips 150, in the same manner as the embodiment 1. In this embodiment, two lines of the sealing material 160 are formed along the rows of the LED chips 150. The sealing material 160 includes a phosphor which is a material for converting wavelength of light, and also serves as a wavelength conversion layer which converts the wavelength of light emitted from the LED chip 150. A phosphor-containing resin in which predetermined phosphor particles (not illustrated) and light diffusion material (not illustrated) are dispersed may be used as the sealing material 160. Note that, the details of the sealing material 160, such as the material, shape, manufacturing method and others are identical to the embodiment 1. Accordingly, the description shall be omitted.

Power Supply Terminal 141a, 141b

Next, the power supply terminals 141a and 141b shall be described. The power supply terminals 141a and 141b are terminal electrodes for receiving power causing the LED chip 150 to emit light from the lead wires 170a and 170b, and the received power is provided to the LED chip 150. In the embodiment, the power supply terminal 141a (first power supply terminals) is a positive voltage terminal which receives positive voltage from the lead wire 170a and supplies positive voltage to one of the electrodes (p-electrode) in the LED chip 150. Furthermore, the power supply terminal 141b (second power supply terminal) is a negative voltage terminal which receives a supply of negative voltage from the lead wire 170b and supplies a negative voltage to the other electrode (n-electrode) on the LED chip 150. With this, the DC power is supplied to each of the LED chips 150.

Furthermore, the power supply terminals 141a and 141b are formed on both ends of the base platform 140 in the longer direction. The second through holes 426 penetrating the base platform 140 are provided on each of the parts where the power supply terminals 141a and 141b are formed. Note that, although not illustrated in FIG. 40A and FIG. 40B, an end of each of the lead wires 170a and 170b is inserted into one of the second through holes 426. By the conductive joining component 490 made of solder, the power supply terminal 141b and the lead wire 170a are electrically connected, and the power supply terminal 141b and the lead wire 170b are electrically connected.

First Through Hole 425

Next, the first through hole 425 shall be described. The first through hole 425 is provided penetrating the base platform 140, and serves as a second engaging part engaging with the projection 441 in the stem 440 to be described later. In the embodiment 4, the first through hole 425 is configured for fitting the projection 441 in the stem 440, and the shape of the first through hole 425 in top view coincides the shape of the projection 441 in top view. More specifically, the top view of the first through hole 425 is a rectangle which coincides with the base platform 140 in the longer direction, and coincides with the shorter direction in the shorter direction (width direction).

Furthermore, the first through hole 425 is provided substantially at the center of the base platform 140. More specifically, the first through hole 425 is provided at the center of the base platform in the longer direction and the shorter direction, and is provided between the two lines of sealing material 160 in the embodiment 4.

Note that, the metal line is formed on the surface of the base platform 140 on which LEDs are mounted. The metal line is patterned on the surface of the base platform 140, and electrically connects the LED chips 150 together with the wire, and electrically connects the LED chips 150 and the power supply terminals 141a and 141b. As the metal line, silver (Ag), tungsten (W), copper (Cu), indium tin oxide (ITO) or others may be used. Note that, the surface of metal line may be plated by nickel (Ni)/gold (Au) or others.

Base 190

As illustrated in FIG. 38 and FIG. 39, the base 190 is a power receiving part for receiving power causing the LED chips 150 in the LED module 430 to emit light, and receives AC power from two contacts in the embodiment 4 as well. The power received by the base 190 is provided to the power input unit in the lighting circuit 180 through the lead wire.

The base 190 is in the type E, and a screw for screwing into a socket in a lighting apparatus is provided at its outer peripheral surface. Furthermore, the screw for screwing into the resin case 360 is formed on the inner circumferential surface of the base 190. Note that, the base 190 is a metal tube having a bottom.

In this embodiment, the base 190 is an E26 base. The light bulb shaped lamp 400 is attached to a socket for E26 base connected to the commercial AC power source for use.

Note that, the base 190 does not have to be an E26 base, and maybe a base of other size, such as E17. In addition, the base 190 does not have to be a screw base, and may be a base in a different shape such as a plug-in base.

Stem 440

As illustrated in FIG. 38 and FIG. 39, the stem 440 is a pillar extended toward the inside of the globe 110. Stated differently, the stem 440 is provided extending from the proximity of the opening 111 of the globe 110 to the inside of the globe 110.

The stem 440 is a holding component holding the LED module 430. The stem 440 in the embodiment 4 is substantially rod-shaped having one end connected to the LED module 430 and the other end connected to the supporting component 350. The LED module 430 is on the upper surface of the top 440a of the stem 440. In this embodiment, the LED module 430 is fixed to the stem 440 such that the back surface of the base platform 140 abuts the upper surface of the top 440a. More specifically, the LED module 430 is supported by the stem 440.

As described above, the LED module 430 is suspended in the globe 110 by the stem 440. More specifically, in the embodiment 4, the base platform 140 in the LED module 430 is larger than the top 440a of the stem 440, and the upper surface of the top 440a of the stem 440 (a surface on which the LED module 430 is placed) is covered by the base platform 140 of the LED module 430.

Furthermore, the pillar-shaped stem 440 has a flat part at the top 440a where the LED module 430 is to be mounted, and a projection 441 protruding the direction in which the stem 440 is extended is provided. The projection 441 is a first engaging part which suppresses the rotational movement of the LED module 430 (rotation direction) by being inserted into the recess or through hole provided in the LED module 430, and serves as a positioning part for positioning the LED module 430 and a rotational prevention part for the LED module 430. More specifically, the movement in the upper surface (the surface on which the LED module is mounted) of the LED module 430 placed on the upper surface of the top 440a of the stem 440 is regulated by the projection 441, and the position of the LED module 430 with respect to the stem 440 is determined. In this embodiment, the projection 441 is rectangular in top view, with the longer direction coinciding with the longer direction of the base platform 140 and the shorter direction coinciding with the width direction of the base platform 140.

As described above, the top view of the projection 441 coincides with the top view of the first through hole 425 in the base platform 140 in the LED module 430, and the projection 441 fits into the first through hole 425. Accordingly, the height of the projection 441 is substantially equivalent to the thickness of the base platform 140.

The stem 440 is configured of a material having a thermal conductivity larger than the thermal conductivity of the base platform 140 in the LED module 430. Furthermore, it is preferable for the stem 440 to be made of a material having a thermal conductivity larger than the thermal conductivity of glass (approximately 1.0 [W/m·K]), and may be composed of an inorganic material such as metal material or ceramics, for example. In the embodiment 4, the stem 440 is a metal pillar made of aluminum having a thermal conductivity of 237 [W/m·K], in the same manner as the embodiment 3.

As described above, the stem 440 is composed of a material having a thermal conductivity greater than the thermal conductivity of the base platform 140. Accordingly, the heat from the LED module 430 is efficiently conducted to the stem 440 through the base platform 140. With this, the heat from the LED module 430 can be transferred toward the base 190 and the globe 110. As a result, it is possible to suppress the reduction in the light-emission efficacy and in the life of the LED chips 150 due to the increase in temperature.

Furthermore, in the embodiment 4, the projection 441 is provided in the stem 440. Accordingly, it is possible to increase the area where the base platform 140 contacts the stem 440 as much as the four sides of the projection 441. Accordingly, it is possible to conduct the heat at the LED module 430 to the stem 440 even more efficiently, and thus it is possible to improve the heat dissipating property of the LED module 430.

Note that, if achieving the light distribution property equivalent to the incandescent light bulb is more important than improving the heat dissipating property of the LED module 430, it is preferable that the stem 440 is made of a transparent component such as glass. However, as described in the embodiment 4, it is possible to achieve the light distribution property equivalent to that of incandescent light bulbs.

Furthermore, two insertion holes for inserting the lead wires 170a and 170b are formed in the large diameter part of the conical trapezoidal shape in the lower part of the stem 440. The lead wires 170a and 170b are fixed to the stem 440 through the insertion holes, and one ends of the lead wires 170a and 170b are electrically connected to the power supply terminals 141a and 141b of the LED module 430, and the other ends are electrically connected to the output unit of the lighting circuit 180.

Note that, although not illustrated, the base platform 140 in the LED module 430 and the stem 440 are fixed by adhesive. As the adhesive, an adhesive made of silicone resin may be used, for example. However, an adhesive having a high thermal conductivity is preferably used for efficiently conducting the heat from the LED module 430 to the stem 440. For example, the thermal conductivity can be increased by dispersing metal particles in the silicone resin or others. Note that the adhesive is not necessarily composed of adhesive only, or be used.

Note that, as illustrated in FIG. 39, the stem 440 in the embodiment 4 has a solid structure in which the material is filled other than the insertion holes for the lead wires 170a and 170b. However, the stem 340 may have a hollow structure having a constant thickness.

Figure 41:
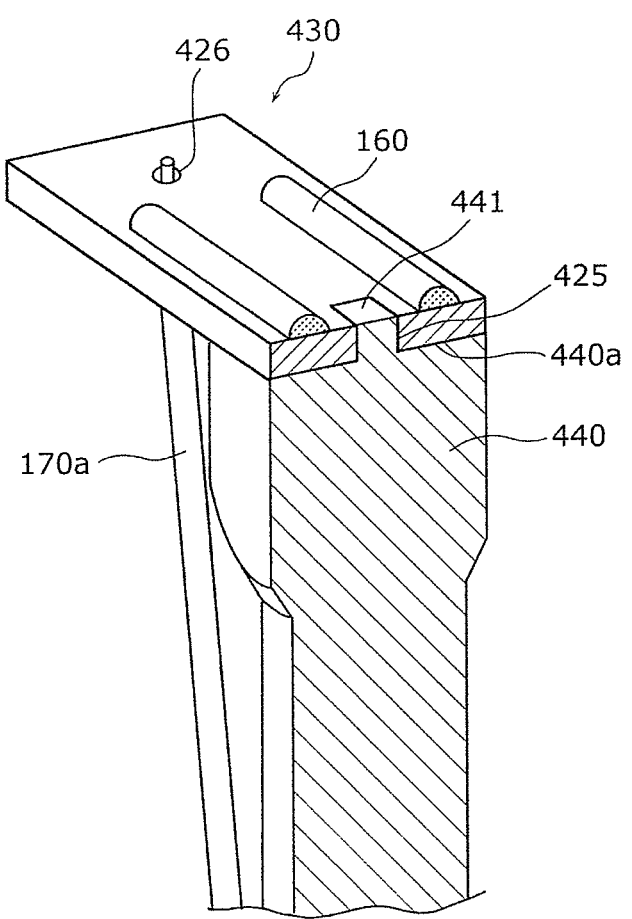
FIG. 41 is an enlarged perspective view of a major part of an LED module and a stem according to the embodiment 4 of the present invention.

Here, the operation when the LED module 430 is placed on the stem 440 shall be described with reference to FIG. 41. FIG. 41 is an enlarged cross-sectional view of a major part of the LED module and the stem in the light bulb shaped lamp according to the embodiment 4 of the present invention. Note that, FIG. 41 illustrates a state in which the power supply terminal 141a (141b) and the lead wire 170a (170b) which are not illustrated are connected by solder yet.

As illustrated in FIG. 41, the LED module 430 is placed on the upper surface of the top 440a of the stem 440 such that the projection 441 in the stem 440 is engaged with the first through hole 425 in the LED module 430. Here, the posture of the LED module 430 is regulated by the projection 441, and the orientation of the LED module 430 is determined according to the projection 441. As described above, in the embodiment 4, the stem 440 and the LED module 430 can be positioned by engaging the projection 441 into the first through hole 425.

Furthermore, the lead wires 170a, 170b and the LED module 430 may be positioned by engaging the projection 441 into the first through hole 425. More specifically, as illustrated in FIG. 41, the lead wires 170a and 170b are inserted into the second through hole 426 in the LED module 430 at the same time as engaging the projection 441 into the first through hole 425.

Supporting Component 350

Returning to the description of FIG. 38 and FIG. 39, the supporting component 350 is a component which is connected to the opening end 111a of the opening 111 in the globe 110 and supports the stem 440, in the same manner as the embodiment 3. Furthermore, the supporting component 350 is configured to close the opening 111 of the globe 110. The supporting component 350 is fit into the resin case 360 and fixed.

The stem 440 is fixed on the upper surface (the surface toward the globe 110) of the supporting component 350. The supporting component 350 and the stem 440 may be fixed by using a screw, for example. Furthermore, the inner surface of the resin case 360 abuts the side surface of the supporting part 350. Note that, the opening end of the opening 111 of the globe 110 abuts the stepped part of the supporting component 350, and the supporting component 350, the resin case 360, and the opening end of the opening 111 of the globe 110 are fixed by adhesive at the stepped part. The adhesive material is formed filling the stepped part.

The supporting component 350 is configured of a material having a thermal conductivity larger than the thermal conductivity of the base platform 140 in the LED module 430. Furthermore, it is preferable for the supporting component 350 to be made of a material having a thermal conductivity larger than the thermal conductivity of glass, and may be composed of an inorganic material such as metal material or ceramics, for example. Furthermore, it is preferable that the material for the supporting component 350 is made of a material having a thermal conductivity equal to or higher than the thermal conductivity of the stem 440 so as to efficiently conduct the heat from the stem 440 to the supporting component 350. In the embodiment 4, the supporting component 350 is made the same material as the stem 440, that is, aluminum having a thermal conductivity of 237 [W/m·K].

As described above, the supporting component 350 is made of a material having a high thermal conductivity. Accordingly, the heat from the LED module 430 thermally conducted to the stem 440 is efficiently conducted to the supporting component 350. As described above, the supporting component 350 is connected to the globe 110. Accordingly, the heat from the LED module 430 conducted to the supporting component 350 is thermally conducted to the globe 110 composing the envelope, and is dissipated to the air from the outer surface of the globe 110. As a result, it is possible to suppress the reduction in the light-emission efficacy and in the life of the LED chips 150 due to the increase in temperature.

Furthermore, the supporting component 350 is connected to the resin case 360 as well. Accordingly, the heat from the LED module 430 conducted to the supporting component 350 is thermally conducted to the resin case 360, and dissipated to the air from the outer surface of the resin case 360 composing the envelope.

Note that, in the same manner as the embodiment 3, when the globe 110 is made of glass, the thermal conductivity of the globe 110 is higher than the thermal conductivity of the resin case 360. In this case, the path for dissipating the heat generated at the LED module 430 is dominantly the heat dissipating path from the globe 110 (from the stem 440 to the supporting component 350 to the globe 110). Accordingly, in this case, the area of globe contacting the outside air is large, which makes the dissipation even more effective.

As the adhesive for fixing the supporting component 350, the resin case 360, and the globe 110, an adhesive made of silicone resin may be used in the same manner as the embodiment 3, for example. However, an adhesive having a high thermal conductivity is preferably used for efficiently conducting the heat from the LED module 430 to the globe 110 and the resin case 360. For example, the thermal conductivity can be increased by dispersing metal particles in the silicone resin.

Resin Case 360

As illustrated in FIG. 38 and FIG. 39, the resin case 360 is an insulating case for insulating the stem 440 and the base 190 and for housing the lighting circuit 180. In the embodiment 4, the resin case 360 includes a first case part 361 which is cylindrical and located above and a second case part 362 which is cylindrical and located below. Note that, the configuration of the first case part 361 and the second case part 362 is identical to those in the embodiment 3. Accordingly, the description for these components is omitted.

Lead Wires 170a, 170b

As illustrated in FIG. 37 to FIG. 39, the two lead wires 170a and 170b are electric wires for supplying the predetermined DC power to the LED module 430, and supply the DC power supplied from the base 190 to the LED chip 150.

The lead wire 170a (the first lead wire) is a positive voltage supplying wire for supplying a positive voltage from the lighting circuit 180 to the LED module 430. One end of the lead wire 170a closer to the LED module 430 is electrically connected to the power supply terminal 141a by solder, and the other end of the lead wire 170a closer to the lighting circuit is electrically connected a power output unit of the lighting circuit 180.

The lead wire 170b (the second lead wire) is a negative voltage supplying wire for supplying a negative voltage from the lighting circuit 180 to the LED module 430. One end of the lead wire 170b closer to the LED module 430 is electrically connected to the power supply terminal 141b by solder, and the other end of the lead wire 170b closer to the lighting circuit is electrically connected a power output unit of the lighting circuit 180.

Lighting Circuit 180

As illustrated in FIG. 38 and FIG. 39, the lighting circuit 180 is a circuit for causing the LED chip 150 to emit light, and is housed in the resin case 360 in the same manner as the embodiment 3. More specifically, the lighting circuit 180 includes a plurality of circuit elements, and a circuit board on which each of the circuit elements is mounted. In this embodiment, the lighting circuit 180 converts the AC power received from the base 190 to the DC power, and supplies the DC power to the LED chips 150 through the two lead wires 170a and 170b. Note that, the description for the circuit configuration of the lighting circuit 180 shall be omitted, since the circuit configuration is identical to the configuration in FIG. 6.

Note that, it is not necessary for the light bulb shaped lamp 400 to have the lighting circuit 180, and the light bulb shaped lamp 400 may not include the lighting circuit 180 if the DC power is directly supplied from lighting equipment, a battery cell or others. In addition, in the embodiment 4, the lighting circuit 180 may be an appropriate combination of selected light-adjusting circuit, voltage booster, and others.

According to the light bulb shaped lamp 400 of the embodiment 4, the LED module 430 is held by the stem 440. The LED module 430 is suspended in the globe 110 in the same manner as a filament of incandescent light bulb, and the stem 440 is in a size which is not likely to block the light from the LED module 430. Accordingly, the light emitted by the LED module 430 is not blocked by a metal case such as the case for the conventional light bulb shaped lamp. Accordingly, it is possible to achieve the light distribution characteristics identical to the conventional incandescent light bulbs.

Furthermore, according to the light bulb shaped lamp 400 of the embodiment 4, a projection 441 is provided in the stem 440 as the first engaging part, and the first through hole 425 for engaging with the projection 441 is formed in the base platform 140 in the LED module 430 as the second engaging part. With this, it is possible to suppress the rotational movement of the LED module 430 having an extending direction of the stem 440 in the LED module 430 as a rotational axis. Accordingly, it is possible to determine the posture of the LED module 430 in a direction of one axis. As a result, the LED module 430 and the stem 440 can be easily positioned and the LED module 430 and the lead wires 170a and 170b can be positioned easily as well. Accordingly, the lamp can be easily assembled.

Furthermore, as described in the embodiment 4, it is preferable that the base platform 140 in the LED module 430 is connected to the stem 440 having a thermal conductivity higher than the thermal conductivity of the base platform 140. With this, the heat generated at the LED chip 150 in the LED module 430 is efficiently conducted to the stem 440. Accordingly, it is possible to efficiently dissipate the heat generated at the LED module 430.

In this case, the projection 441 is provided at the stem 440, and thus it is possible to increase the area where the stem 440 and the LED module 430 contact each other. With this, it is possible to improve the heat dissipating property of the LED module 430.

Furthermore, as described in the embodiment 4, it is preferable that the stem 440 is supported by the supporting component 350 having a high thermal conductivity. With this, the heat at the LED module 430 thermally conducted to the stem 440 is efficiently conducted to the supporting component 350. The supporting component 350 is connected to the globe 110 and the resin case 360 composing the envelope. Accordingly, the heat conducted to the supporting component 350 is dissipated to the air through the globe 110 and the resin case 360. As described above, by providing the supporting component 350, it is possible to further improve the heat radiation property of the LED module 430.

Note that, in the embodiment 4, the projection 441 and the first through hole 425 are rectangular in top view. However, it is not limited to this example. For example, the projection 441 and the first through hole 425 may have a shape of polygon such as triangle, ellipses, non-circular shape or non-square shape.

Furthermore, it is preferable that the top view of the projection 441 is in a shape that determines a shape of the LED module 430 in one predetermined posture. For example, a shape which is vertically asymmetric and horizontally asymmetric in top view is preferable.

With this, even if there is one projection 441, it is possible to uniquely determine the position of the LED module 430 with respect to the stem 440 in directions of two axes orthogonal to each other, that is, in both vertical and horizontal directions in top view. Stated differently, the horizontal orientation of the LED module 430 can be uniquely determined. Accordingly, only by engaging the projection 441 into the first through hole 425, the lead wire 170a on the positive voltage side can be associated with the power supply terminal 141a on the positive voltage side, and the lead wire 170b on the negative voltage side can be associated with the power supply terminal 141b on the negative voltage side. Furthermore, the lead wires 170a, 170b and the LED module 430 may be positioned by engaging the projection 441 into the first through hole 425.

Variation of Embodiment 4

Next, a variation of the light bulb shaped lamp according to the embodiment 4 of the present invention shall be described with reference to the drawings. Note that, the overall configuration of the light bulb shaped lamp according to the following variations is identical to the configuration illustrated in FIG. 37 to FIG. 39. Accordingly, in the following variation, the description shall be made focusing on the difference from the embodiment, and the components identical to the components illustrated in FIG. 37 to FIG. 38 are assigned with the same reference numerals, and the description for the components shall be omitted.

Variation 1 of Embodiment 4

Figure 42A:
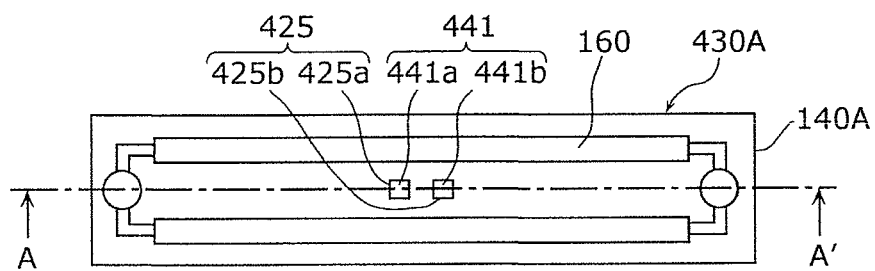
FIG. 42A is a front view of an LED module in a light bulb shaped lamp according to the variation 1 of the embodiment 4 of the present invention.

First, the variation 1 of the embodiment 4 of the present invention shall be described with reference to FIG. 42A and FIG. 42B. FIG. 42A is a plan view of the LED module in the light bulb shaped lamp according to the variation 1 of the embodiment 4 of the present invention, and FIG. 42B is a cross-sectional view of the LED module along the line A-A' in FIG. 42A.

Figure 42B:
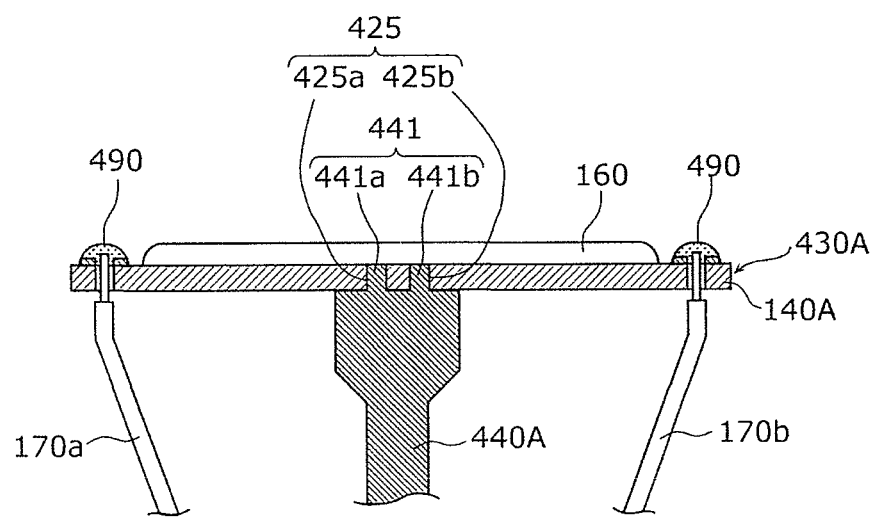
FIG. 42B is a cross-sectional view of an LED module in a light bulb shaped lamp according to the variation 1 of the embodiment 4 of the present invention in line A-A' in FIG. 42A.

As illustrated in FIG. 42A and FIG. 42B, in the light bulb shaped lamp according to the variation 1 in the embodiment 4 of the present invention, the LED module 430A includes a plurality of the first through holes 425 and the stem 440A includes a plurality of projections 441.

In this variation, the two first through holes 425a and 425b are provided in one row along the longer direction of the base platform 140A. The two first through holes 425a and 425b are both in a square shape in top view.

Furthermore, the stem 440A has two projections 441a and 441b for engaging into the two first through holes 425a and 425b in one row along the longer direction of the base platform 140A. Each of the two projections 441a and 441b is a square approximately in the same size as the first through holes 425a and 425b in top view. Note that, the first through hole 425a corresponds to the projection 441a, and the first through hole 425b corresponds to the projection 441b.

In this variation, the LED module 430A and the stem 440A are fixed by fitting the projection 441a into the first through hole 425a and fitting the projection 441b into the first through hole 425b, as illustrated in FIG. 42A and FIG. 42B.

According to the light bulb shaped lamp according to the variation as described above, the LED module 430A and the stem 440A are fixed by the projections 441 and the through holes 425. Accordingly, even if the shape of the projection 441 and the first through hole 425 in top view is circular or a regular polygon which does not determine the orientation of the LED module in a direction of one axis by only one projection 441 and the first through hole 425, the position of the LED module in the rotation direction can be uniquely fixed by the direction of the arrangement if more than one projection 441 and more than one through hole 425 are provided.

Furthermore, the LED module 430A and the stem 440A can be fixed more stably by fixing the projections 441 and the first through hole 425 than the embodiment 4 illustrated in FIG. 29. Furthermore, it is possible to increase the area where the stem 440A contacts the base platform 140A. Accordingly, it is possible to improve the heat dissipating property of the LED module 430A compared to the embodiment 4 described above.

Note that, in the variation 1, the projections 441a and 441b and the first through holes 425a and 425b are square-shaped in top view. However, the same effect can be achieved even if the projections are circular. Furthermore, the variation 1 does not discourage the shape of the projections 441a and 441b and the first through holes 425a and 425b in top view to be non-circular, non-square shape such as rectangles. The shape of the projections 441a and 441b and the first through holes 425a and 425b in top view may be non-circular, non-square shape such as rectangle.

Variation 2 of Embodiment 4

Figure 43A:
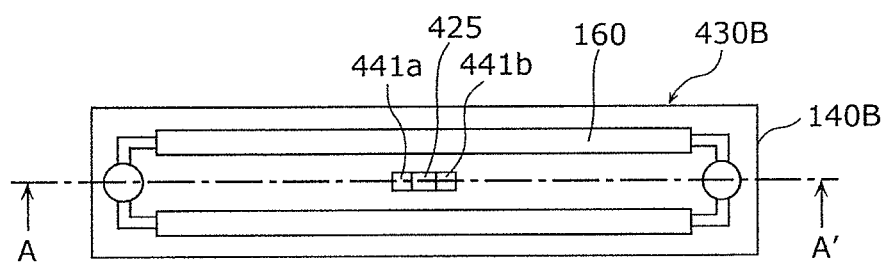
FIG. 43A is a front view of an LED module in a light bulb shaped lamp according to the variation 2 of the embodiment 4 of the present invention.

Next, the variation 2 of the embodiment 4 of the present invention shall be described with reference to FIG. 43A and FIG. 43B. FIG. 43A is a plan view of the LED module in the light bulb shaped lamp according to the variation 2 of the embodiment 4 of the present invention, and FIG. 43B is a cross-sectional view of the LED module along the line A-A' in FIG. 43A.

Figure 43B:
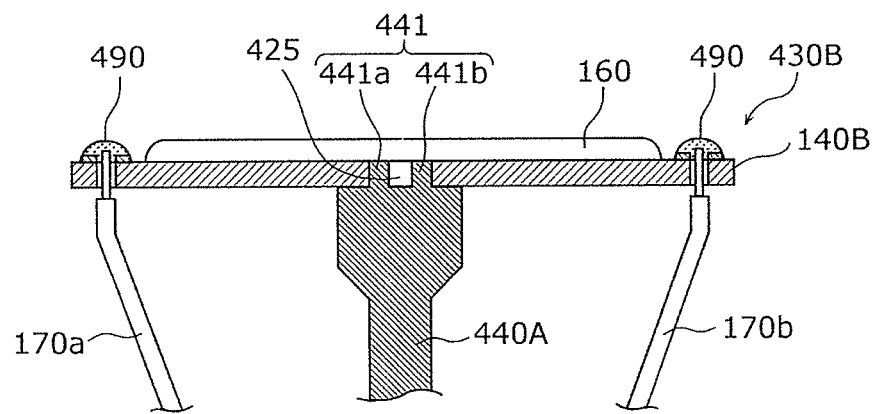
FIG. 43B is a cross-sectional view of an LED module in a light bulb shaped lamp according to the variation 2 of the embodiment 4 of the present invention in line A-A' in FIG. 43A.

As illustrated in FIG. 43A and FIG. 43B, in the light bulb shaped lamp according to the variation 2 in the embodiment 4 of the present invention, the LED module 430B includes the first through hole 425 and the stem 440A includes a plurality of projections 441.

In the variation, the stem 440A has the same configuration as the stem 440A illustrated in FIG. 42A and FIG. 42B, and the stem 440A has two projections 441a and 441b for engaging into the two first through holes 425a and 425b.

Furthermore, the base platform 140B defines one first through hole 425 to which the projections 441a and 441b are inserted. Accordingly, the first through hole 425 in the variation is rectangular in top view.

In this variation, the LED module 430B and the stem 440A are fixed such that the two projections 441a and 441b are fit into the first through hole 425a, as illustrated in FIG. 43A and FIG. 43B. When the LED module 430B and the stem 440A are fixed, there is a gap between the projection 441a and the projection 441b.

As described above, according to the light bulb shaped lamp according to the variation, the LED module 430B and the stem 440A are fixed by fitting the plurality of projections 441 into one first through hole 425. Accordingly, it is possible to increase the length of the first through hole 425 as much as the width of the plurality of projections 441, and thus it is possible to insert the projection 441 into the first through hole 425 more easily than fixing the LED module 430B and the stem 440A by associating one of the first through hole 425 and one projection 441. With this, the lamp can be assembled even more easily.

Furthermore, the gap between the projection 441a and the projection 441b can reduce the stress generated when the projections 441a and 441b are inserted into the first through hole 425. With this, it is possible to increase the acceptable range of the precision in the size of the first through hole 425 and the projection 441 than a case in which the LED module 430B and the stem 440A are fixed by associating one first through hole 425 and one projection 441.

Note that, in the embodiment 4, the first through hole 425 is rectangular in top view. However, it is not limited to this example. The first through hole 425 may be in any shape which suppresses the movement in biaxial direction, that is, the arrangement direction of the plurality of projections 441 (441a, 441b) and a direction orthogonal to the arrangement direction.

Variation 3 of Embodiment 4

Figure 44A:
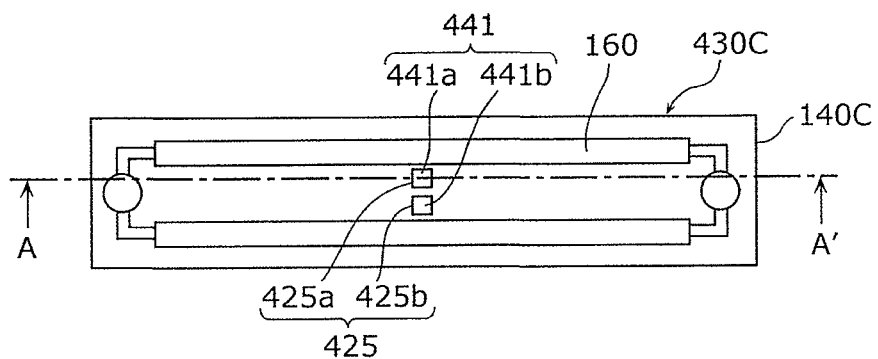
FIG. 44A is a front view of an LED module in a light bulb shaped lamp according to the variation 3 of the embodiment 4 of the present invention.

Next, the variation 3 of the embodiment 4 of the present invention shall be described with reference to FIG. 44A and FIG. 44B. FIG. 44A is a plan view of the LED module in the light bulb shaped lamp according to the variation 3 of the embodiment 4 of the present invention, and FIG. 44B is a cross-sectional view of the LED module along the line A-A' in FIG. 44A.

Figure 44B:
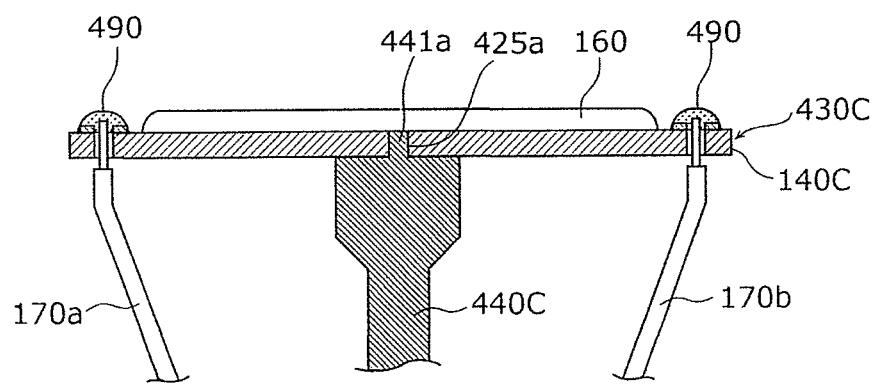
FIG. 44B is a cross-sectional view of an LED module in a light bulb shaped lamp according to the variation 3 of the embodiment 4 of the present invention in line A-A' in FIG. 44A.

As illustrated in FIG. 44A and FIG. 44B, in the light bulb shaped lamp according to the variation 3 of the embodiment 4 of the present invention, the LED module 430C includes a plurality of the first through holes 425 and the stem 440C includes a plurality of projections 441, in the same manner as the variation 1.

The variation 3 is different from the variation 1 in the direction where the first through holes 425 and the projections 441 are arranged. More specifically, in the variation, the base platform 140C defines the two first through holes 425a and 425b are provided in one row along the shorter direction of the base platform 140C. The two first through holes 425a and 425b are both in a square shape in top view.

Furthermore, the stem 440C has two projections 441a and 441b for engaging into the two first through holes 425a and 425b in one row along the shorter direction of the base platform 140C. Each of the two projections 441a and 441b is a square approximately in the same size as the first through holes 425a and 425b in top view. Note that, the first through hole 425a corresponds to the projection 441a, and the first through hole 425b corresponds to the projection 441b.

In this variation, the LED module 430C and the stem 440C are fixed by fitting the projection 441a into the first through hole 425a and fitting the projection 441b into the first through hole 425a, as illustrated in FIG. 44A and FIG. 44B.

As described above, the light bulb shaped lamp according to the variation 3 can produce the effect equivalent to the light bulb shaped lamp according to the variation 1.

Note that, the first through hole 425 according to the variation 3 may be configured like the first through hole 425 according to the variation 2.

Variation 4 of Embodiment 4

Figure 45A:
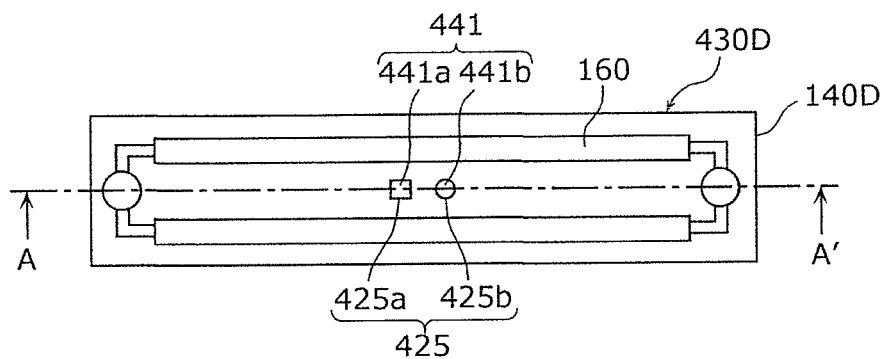
FIG. 45A is a front view of an LED module in a light bulb shaped lamp according to the variation 4 of the embodiment 4 of the present invention.

First, the variation 4 of the embodiment 4 of the present invention shall be described with reference to FIG. 45A and FIG. 45B. FIG. 45A is a plan view of the LED module in the light bulb shaped lamp according to the variation 4 of the embodiment 4 of the present invention, and FIG. 45B is a cross-sectional view of the LED module along the line A-A' in FIG. 45A.

Figure 45B:
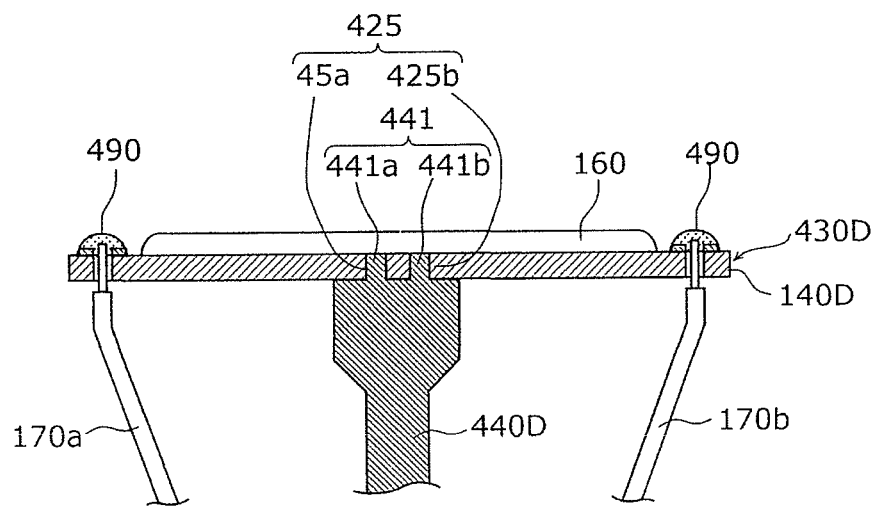
FIG. 45B is a cross-sectional view of an LED module in a light bulb shaped lamp according to the variation 4 of the embodiment 4 of the present invention in line A-A' in FIG. 45A.

As illustrated in FIG. 45A and FIG. 45B, in the light bulb shaped lamp according to the variation 4 in the embodiment 4 of the present invention, the LED module 430D includes a plurality of the first through holes 425 and the stem 440D includes a plurality of projections 441.

In this variation, the two first through holes 425a and 425b which are different in the shape in top view are provided in one row along the longer direction of the base platform 140D. The first through hole 425a is a square in top view, and the first through hole 425b is circular in top view.

Furthermore, the stem 440D has two projections 441a and 441b for engaging into the two first through holes 425a and 425b having different shapes in top view are arranged in one row along the longer direction of the base platform 140D. The projection 441a (first projecting part) is a square approximately in the same size as the first through hole 425a in top view, and the projection 441b (second projecting part) is a circle approximately in the same size as the first through hole 425b in top view. Note that, the first through hole 425a corresponds to the projection 441a, and the first through hole 425b corresponds to the projection 441b.

In this variation, the LED module 430D and the stem 440D are fixed by fitting the projection 441a into the first through hole 425a and fitting the projection 441b into the first through hole 425b, as illustrated in FIG. 45A and FIG. 45B.

According to the light bulb shaped lamp according to the variation as described above, the LED module 430D and the stem 440D are fixed by the projections 441 and the first through holes 425 having different shapes in top view. Accordingly, if the projection 441 and the first through hole 425 are in a shape such as a square, circle, or rectangle in top view, which does not determine the orientation of the LED in one axial direction with only one projection 441 and one first through hole 425, it is possible to position the LED module 430D while determining the orientation of the LED module 430D in one axial direction of the LED module 430D.

Stated differently, according to the light bulb shaped lamp in the embodiment 3 and the variations 1 to 3 of the embodiment 3 can fix the LED module while determining the direction of one axis of the LED module. However, with the embodiment 3 and the variations 1 to 3 of the embodiment 3, it was not possible to determine the orientation of the LED module in the direction of one axis.

In contrast, in the light bulb shaped lamp according to the variation, it is possible to determine the posture of the LED module 430D with respect to the stem 440 can be uniquely determined while determining the orientation of the LED module 430D in the direction of one axis. Stated differently, the horizontal orientation of the LED module 430 can be uniquely determined. Accordingly, only by engaging the projections 441a and 441b into the first through holes 425a and 425b, the lead wire 170a on the positive voltage side can be associated with the power supply terminal 141a on the positive voltage side, and the lead wire 170b on the negative voltage side can be associated with the power supply terminal 141b on the negative voltage side. More specifically, the lead wires 170a and 170b are completely positioned with the LED module 430D at the same time as fitting the projections 441a and 441b into the first through holes 425a and 425b.

Furthermore, the LED module 430D and the stem 440D are fixed by the projections 441 and the first through holes 425. Accordingly, the LED module 430D and the stem 440D can be stably fixed; and the heat dissipating property of the LED module 430D can be improved by increasing the area in which the base platform 140D contacts the stem 440D.

Note that, in the variation, the shape of the projections 441a and 441b and the first through holes 425a and 425b in top view are not limited to the combination described above, and shapes such as a regular polygon such as rectangle or non-circle such as ellipse or a square may be appropriately combined.

Variation 5 of Embodiment 4

Figure 46A:
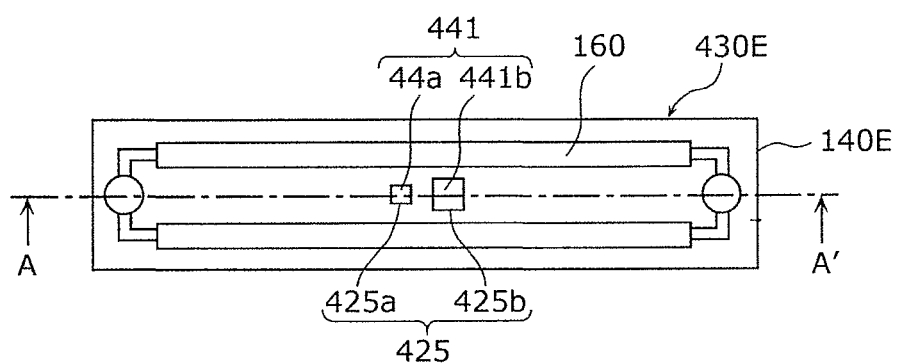
FIG. 46A is a front view of an LED module in a light bulb shaped lamp according to the variation 5 of the embodiment 4 of the present invention.

First, the variation 5 of the embodiment 4 of the present invention shall be described with reference to FIG. 46A and FIG. 46B. FIG. 46A is a plan view of the LED module in the light bulb shaped lamp according to the variation 5 of the embodiment 4 of the present invention, and FIG. 46B is a cross-sectional view of the LED module along the line A-A' in FIG. 46A.

Figure 46B:
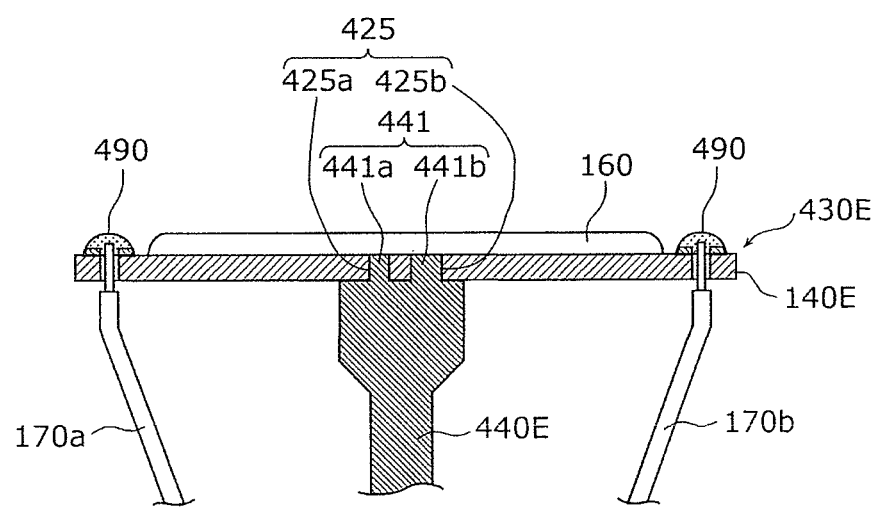
FIG. 46B is a cross-sectional view of an LED module in a light bulb shaped lamp according to the variation 5 of the embodiment 4 of the present invention in line A-A' in FIG. 46A.

As illustrated in FIG. 46A and FIG. 46B, in the light bulb shaped lamp according to the variation 5 in the embodiment 4 of the present invention, the LED module 430E includes a plurality of the first through holes 425 and the stem 440E includes a plurality of projections 441.

However, in this variation, the two first through holes 425a and 425b which are in the same shape but in different sizes in top view, that is, in similar shapes are provided in one row along the longer direction of the base platform 140E.

Although both the first through hole 425a and the first through hole 425b are in a square shape in top view, the length of one side of the square defining the first through hole 425a is shorter than the length of one side of the square defined by the first through hole 425b.

Furthermore, the stem 440E has two projections 441a and 441b for engaging into the two first through holes 425a and 425b in one row along the longer direction of the base platform 140E. The projection 441a is a square approximately in the same size as the first through hole 425a in top view, and the projection 441b is a circle approximately in the same size as the first through hole 425b in top view. Note that, the first through hole 425a corresponds to the projection 441a, and the first through hole 425b corresponds to the projection 441b.

In this variation, the LED module 430E and the stem 440E are fixed by fitting the projection 441a into the first through hole 425a and fitting the projection 441b into the first through hole 425b, as illustrated in FIG. 46A and FIG. 46B.

As described above, according to the light bulb shaped lamp according to the variation, the LED module 430E and the stem 440E are fixed by the projections 441 and the first through holes 425 in similar shapes and in different sizes in top view. With this, in the same manner as the light bulb shaped lamp according to the variation 4 illustrated in FIG. 45A and FIG. 45B, the LED module 430E is positioned not only by determining the direction of one axis, but also the orientation of the LED module in the direction of one axis.

Accordingly, only by engaging the projections 441a and 441b into the first through holes 425a and 425b, the lead wire 170a on the positive voltage side can be associated with the power supply terminal 141a on the positive voltage side, and the lead wire 170b on the negative voltage side can be associated with the power supply terminal 141b on the negative voltage side. More specifically, the lead wires 170a and 170b are completely positioned with the LED module 430E at the same time as fitting the projections 441a and 441b into the first through holes 425a and 425b.

Furthermore, the LED module 430E and the stem 440E can be stably fixed by the projections 441 and the first through holes 425. Accordingly, it is possible to improve the heat dissipating property of the LED module 430E by increasing the area where the base platform 140 and the stem 440E contact each other.

Note that, in the variation 5, the shapes of the projections 441a and 441b and the first through holes 425a and 425b are not limited to the shapes described above, and may be in a non-circular or non-square shape such as a regular polygon including a rectangle or ellipse, or may be a shape such as a circular shape which does not determine the orientation of the LED module in the same manner as a square.

Variation 6 of Embodiment 4

Figure 47A:
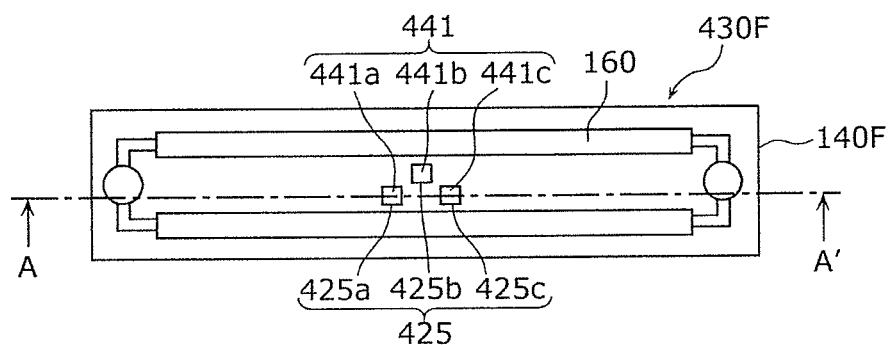
FIG. 47A is a front view of an LED module in a light bulb shaped lamp according to the variation 6 of the embodiment 4 of the present invention.

First, the variation 6 of the embodiment 4 of the present invention shall be described with reference to FIG. 47A and FIG. 47B. FIG. 47A is a plan view of the LED module in the light bulb shaped lamp according to the variation 6 of the embodiment 4 of the present invention, and FIG. 47B is a cross-sectional view of the LED module along the line A-A' in FIG. 47A.

Figure 47B:
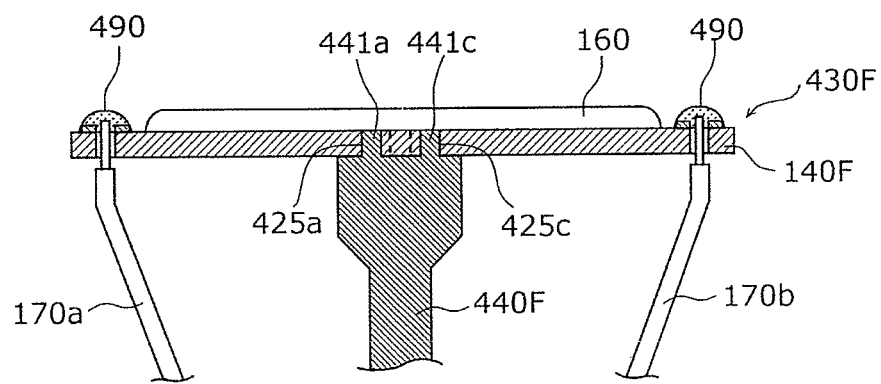
FIG. 47B is a cross-sectional view of an LED module in a light bulb shaped lamp according to the variation 6 of the embodiment 4 of the present invention in line A-A' in FIG. 47A.

As illustrated in FIG. 47A and FIG. 47B, in the light bulb shaped lamp according to the variation 6 in the embodiment 4 of the present invention, the LED module 430F includes a plurality of the first through holes 425 and the stem 440F includes a plurality of projections 441.

In this variation, the three first through holes 425a, 425b, and 425c are provided alternately along the longer direction of the base platform 140F. The three first through holes 425a, 425b, and 425c are all in a square shape in top view.

Furthermore, in the stem 440F, three projections 441a, 441b, and 441c for engaging with the three first through holes 425a, 425b, and 425c are alternately provided along the longer direction of the base platform 140F. The three projections 441a, 441b, and 441c are squares substantially in the same size as the first through holes 425a, 425b, and 425c in top view. Note that, the first through hole 425a corresponds to the projection 441a, the first through hole 425b corresponds to the projection 441b, and the first through hole 425c corresponds to the projection 441c.

In the variation, the LED module 430F and the stem 440F are fixed by fitting the projection 441a into the first through hole 425a, the projection 441b into the first through hole 425b, and the projection 441c into the first through hole 425c, as illustrated in FIG. 47A and FIG. 47B.

According to the light bulb shaped lamp according to the variation as described above, the LED module 430F and the stem 440F are fixed by the projections 441 alternately arranged and the first through holes 425 alternately arranged. With this, in the same manner as the light bulb shaped lamp according to the variations 4 and 5, the LED module 430F is positioned not only by determining the one axial direction, but also the orientation of the LED module in the direction of one axis.

Accordingly, only by engaging the projections 441a, 441b, and 441c into the first through holes 425a, 425b, and 425c, the lead wire 170a on the positive voltage side can be associated with the power supply terminal 141a on the positive voltage side, and the lead wire 170b on the negative voltage side can be associated with the power supply terminal 141b on the negative voltage side. Stated differently, at the same time as engaging the projections 441a, 441b, and 441c with the first through holes 425a, 425b, and 425c, the lead wires 170a and 170b are positioned with the LED module 430F.

Furthermore, the LED module 430F and the stem 440F are fixed by projections 441 and the first through holes 425. Accordingly, the LED module 430F and the stem 440F are stably fixed, and the heat dissipating property of the LED module 430F can be improved by increasing the area in which the base platform 140F contacts the stem 440F.

Note that, in this variation, the shape of the projections 441a, 441b, and 441c, and the first through holes 425a, 425b, and 425c are not limited to a square shape in top view.

Variation 7 of Embodiment 4

Figure 48A:
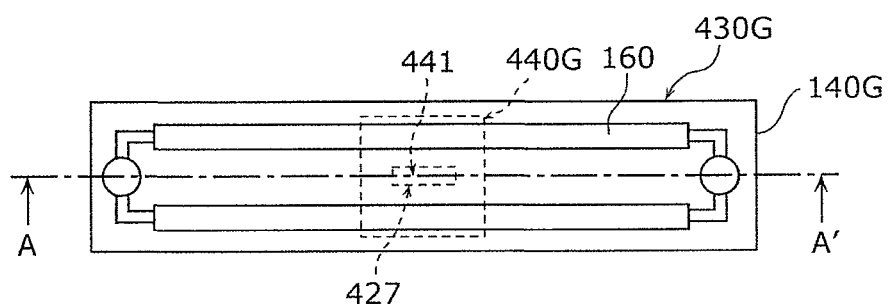
FIG. 48A is a front view of an LED module in a light bulb shaped lamp according to the variation 7 of the embodiment 4 of the present invention.

Next, the variation 7 of the embodiment 4 of the present invention shall be described with reference to FIG. 48A and FIG. 48B. FIG. 48A is a plan view of the LED module in the light bulb shaped lamp according to the variation 7 of the embodiment 4 of the present invention, and FIG. 48B is a cross-sectional view of the LED module along the line A-A' in FIG. 48A.

Figure 48B:
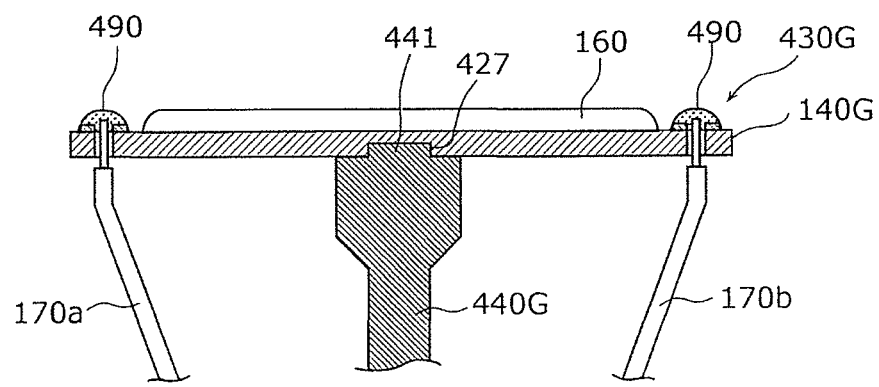
FIG. 48B is a cross-sectional view of an LED module in a light bulb shaped lamp according to the variation 7 of the embodiment 4 of the present invention in line A-A' in FIG. 48A.

As illustrated in FIG. 48A and FIG. 48B, in the light bulb shaped lamp according to the variation 7 of the embodiment 4 in the present invention, the LED module 430G does not have a base platform 140G defining the first through hole, and a recess 427 is provided on the back surface of the base platform 140G instead. The recess 427 serves as a second engaging part for engaging into the projection 441 in the stem 440G, in the same manner as the first through hole. Note that, the shape of the recess 427 is rectangle when the base platform 140G is viewed from the back surface.

Furthermore, the stem 440G includes a projection 441 for engaging with the recess 427. The projection 441 is a rectangle having an approximately same size as the recess 427.

In this variation, the LED module 430G and the stem 440G are fixed by fitting the projection 441 into the recess 427, as illustrated in FIG. 48A and FIG. 48B.

As described above, according to the light bulb shaped lamp according to the variation, the same effects as the light bulb shaped lamp according to the embodiments described above illustrated in FIG. 37 to FIG. 41 can be achieved.

Note that the shape of the projection 441 and the recess 427 is rectangular in this variation. However, it is not limited to this example. For example, the projection 441 and the recess 427 may have a shape of polygon such as triangle, ellipses, non-circular shape or non-square shape. Furthermore, the variations 1 to 6 may be applied to the variation 7.

Variation 8 of Embodiment 4

Figure 49A:
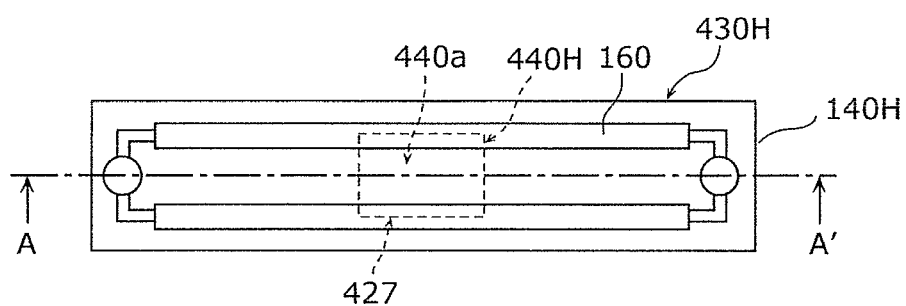
FIG. 49A is a front view of an LED module in a light bulb shaped lamp according to the variation 8 of the embodiment 4 of the present invention.

Next, the variation 8 of the embodiment 4 of the present invention shall be described with reference to FIG. 49A and FIG. 49B. FIG. 49A is a plan view of the LED module in the light bulb shaped lamp according to the variation 8 of the embodiment 4 of the present invention, and FIG. 49B is a cross-sectional view of the LED module along the line A-A' in FIG. 49A.

Figure 49B:
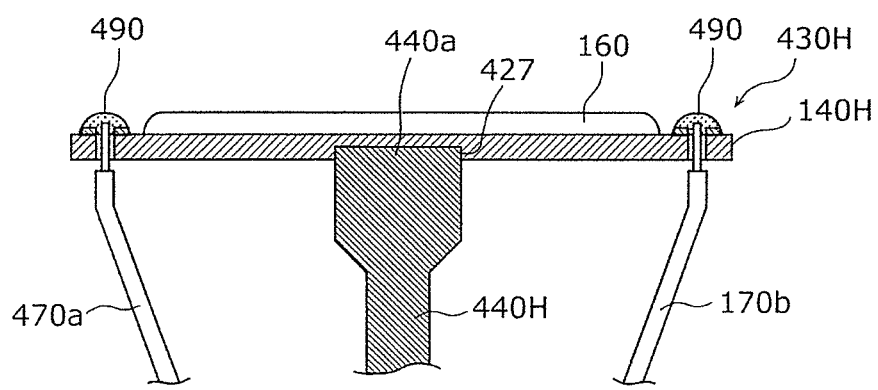
FIG. 49B is a cross-sectional view of an LED module in a light bulb shaped lamp according to the variation 8 of the embodiment 4 of the present invention in line A-A' in FIG. 49A.

As illustrated in FIG. 49A and FIG. 49B, in the light bulb shaped lamp according to the variation 8 of the embodiment 4, the base platform 140H does not have the first through hole in the LED module 430H, in the same manner as the variation 7. Instead, the recess 427 is provided on the back surface of the base platform 140H. The recess 427 functions as a second engaging part engaging with the top 440a of the stem 440H, in the same manner as the variation 7. Note that, the shape of the recess 427 is rectangle when the base platform 140H is viewed from the back surface.

The top 440a of the stem 440H is a rectangle in top view having an approximately same size as the recess 427. Note that, in the variation 8, the projection 441 is not provided in the stem 440H.

In this variation, the LED module 430H and the stem 440H are fixed by fitting the top 440a of the stem 440H into the recess 427, as illustrated in FIG. 49A and FIG. 49B.

As described above, according to the light bulb shaped lamp according to the variation, the same effects as the light bulb shaped lamp according to the embodiments described above illustrated in FIG. 37 to FIG. 41 can be achieved.

Furthermore, according to the variation 8, the LED module 430H is positioned using the top 440a of the stem 440H. Accordingly, it is not necessary to provide the projection 441 separately in the stem 440H.

Note that, in the variation 8, the shape of the top 440a and the recess 427 is not limited to a rectangle, in the same manner as the variation 7.

The light bulb shaped lamp according to an aspect of the present invention has been described based on the embodiment and the variations. However, the present invention is not limited to the embodiments and the variations.

Figure 50:
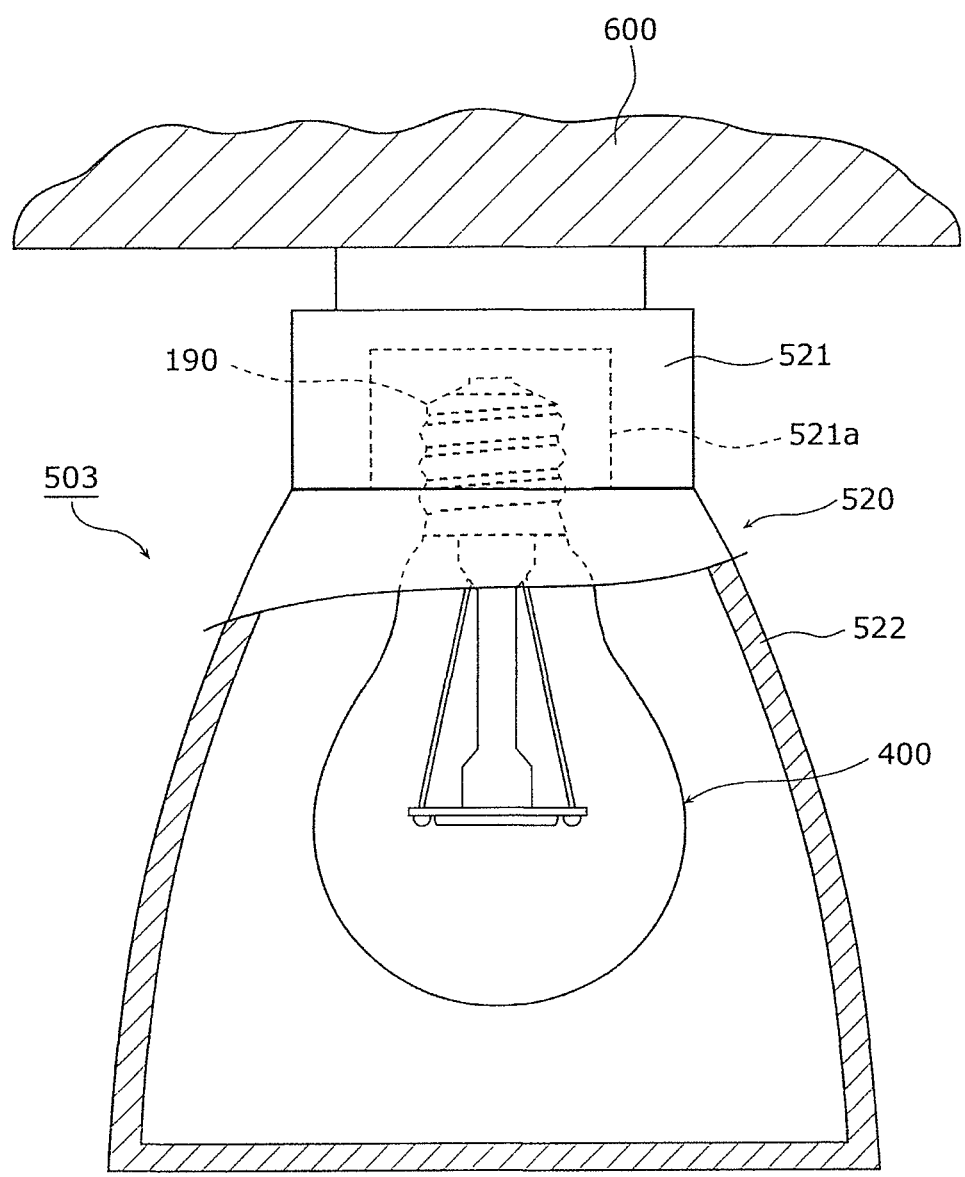
FIG. 50 is a schematic cross-sectional view of a lighting apparatus using the light bulb shaped lamp according to the embodiment 4 of the present invention.

For example, the present invention may be implemented as a lighting apparatus including the light bulb shaped lamp. The following shall describe the lighting apparatus according to an embodiment of the present invention with reference to FIG. 50. FIG. 50 is a schematic cross-sectional view of the lighting apparatus 503 according to the embodiment 4 of the present invention.

As illustrated in FIG. 50, the lighting apparatus 503 according to the embodiment of the present invention is attached to a ceiling 600 in a room when in use, and includes a light bulb shaped lamp 400 and a lighting equipment 520 according to the embodiment of the present invention.

The lighting equipment 520 is for turning the light bulb shaped lamp 400 on and off, and includes an equipment body 521 attached to the ceiling 600 and a lamp cover 522 covering the light bulb shaped lamp 400.

The equipment body 521 includes a socket 521a. A base 190 of the light bulb shaped lamp is screwed into the socket 521a. Power is supplied to the light bulb shaped lamp 400 through the socket 521a.

Note that, the lighting apparatus 503 illustrated in FIG. 50 is an example of the lighting apparatus, and the lighting apparatus according to the present invention may at least include a socket for holding the light bulb shaped lamp 400 and supplying the power to the light bulb shaped lamp 400. Furthermore, the lighting apparatus 503 illustrated in FIG. 50 includes one light bulb shaped lamp 400. However, the lighting apparatus 503 may include more than one light bulb shaped lamp 400.

Figure 51A:
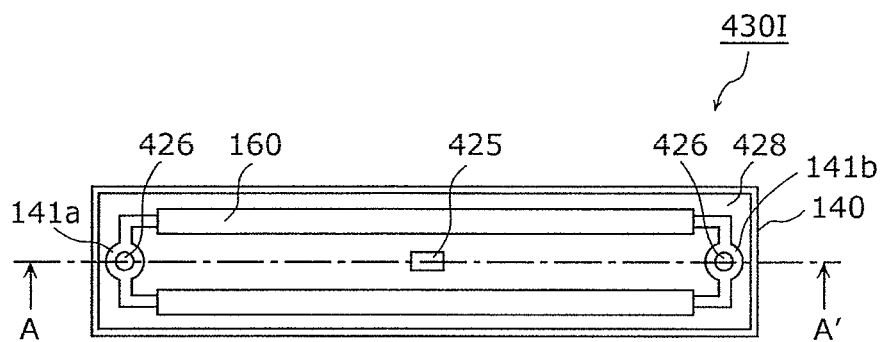
FIG. 51A is a front view of an LED module in a light bulb shaped lamp according to the variation 9 of the embodiment 4 of the present invention.

Furthermore, in the embodiment 4, an LED module in which a phosphor film 428 is formed on the upper surface of the base platform (a surface on which LEDs are mounted). The LED module 430I according to the variation 9 shall be described with reference to FIG. 51A and FIG. 51B. FIG. 51A is a plan view of the LED module in the light bulb shaped lamp according to the variation 9 of the embodiment 4 of the present invention, and FIG. 51B is a cross-sectional view of the LED module along the line A-A' in FIG. 51A.

Figure 51B:
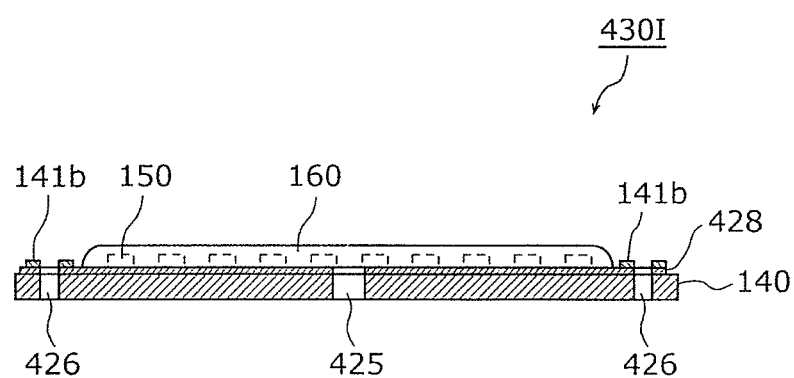
FIG. 51B is a cross-sectional view of an LED module in a light bulb shaped lamp according to the variation 9 of the embodiment 4 of the present invention in line A-A' in FIG. 51A.
Figure 52:
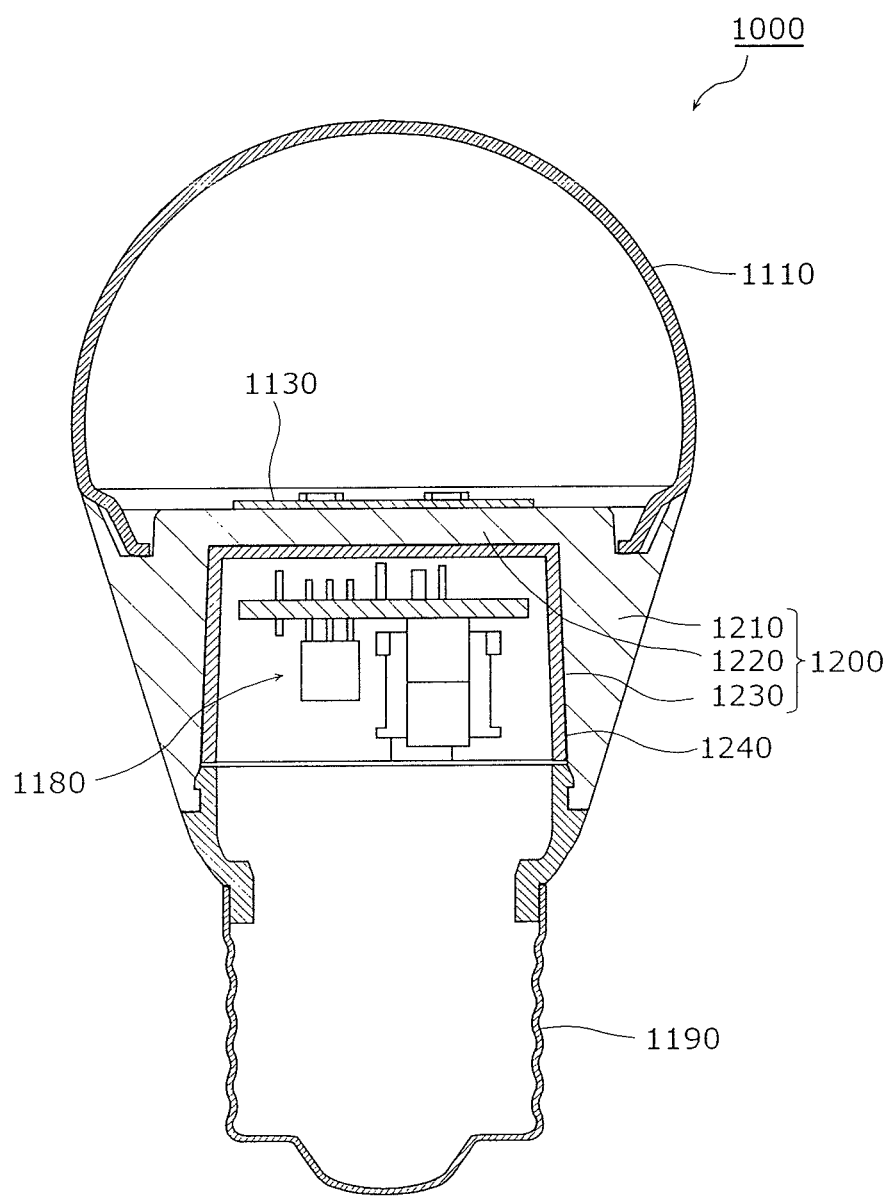
FIG. 52 is a cross-sectional view of a light bulb shaped LED lamp according to the conventional art.

As illustrated in FIG. 51A and FIG. 51B, the LED module 430I according to the variation includes a phosphor film 428 made of the sintered material film formed approximately on the entire surface of the base platform 140. The phosphor film 428 is a wavelength conversion thin film made of a sintered material including yellow phosphor particles and glass frit, and is formed in a rectangle shape in the same thickness.

According to the LED module 430I according to the variation, the light travelling inside the sealing material 160 among the light emitted by the LED chip 150, that is, the blue light travelling upward and toward the sides of the LED chip 150 is excited by yellow phosphor particles in the sealing material 160, and is converted into yellow light. Accordingly, white light is emitted upward from the base platform 140 composed of the yellow light and the blue light.

In contrast, among the light emitted by the LED chip 150, the blue light travelling toward the base platform 140, that is, the blue light travelling downward from the LED chip 150 is excited by the yellow phosphor particles in the phosphor film 428, and is converted into yellow light. Accordingly, the white light is emitted from below the base platform 140, transmitted through the base platform 140.

As described above, according to the LED module 430I of the variation, omnidirectional light distribution property can be achieved since white light is emitted omnidirectionally. Therefore, according to the light bulb shaped LED lamp according to the variation, it is possible to achieve the light distribution property very close to that of incandescent light bulb.

Note that, in the embodiment 4, the top of the stem and the base platform of the LED module are fixed by adhesive. However, it is not limited to this example. For example, a screw can be used for the fixing.

Furthermore, in the embodiment 4, the base platform is composed of a translucent board having a translucent property. However, it is not limited to this example.

Furthermore, in the embodiment 4, the LED chips 150 are mounted only on one surface of the base platform. However, the LED chips 150 may be mounted on multiple surfaces of the base platform.

The light bulb shaped lamp and the lighting apparatus according to the present invention have been described based on the embodiments 1 to 4 and the variations. However, the present invention is not limited to the embodiments and the variations.

For example, LED was used as an example of the semiconductor light-emitting device in the embodiments 1 to 4. However, a light-emitting device using semiconductor laser, organic electro luminescence (EL), and inorganic EL may be used.

Those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention is effective as the light bulb shaped lamp replacing the conventional incandescent light bulbs, particularly a light bulb shaped LED lamp and a lighting apparatus including the light bulb shaped LED lamp.

REFERENCE SIGNS LIST 100, 200, 300, 400 Light bulb shaped lamp
110 Globe
111 Opening
111a End of opening
120, 340, 340Y, 440, 440A, 440C, 440D, 440E, 440F, 440G, 440H Stem
120a Extended portion
120b, 353 Stepped part
121 Board component
122 Hole
123 Cutout
124, 142, 227, 390, 391 Adhesive material
130, 230, 330, 330X, 330Z, 430, 430A, 430B, 430C, 430D, 430E, 430F, 430G, 430H, 430I, 1130 LED module
140, 140X, 140Z, 140A, 140B, 140C, 140D, 140E, 140F, 140G, 140H Base platform
140a, 226a, 226b, 242a, 242b Through hole
141, 141a, 141b Power supply terminal
143, 228 Metal line pattern
144 Recess
145 Through hole
150 LED chip
151 Sapphire board
152 Nitride semiconductor layer
153 Cathode
154 Anode
155, 156 Wire bonding portion
157 Gold wire
158 Chip bonding material
160 Sealing material
170, 170a, 170b Lead wire
171 Internal lead wire
172 Dumet wire
173 External lead wire
180, 1180 Lighting circuit
181 Input terminal
182 Output terminal 183 Diode bridge
184 Capacitor
185 Resistor
190, 1190 Base
191 Screw
192 Eyelet
225 Fixing component
244 Electric wire
245 Conductive component
274 Rivet
325 Recess
341 First stem portion
341a, 341b Base platform connecting part
342 Second stem portion
343 Intermediate stem portion
344 Screw
345 Screw hole
350 Supporting component
351 First supporting part
352 Second supporting part
360 Resin case
361 First case part
362 Second case part
425, 425a, 425b, 425c First through hole
426 Second through hole
427 Recessed groove
428 Phosphor film
440a Top
441, 441a, 441b, 441c Projection
490 Conductive joining component
500, 501, 502, 503 Lighting apparatus
520 Lighting equipment
521 Equipment body
521a Socket
522 Lamp cover
600 Ceiling
1000 Light bulb shaped LED lamp
1110 Cover
1200 Outer case
1210 Peripheral portion
1220 Light-source attachment
1230 Recess
1240 Insulator

The invention claimed is:

1. A light bulb shaped lamp comprising:
a hollow globe;
a light-emitting module including a base platform and a light-emitting device mounted on the base platform, the light-emitting module being provided in the globe, the base platform being translucent and the base platform having a shape of a board,
the light-emitting device is mounted on at least one surface of the base platform, the surface of the base platform on which the light-emitting device is mounted faces a top of the globe and the light emitting device faces the top of the globe;
a lead wire for supplying power to the light-emitting module; and
a stem extending toward the interior of the globe, the lead wire extending within the stem, exiting the stem and being attached to the base platform, the other surface of the base platform is fixed to an end of the stem,
wherein a central portion of the light-emitting module being fixed to the stem.

2. The light bulb shaped lamp according to claim 1,
wherein the base platform is directly fixed to the stem.

3. The light bulb shaped lamp according to claim 2,
wherein the base platform is fixed to the stem by an adhesive material.

4. The light bulb shaped lamp according to claim 3,
wherein the adhesive material is transparent to visible light.

5. The light bulb shaped lamp according to claim 3,
wherein the adhesive material comprises silicone resin.

6. A light bulb shaped lamp comprising:
a hollow globe;
a light-emitting module including a base platform and a light-emitting device mounted on the base platform, the light-emitting module being provided in the globe, the base platform being translucent
a lead wire for supplying power to the light-emitting module; and
a stem extending toward the interior of the globe the lead wire extending within the stem, exiting the stem and being attached to the base platform,
wherein a central portion of the light-emitting module is fixed to the stem
the base platform has a shape of a prism,
the light-emitting device is mounted on at least one side of the base platform, the light emitting device faces a top of the globe, and
a side of the base platform is fixed to an uppermost end of the stem.

7. The light bulb shaped lamp according to claim 1,
wherein the stem is transparent to visible light.

8. The light bulb shaped lamp according to claim 1,
wherein the stem is joined with the globe so as to close an opening of the globe, and a part of the lead wire is sealed in the stem.

9. The light bulb shaped lamp according to claim 1,
wherein the lead wire has one end fixed to the base platform.

10. The light bulb shaped lamp according to claim 1,
wherein the stem comprises a material having a thermal conductivity higher than a thermal conductivity of the base platform.

11. The light bulb shaped lamp according to claim 10, further comprising
a supporting component which is connected to an opening end of an opening of the globe and supports the stem,
wherein the supporting component comprises a material having a thermal conductivity higher than a thermal conductivity of the base platform.

12. The light bulb shaped lamp according to claim 11,
wherein the supporting component comprises a material having a thermal conductivity higher than or equal to the thermal conductivity of the stem.

13. The light bulb shaped lamp according to claim 11,
wherein the stem and the supporting component comprise metal.

14. The light bulb shaped lamp according to claim 13,
wherein the stem and the supporting component comprise aluminum.

15. The light bulb shaped lamp according to claim 10,
wherein the base platform and the stem are fixed by a screw.

16. The light bulb shaped lamp according to claim 1,
wherein the globe comprises glass transparent to visible light.

17. The light bulb shaped lamp according to claim 1, further comprising:
a base which receives power that causes the light-emitting device to emit light; and an insulating case which insulates at least the stem and the base, and houses a lighting circuit that causes the light-emitting device to emit light.

18. A lighting apparatus comprising
the light bulb shaped lamp according to claim 1.

19. The light bulb shaped lamp according to claim 1, the light emitting device comprises a plurality of light emitting devices extending radially and symmetrically from the base platform and the light emitting module extending transverse to the stem.

20. The light bulb shaped lamp according to claim 1, the light emitting device mounted on only one surface of the base platform.

* * * * *